(12) United States Patent
Jensen et al.

(10) Patent No.: US 11,893,318 B1
(45) Date of Patent: Feb. 6, 2024

(54) SYSTEMS AND METHODS FOR TOPOLOGY AND SHAPE OPTIMIZATION FOR MODELING OF A PHYSICAL OBJECT

(71) Applicant: Comsol AB, Stockholm (SE)

(72) Inventors: Kristian Ejlebjærg Jensen, Nærum (DK); Nils Malm, Lindingö (SE); Grigori Grozman, Solna (SE); Gunnar Andersson, Solna (SE); Björn Bretz, Knivsta (SE); Lars Langemyr, Stockholm (SE); Erik Melin, Uppsala (SE); Eduardo Fontes, Vallentuna (SE)

(73) Assignee: Comsol AB, Stockholm (SE)

( * ) Notice: Subject to any disclaimer, the term of this patent is extended or adjusted under 35 U.S.C. 154(b) by 498 days.

(21) Appl. No.: 17/027,141

(22) Filed: Sep. 21, 2020

Related U.S. Application Data

(60) Provisional application No. 62/909,590, filed on Oct. 2, 2019, provisional application No. 62/902,905, filed on Sep. 19, 2019.

(51) Int. Cl.
*G06F 30/17* (2020.01)
*G06T 17/10* (2006.01)
(Continued)

(52) U.S. Cl.
CPC .............. *G06F 30/17* (2020.01); *G06F 30/12* (2020.01); *G06T 17/10* (2013.01); *G06T 17/205* (2013.01)

(58) Field of Classification Search
CPC ......... G06F 30/17; G06F 30/12; G06T 17/10; G06T 17/205
See application file for complete search history.

(56) References Cited

U.S. PATENT DOCUMENTS

| 7,519,518 | B2 | 4/2009 | Langemyr |
| 7,596,474 | B2 | 9/2009 | Langemyr |

(Continued)

FOREIGN PATENT DOCUMENTS

WO  WO-2021040705 A1 * 3/2021 ............. G06F 30/10

OTHER PUBLICATIONS

Pai Liu et al.; "Multi-material topology optimization considering interface behavior via XFEM and level set method"; Comput. Methods Appl. Mech. Engrg. 308 (2016) 113-133 (Year: 2016).*

(Continued)

*Primary Examiner* — Rehana Perveen
*Assistant Examiner* — Nupur Debnath
(74) *Attorney, Agent, or Firm* — Michael Best & Friedrich LLP

(57) ABSTRACT

Simulation methods and systems are described for topology and shape optimization of a geometrical representation of a physical object being modeled. An initial geometry of the physical object is represented. Equation data representing physical properties for portions of an initial geometry are defined. User inputs are received through a GUI for optimization settings and user selections of portions of the geometry being optimized. For topology optimization, various material properties and solver settings may be defined. For shape optimization, various solver settings and optimization objective may be defined. A discretized model is generated of the physical object. Solutions of the topology or shape optimization are generated and updated values are determined. Iterative operations are then performed for solving the topology or shape optimization objective expressions. The solutions are stored and graphical representations of the solutions may be generated.

20 Claims, 54 Drawing Sheets

(51) Int. Cl.
*G06T 17/20* (2006.01)
*G06F 30/12* (2020.01)

(56) References Cited

U.S. PATENT DOCUMENTS

| | | |
|---|---|---|
| 7,623,991 B1 | 11/2009 | Langemyr |
| 8,219,373 B2 | 7/2012 | Fontes |
| 8,626,475 B1 | 1/2014 | Fontes |
| 9,098,106 B2 | 8/2015 | Danielsson |
| 9,146,652 B1 | 9/2015 | Danielsson |
| 9,208,270 B2 | 12/2015 | Fontes |
| 9,323,503 B1 | 4/2016 | Fontes |
| 9,372,673 B2 | 6/2016 | Bertilsson |
| 10,019,544 B2 | 7/2018 | Bertilsson |
| 10,423,739 B2 * | 9/2019 | Nomura .................. G06F 17/16 |
| 10,650,177 B2 | 5/2020 | Bertilsson |
| 2012/0179426 A1 | 7/2012 | Fontes |
| 2017/0344667 A1 | 11/2017 | Zhou |
| 2021/0182456 A1 * | 6/2021 | Couret .................. G06T 17/205 |

OTHER PUBLICATIONS

Nicolò Pollini et al.; "Mixed projection- and density-based topology optimization with applications to structural assemblies"; https://arxiv.org/pdf/1906.06512.pdf (Year: 2019).*

Xiaodong Huang; "On smooth or 0/1 designs of the fixed-mesh element-based topology optimization"; Faculty of Science, Engineering and Technology, Swinburne University of Technology, Hawthorn, VIC (Year: 2006).*

Oded Amir et al.; "Simultaneous shape and topology optimization of pre-stressed concrete beams"; Article in Structural and Multidisciplinary Optimization • May 2018 (Year: 2017).*

Walter Frei; "Designing New Structures with Shape Optimization" COMSOL blog; https://www.comsol.com/blogs/designing-new-structures-with-shape-optimization/ (Year: 2015).*

Comsol AB "Introduction to Optimization Module," Version 5.3, Copyright 1998-2017, 50 pages.

Comsol AB, "Introduction to Optimization Module," Version 5.4, Copyright 1998-2018, 48 pages.

Comsol AB "Optimization Module Application Libraiy Manual," Version 5.3, Copyright 1998-2017, 114 pages.

Comsol AB "Optimization Module User's Guide," Version 5.3, Copyright 1998-2017, 102 pages.

Comsol AB, "Optimization Module User's Guide," Version 5.4, Copyright 1998-2018, 112 pages.

Bendsøe, M. P. & Sigmund, O., "Topology Optimization Theory, Methods, and Applications," Springer (2004). (381 pages).

Lazarov, B. S. & Sigmund, O., "Filters in topology optimization based on Helmholtz-type differential equations," International Journal for Numerical Methods in Engineering, vol. 86, pp. 765-781 (2011). (17 pages).

Wang, F. et al., "On projection methods, convergence and robust formulations in topology optimization," Structural and Multidisciplinary Optimization, vol. 43, pp. 767-784 (2011). (18 pages).

* cited by examiner

707

Settings
Parameters
Label: Parameters 2

▼ Parameters

| Name | Expression | Value | Description |
|---|---|---|---|
| meshsz | 5 [mm] | 0.005m | Mesh size |
| P0 | 2.5 [MPa] | 2.5E6 Pa | Peak load intensity |
| loadcases | 1 | 1 | Number of load cases |
| Ws0 | 0.1[J] | 0 | Characteristic elastic enr..... |
| Vfrac | 0.6 | 0 | Volume fraction |
| simpP | 1 | 1 | SIMP exponent |
| proj_beta | 1 | 1 | Projection slope |

701

708

Settings
Optimization
= Compute  ↻ Update Solution
Label: Optimization

▼ Optimization Solver

Method:
MMA

Optimality tolerance:
0.001

Study step:
Stationary

Maximum number of model ecaluations:
50

▼ Objective Function

702

| Expression | Description | Description |
|---|---|---|
| comp1.solid.Ws_tot/Ws0 | | Stationary |
| | | Stationary |

Type:
704 — Minimization

Multiple objectives:
Sum of objectives

Solution:
Auto

▼ Control Variables and Parameters

| Parameter non Initial value | Scale | Lower bound | Upper bound |
|---|---|---|---|
| | | | |

| Control variables from physics interface | Solve for |
|---|---|
703 — | Density Model 1 (dtopo1) | ☑ |

FIG. 7C

Settings

Filter

🖻 Plot

Label: Filter 1            2305

▼ Data

Dataset: One Load Case/Solution 1 (sol1)

▼ Expression

Expression:

dtopo1.theta

Unit:

☐ Description:

Output material volume factor

— Parameters —

| Name | Value | Units | Description |
|---|---|---|---|
| solid.refpntx | 0 | m | Reference point for moment comp...... |
| solid.refpnty | 0 | m | Reference point for moment comp...... |
| solid.refpntz | 0 | m | Reference point for moment comp...... |

▼ Filter

Bounds: Lower

2303 — Lower bound: 0.5

Geometry level: Take from dataset

☑ Propagate to lower dimensions

▼ Evaluation

Smoothing: Inside material domains

Smoothing threshold: none

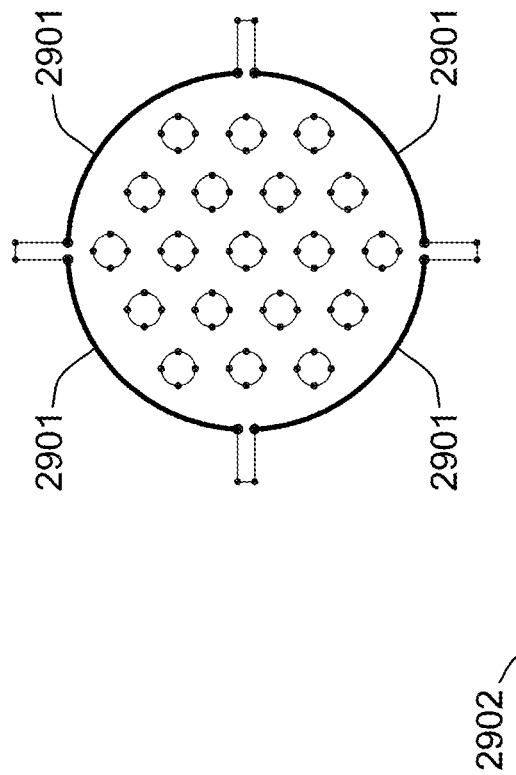

| Name | Expression | Unit | Description | Selection |
|---|---|---|---|---|
| poly1.dXg | 4*poly1.cn_bnd13_1X*s*(1-s)^3+6*poly1.cn_bnd13_2X*(s*(1-s))^2+4*poly1.cn_bnd13_3X*s^3*(1-s) | m | Boundary displacement, Xg component | Boundary 13 |
| poly1.dYg | 4*poly1.cn_bnd13_1Y*s*(1-s)^3+6*poly1.cn_bnd13_2Y*(s*(1-s))^2+4*poly1.cn_bnd13_3Y*s^3*(1-s) | m | Boundary displacement, Yg component | Boundary 13 |
| poly1.dZg | 0 | m | Boundary displacement, Zg component | Boundary 13 |
| poly1.dXg | 4*poly1.cn_bnd14_1X*s*(1-s)^3+6*poly1.cn_bnd14_2X*(s*(1-s))^2+4*poly1.cn_bnd14_3X*s^3*(1-s) | m | Boundary displacement, Xg component | Boundary 14 |
| poly1.dYg | 4*poly1.cn_bnd14_1Y*s*(1-s)^3+6*poly1.cn_bnd14_2Y*(s*(1-s))^2+4*poly1.cn_bnd14_3Y*s^3*(1-s) | m | Boundary displacement, Yg component | Boundary 14 |
| poly1.dZg | 0 | m | Boundary displacement, Zg component | Boundary 14 |
| poly1.dXg | 4*poly1.cn_bnd63_1X*s*(1-s)^3+6*poly1.cn_bnd63_2X*(s*(1-s))^2+4*poly1.cn_bnd63_3X*s^3*(1-s) | m | Boundary displacement, Xg component | Boundary 63 |
| poly1.dYg | 4*poly1.cn_bnd63_1Y*s*(1-s)^3+6*poly1.cn_bnd63_2Y*(s*(1-s))^2+4*poly1.cn_bnd63_3Y*s^3*(1-s) | m | Boundary displacement, Yg component | Boundary 63 |
| poly1.dZg | 0 | m | Boundary displacement, Zg component | Boundary 63 |
| poly1.dXg | 4*poly1.cn_bnd64_1X*s*(1-s)^3+6*poly1.cn_bnd64_2X*(s*(1-s))^2+4*poly1.cn_bnd64_3X*s^3*(1-s) | m | Boundary displacement, Xg component | Boundary 64 |
| poly1.dYg | 4*poly1.cn_bnd64_1Y*s*(1-s)^3+6*poly1.cn_bnd64_2Y*(s*(1-s))^2+4*poly1.cn_bnd64_3Y*s^3*(1-s) | m | Boundary displacement, Yg component | Boundary 64 |
| poly1.dZg | 0 | m | Boundary displacement, Zg component | Boundary 64 |

FIG. 29

SYSTEMS AND METHODS FOR TOPOLOGY AND SHAPE OPTIMIZATION FOR MODELING OF A PHYSICAL OBJECT

CROSS-REFERENCE TO RELATED APPLICATIONS

This application claims priority to and the benefits of U.S. Provisional Application No. 62/909,590, filed Oct. 2, 2019, and U.S. Provisional Application No. 62/902,905, filed Sep. 19, 2019, the disclosures of which are each hereby incorporated by reference herein in their entireties.

FIELD OF THE INVENTION

The present invention relates generally to systems and methods for modeling and simulation, and more particularly, to techniques for topology and shape optimization of a physical object being modeled.

BACKGROUND

Computer design systems are used to develop product designs and may include graphical user interfaces. Computer design systems can be complemented with packages analyzing a single aspect of a design, such as, structural analysis in conjunction with computer-aided design systems. It would be desirable to have improved design systems that can operate in more complex environments.

SUMMARY OF THE INVENTION

According to one aspect of the present disclosure, a computer-implemented simulation method is executable on one or more processors configured to generate a model of a physical system. The simulation method provides topology optimization of a geometrical representation of a physical object being modeled. The simulation method comprises the acts of receiving initial geometry data representing an initial geometry of the physical object being modeled. Equation data representing physical properties for one or more portions of the initial geometry is defined. User inputs are received via one or more graphical user interfaces configured for display on one or more display devices. The user inputs represent one or more topology optimization settings and user selections of one or more portions of the initial geometry being topology optimized. Modified material property data are defined for modified material properties on one or more portions of the initial geometry. The modified material properties are based on material volume factors associated with received topology optimization settings for modifying one or more material properties identified for the physical object being modeled. Topology optimization solver settings and a topology optimization objective expression are defined for a topology optimization solver. The topology optimization objective expression is at least partially determined by one or more of the modified material properties. Discretized model data is generated, via the one or more processors, representing a discretized model of the physical object being modeled based on the initial geometry. The discretized model includes a mesh based on the initial geometry. At least some mesh elements are associated with one or more material volume factor values. A solution of the topology optimization objective expression is generated via the one or more processors. The solution is at least partially determined by the material volume factor values. Updated material volume factor values are generated, via the one or more processors, based on the defined topology optimization solver settings. An iterative operation is performed, via the one or more processors, including solving the topology optimization objective expression based at least partially on the updated material volume factor values. The iterative operation continues until a defined maximum number of iterations have been performed or at least one topology optimization solver determines that an optimized topology solution has been achieved. Optimized topology solution data representing the optimized topology solution is stored on a computer memory device. The optimized topology solution includes material volume factor values defined on mesh elements. A graphical representation of at least a portion of the optimized topology solution data is generated via the one or more processors. The graphical representation is configured for display on the one or more graphical user interfaces.

According to another aspect of the present disclosure, a computer-implemented simulation method is executable on one or more processors configured to generate a model of a physical system. The simulation method optimizes a shape of a geometrical representation of a physical object being modeled. The simulation method comprises the acts of receiving initial geometry data representing an initial geometry of the physical object being modeled. Equation data is defined representing physical properties for one or more portions of the initial geometry. User inputs are received via one or more graphical user interfaces configured for display on one or more display devices. The user inputs represent one or more shape optimization settings including control variable settings and user selections of one or more portions of the initial geometry being shape optimized. Discretized model data is generated, via the one or more processors, representing a discretized model of the physical object being modeled based on the initial geometry. The discretized model includes a mesh based on (i) the initial geometry and mesh element node coordinates for portions of the initial geometry to be shape optimized based on control variables, and (ii) a shape optimization objective expression. Shape optimization solver settings and a shape optimization objective expression are defined for a shape optimization solver. The shape optimization objective expression is at least partially determined by one or more control variables. Updated control variable values are generated, via the one or more processors, based on the defined shape optimization solver settings. An iterative operation is performed, via the one or more processors, including solving the shape optimization objective expression based at least partially on the updated control variable values. The iterative operation continues until a defined maximum number of iterations have been performed or until at least one shape optimization solver determines that an optimized shape solution has been achieved. Optimized shape solution data representing the optimized shape solution is stored on a computer memory device. The optimized shape solution includes a shape optimized mesh corresponding to the optimized shape solution or a shape solution based on more than one iteration of solving the shape optimization objective expression.

According to yet another aspect of the present disclosure, a computer-implemented simulation method is applied to a mesh dataset including material volume factor value data from a topology optimization and mesh data to generate a filtered mesh dataset. The filtered mesh dataset is based on the values of the material volume factors such that only mesh elements meeting one or more criteria with respect to material volume factor values are retained in the filtered mesh dataset. The method comprises the acts of selecting an initial mesh dataset, defining a material volume factor expression, and defining bounds for mesh elements or mesh nodes to be included in the filtered mesh. The bounds are based on material volume factor values associated with the mesh elements or mesh nodes that are applied in the defined material volume factor expression. The filtered mesh dataset is generating to include the mesh elements or mesh nodes meeting the defined bounds for the material volume factor expression. Optionally, a geometrical representation of the filtered mesh dataset is displayed in a graphical user interface associated with one or more display devices.

According to further aspects of the present disclosure, one or more non-transitory computer readable media are encoded with instructions, which when executed by one or more processors associated with a design system, a simulation system, or a modeling system, causes at least one or the one or more processors to perform the above simulation methods.

The above summary is not intended to represent each embodiment or every implementation of the present technology. Rather, the foregoing summary merely provides an example of some of the novel aspects and features set forth herein. The above features and advantages, and other features and advantages of the present technology, will be readily apparent from the following detailed description of representative implementations and modes for carrying out the present invention, when taken in connection with the accompanying drawings and the appended claims.

BRIEF DESCRIPTION OF THE DRAWINGS

Features and advantages of the present technology will become more apparent from the following detailed description of exemplary embodiments thereof taken in conjunction with the accompanying drawings in which:

FIGS. 7A-7C depict exemplary model icons and associated settings windows for parameter settings and associated settings window for the topology and shape optimization solver settings, according to some implementations of the present technology.

FIGS. 23A-23C depict GUI elements and a settings window for creating a filtered mesh dataset, according to some implementations of the present technology.

FIG. 29 depicts an exemplary system of Bernstein polynomial expressions created automatically by a shape optimization feature, based on user inputs, according to some implementations of the present technology.

Figure 1A:
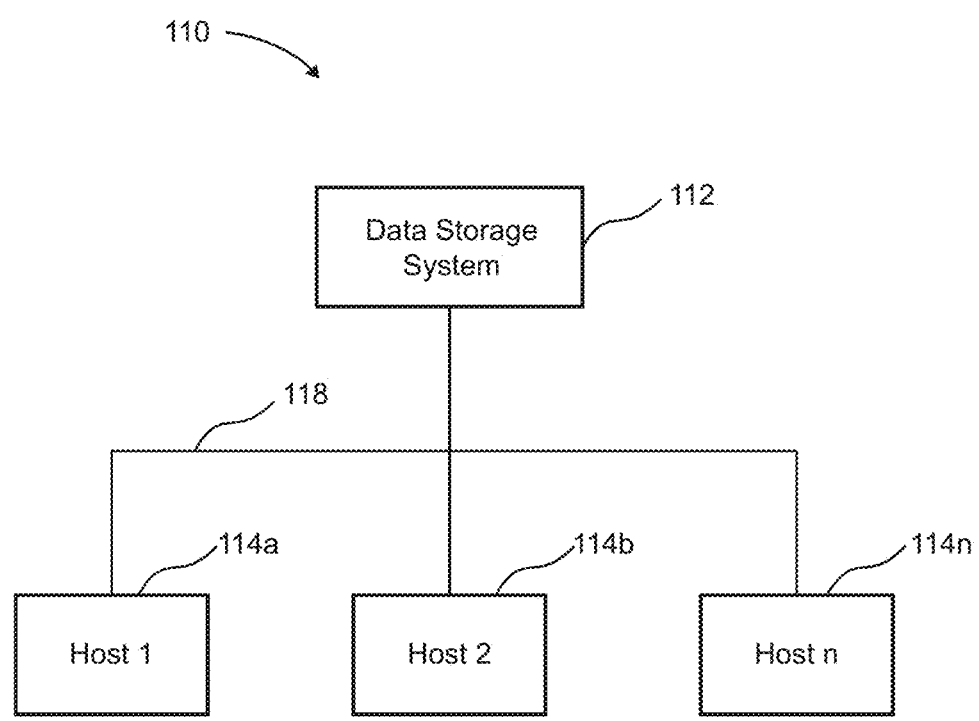
FIGS. 1A-1C depict exemplary aspects of physics simulation computing systems for topology and shape optimization of a model of a physical system, according to some implementations of the present technology.

While the present technology is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

The various implementations are described with reference to the accompanying figures, where like reference numerals may be used throughout the figures to designate similar or equivalent elements. The figures are not drawn to scale, and they are provided merely to illustrate the instant invention. It should be understood that numerous specific details, relationships, and methods are set forth to provide a full understanding. One having ordinary skill in the relevant art, however, will readily recognize that the various implementations can be practiced without one or more of the specific details, or with other methods. In other instances, well-known structures or operations are not shown in detail to avoid obscuring certain aspects of the various implementations. The various implementations are not limited by the illustrated ordering of acts or events, as some acts may occur in different orders and/or concurrently with other acts or events. Furthermore, not all illustrated acts or events are required to implement a methodology in accordance with the present invention.

While this invention is susceptible of embodiment in many different forms, there is shown in the drawings and will herein be described in detail preferred aspects of the invention with the understanding that the present disclosure is to be considered as an exemplification of the principles of the invention and is not intended to limit the broad aspect of the invention to the aspects illustrated. For purposes of the present detailed description, the singular includes the plural and vice versa (unless specifically disclaimed); the words "and" and "or" shall be both conjunctive and disjunctive; the word "all" means "any and all"; the word "any" means "any and all"; and the word "including" means "including without limitation." Moreover, words of approximation, such as "about," "almost," "substantially," "approximately," and the like, can be used herein to mean "at,", "near," or "nearly at," or "within 3-5% of," or "within acceptable tolerances," or any logical combination thereof, for example.

The present technology expands the flexibility and range of capabilities in modeling systems, such as simulation computing systems, by providing topology and/or shape optimization of a physical object being modeled. Non-limiting exemplary implementations of methods and system are described, including graphical user interfaces (GUIs), for performing topology and shape optimization in a physics and multiphysics simulation computing system. The systems and methods allow the creation of data structures describing topology and/or shape optimized objects and the creation of graphical representations thereof. The data structures and graphical representations may include aspects that reduce computer memory storage requirements and reduce the workload on a simulation computing system user when the data structures and/or graphical representations are used for further modeling purposes, for instance verification modeling. The simulation computing system interface allows aspects of the model creation to be more efficiently implemented where in some implementation, user input can be minimized even for more complex models with a large number of control variables.

In some implementations for computer aided engineering, and in physics and multiphysics modeling and simulation, a desirable modeling goal is to find a shape and/or topology of a physical object being modeled. In particular, the shape and/or topology of parts of the geometrical representation of a physical object being modeled are changed and optimized with respect to certain physical properties. For example, it may be desirable to identify, and eliminate or minimize, high stress parts of a physical object being modeled, such as through an improve or reduce flow through a valve or by reducing the weight of a physical n object while retaining strength. The described systems and methods of the present technology provide for such applications.

It can be particularly desirable to perform modeling to address shape and/or topology optimization, as described by the improvements of the present disclosure, where a system user can create almost any type of model of a physical object. The modeling of the physical object can be implemented to depend on one or more of a large number of physical properties. Optimization can then be performed with respect to shape and/or topology based on a large number of different dependent variables customized for the physical object to be modeled. The present technology contemplates user-friendly GUIs to allow for the streamlining of settings and consistency in the simulation computing system regardless of the physical phenomena being modeled. Furthermore, the present technology allows for shape and/or topology optimization features of a model to be readily added to pre-existing models.

It is contemplated that the described GUIs and methods are especially suitable to be used in a physics or multiphysics modeling and simulation system that includes a multitude of physics and multiphysics simulation interfaces. With the described GUIs and methods, a user may at any point in modeling on the simulation computing system add shape and/or topology optimization of a geometrical representation of a model as an added feature of any model including a geometrical representation. The present technology streamlines modeling workflow for a user and increases the speed of modeling, along with reducing system memory and computing requirements.

In some implementations, a shape and/or topology optimized geometry that results from the solution of the application of the methods and GUIs of the present technology can readily be used for further modeling, such that selections of geometric entities in a geometrical representation of the physical object being modeled are retained. For example, it may be desirable that a model of a load bearing part including fixed positioned and fixed size bolt holes may retain a named selection such as "bolt holes" in a shape optimized geometry such that continued modeling using the shape and/or topology optimized geometrical representation can be performed without the user having to manually re-identify the bolt holes in the optimized geometrical representation, both for geometrical representations in a non-discretized form and for geometrical representations in a discretized form. Another beneficial aspect of the present technology is that there is no need to save or export the shape and or topology optimized geometrical representation to a file. The optimized geometrical representation may be available for continued modeling within the interface the user is currently using.

Simulation computing systems, such as the system described in the present disclosure, execute one or more computer-implemented methods, including engineering analysis systems and methods, stored on computer readable media (e.g., temporary or fixed memory, magnetic storage, optical storage, electronic storage, flash memory, other storage media). A computer-implemented method may include instructions which, when executed by a processor, perform one or more tasks. A simulation computing system executes machine instructions, as may be generated, for example, in connection with translation of source code to machine executable code, to perform modeling and simulation, and/or problem solving tasks. One technique, which may be used to model and simulate physical phenomena or physical processes, is to represent various physical properties and quantities, of the physical phenomena or physical processes being modeled and simulated, in terms of variables and equations or in other quantifiable forms that may be processed by a simulation computing system. In turn, these equations or other quantifiable forms may be solved by a simulation computing system configured to solve for one or more variables associated with the equation, or the simulation computing system may be configured to solve a problem using other received input parameters.

It is contemplated that computer-implemented methods for modeling and simulating physical phenomena or physical processes may provide many advantages particularly as the complexity of the physical phenomena or physical processes being modeled and simulated increases. For example, in certain implementations, a user can combine one or more physical phenomena into a multiphysics model, as part of, for example, an engineering analysis. As another example, in certain implementations, a user can apply the topology optimization techniques or the shape optimization techniques described by the present disclosure as part of a design and engineering analysis process for a physical object being modeled.

Exemplary aspects of physics simulation computing systems are now described where modeling or simulation operations can be improved to include topology and shape optimization of a model of a physical object. The contemplated computing systems may be operable for executing one or more computer-implemented methods, including engineering analysis systems and methods, stored on computer readable media (e.g., temporary or fixed memory, magnetic storage, optical storage, electronic storage, flash memory, other storage media).

It is contemplated that modeling or simulation computing systems can include networked computers, processors, or processing units. In certain embodiments, modeling or simulation system processing units may be operating directly on a physics simulation system user's computer (e.g., a host or client), and in some implementations, a physics simulation system processing unit may be operating remotely (e.g., a remote server system). For example, a user may provide various input parameters at one modeling or simulation computer or terminal located at a certain location. Those parameters may be processed locally on the computer or the parameters may be transferred over a local area network or a wide area network, to another simulation processing unit, located elsewhere on the network that is configured to process the input parameters. The second processing unit may be associated with a server connected to the Internet (or other network) or the second processing unit can be several processing units connected to the Internet (or other network), each handling select function(s) for developing and solving a problem on the simulation system. It is further contemplated that the results of the processing by the one or more processing units can then be assembled at yet another server or processing unit. It is also contemplated that the results may be assembled back at the terminal or computer where the user is situated. The simulation terminal or computer where the user is situated can then display the solution of the modeling or simulation system to the user via a display (e.g., a transient display) or in hard copy form (e.g., via a printer). Alternatively, or in addition, the solution may be stored in a memory associated with the terminal or computer, or the solution may be stored on another server that the user may access to obtain the solution from the modeling and/or simulation system.

Additional non-limiting aspects of physics simulation computing systems contemplated for modeling physical systems are described below in the context of exemplary FIGS. 1A-1C and FIG. 2.

FIG. 1A illustrates configurations for a simulation computing system 110 that includes a data storage system 112 connected to host systems 114*a*-114*n* through communication medium 118. In some aspects, data storage systems may also be hosted locally on any one of the host systems 114*a*-114*n*. In system 110, the "n" hosts 114*a*-114*n* may access the data storage system 112, for example, in performing input/output (I/O) operations. The communication medium 118 for communicatively connecting the various system components may be any one of a variety of networks or other type of communication connections as known in the field of computer simulation and modeling of physical systems. For example, the communication medium 118 may be the Internet, an intranet, or other network connection by which the host systems 114*a*-114*n* may access and communicate with the data storage system 112, and may also communicate with others included in the system 110, including without limitation systems based on various forms of network communications (e.g., fiber optic, wireless, Ethernet).

Each of the host systems 114*a*-114*n* and the data storage system 112 included in the simulation computing system 110 may be connected to the communication medium 118 by any one of a variety of connections as may be provided and supported in accordance with the type of communication medium 118. Processing units may be included in the host computer systems 114*a*-114*n* or a data manager system may be any one of a variety of commercially available single or multi-processor system, such as an Intel-based processor, server, or other type of commercially available processor able to support incoming traffic in accordance with each particular embodiment and application.

It should be noted that the particulars of the hardware and systems included in each of the host systems 114*a*-114*n*, as well as those components that may be included in the data storage system 112 are described herein in more detail, and may vary with each particular embodiment. For example, each of the host computers 114*a*-114*n*, as well as the data storage system 112, may all be located at the same physical site, or, alternatively, may also be located in different physical locations. Examples of the communication medium that may be used to provide the different types of connections between the host computer systems, the data manager system, and the data storage system of the modeling and/or simulation computing system 110 may use a variety of different communication protocols such as SCSI, ESCON, Fiber Channel, SAS, SSD, or functional equivalents that are known to those skilled in the field of computer simulation and modeling of physical systems. Some or all of the connections by which the hosts and data storage system 112 may be connected to the communication medium 118 may pass through other communication devices, such as a Connectrix (e.g., enterprise to edge-related storage area network switches and associated algorithms) or other switching equipment that may exist, both physical and virtual, such as a phone line, a repeater, a multiplexer, a satellite, or systems that perform similar or equivalent communications operations.

Each of the host computer systems may perform different types of data operations, such as storing and retrieving data files used in connection with an application executing on one or more of the host systems. For example, a computer-implemented method may be executing on the host computer 114*a* and store and retrieve data from the data storage system 112. The data storage system 112 may include any number of a variety of different data storage devices, such as disks, tapes, solid-state memory, and the like in accordance with each implementation. As will be described in following paragraphs, methods may reside and be executing on any one of the host computer systems 114*a*-114*n*. Data may be stored locally on the host system executing the methods, as well as remotely in the data storage system 112 or on another host computer system. Similarly, depending on the configuration of each modeling and/or simulation computing system 110, methods as described herein may be stored and executed on one of the host computer systems and accessed remotely by a user on another computer system using local data. A variety of different system configurations and variations are possible then as will be described in connection with the embodiment of the system 110 of FIG. 1A and should not be construed as a limitation of the techniques described elsewhere herein.

Figure 1B:
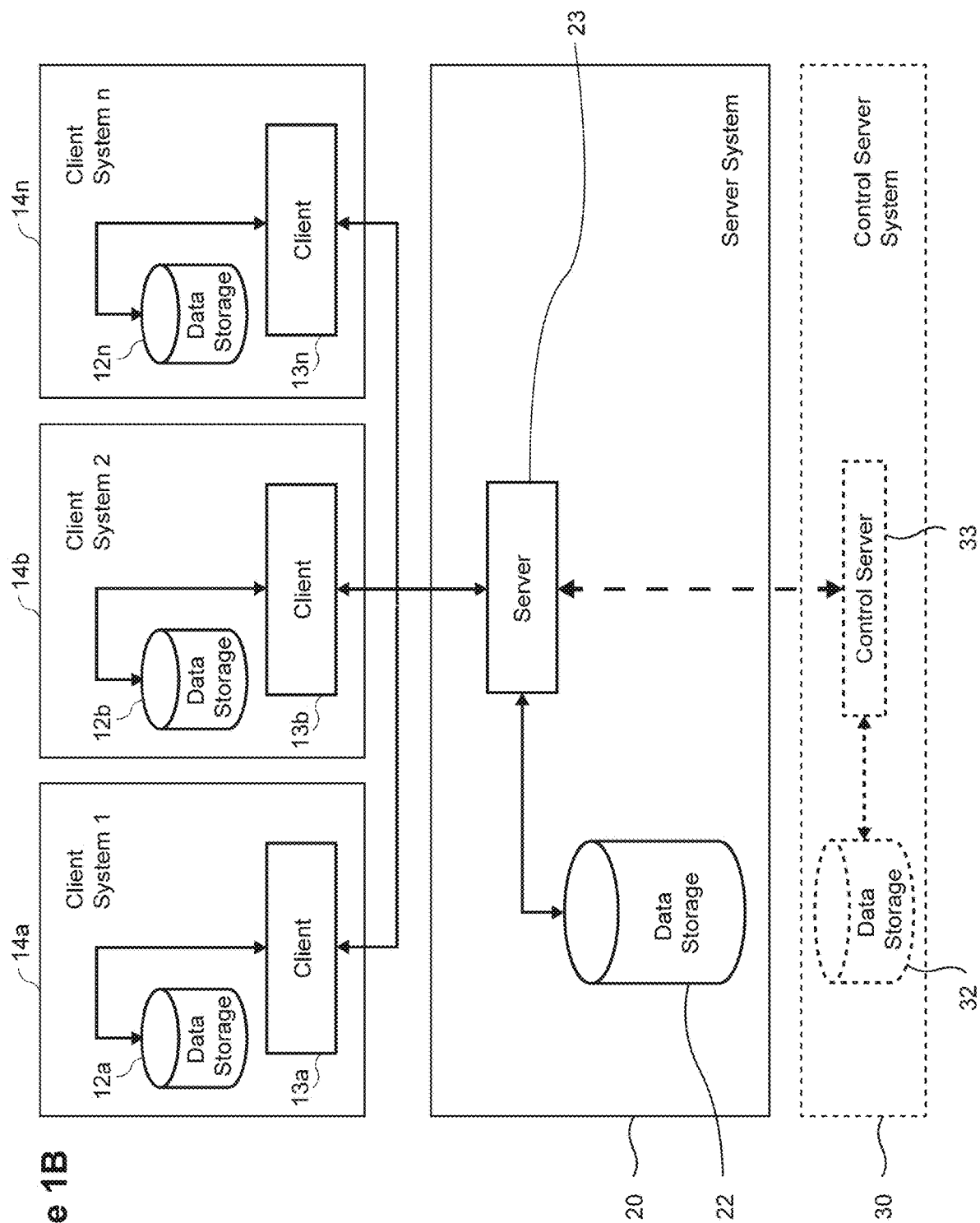

Turning now to FIG. 1B, additional illustrative non-limiting exemplary aspects of physics simulation computing systems are described for modeling physical systems. Systems can include one or more client processing systems 14*a*, 14*b* . . . 14*n*. In some aspects, the client processing systems 14*a*-*n* include components corresponding to a simulation system for modeling physical systems, such as components (when executed on a processor present in client computer(s) 13*a*, 13*b* . . . 13*n*) to display a graphical user interface, receive user input, and display outputs of the simulation system that are results of the user input. The client processing system(s) 14*a*-*n* can further include software components that generate input commands, send user input data, and send generated input commands to a simulation server system 20 communicatively connected to the client processing system(s). The server system 20 includes a server processing unit 23. The client processing system(s) 14*a*-*n* can also receive output data and output commands from the server system where the output data and output commands correspond to the user input previously sent to the server system 20. The client processing system(s) 14*a*-*n* and the server system 20 can each include their own data storage components 12*a*, 12*b* . . . 12*n*, 22. It is further contemplated that client processing system(s) can further include components, that upon execution, implement output commands and display output data in a graphical user interface.

It is contemplated that a server system 20 can include components, that upon execution, receive input data and input commands from communicatively connected client processing system(s) 14*a*, 14*b* . . . 14*n*. In some aspects, the server system 20 can further include executable components for sending input data to and receiving data from a control server system 30 that includes a control server processor 33 and may also have data storage components 32. The control server computer can be used to control access to certain operations of a simulation system for modeling physical systems. The server system 20 can also include executable components for generating output data and output commands based on the received input data, input commands, and/or control data; and send these output data and output commands to any one of the client processing system(s) 14*a*-*n*. In some aspects, the server system 20 may further include executable components to verify if an input command may be executed, as determined by the received control data.

Simulation processing units, display devices, and/or memory devices are contemplated to be a part of the client processing systems 14*a*-*n*, server system(s) 20, and/or control server system(s) 30.

Figure 1C:
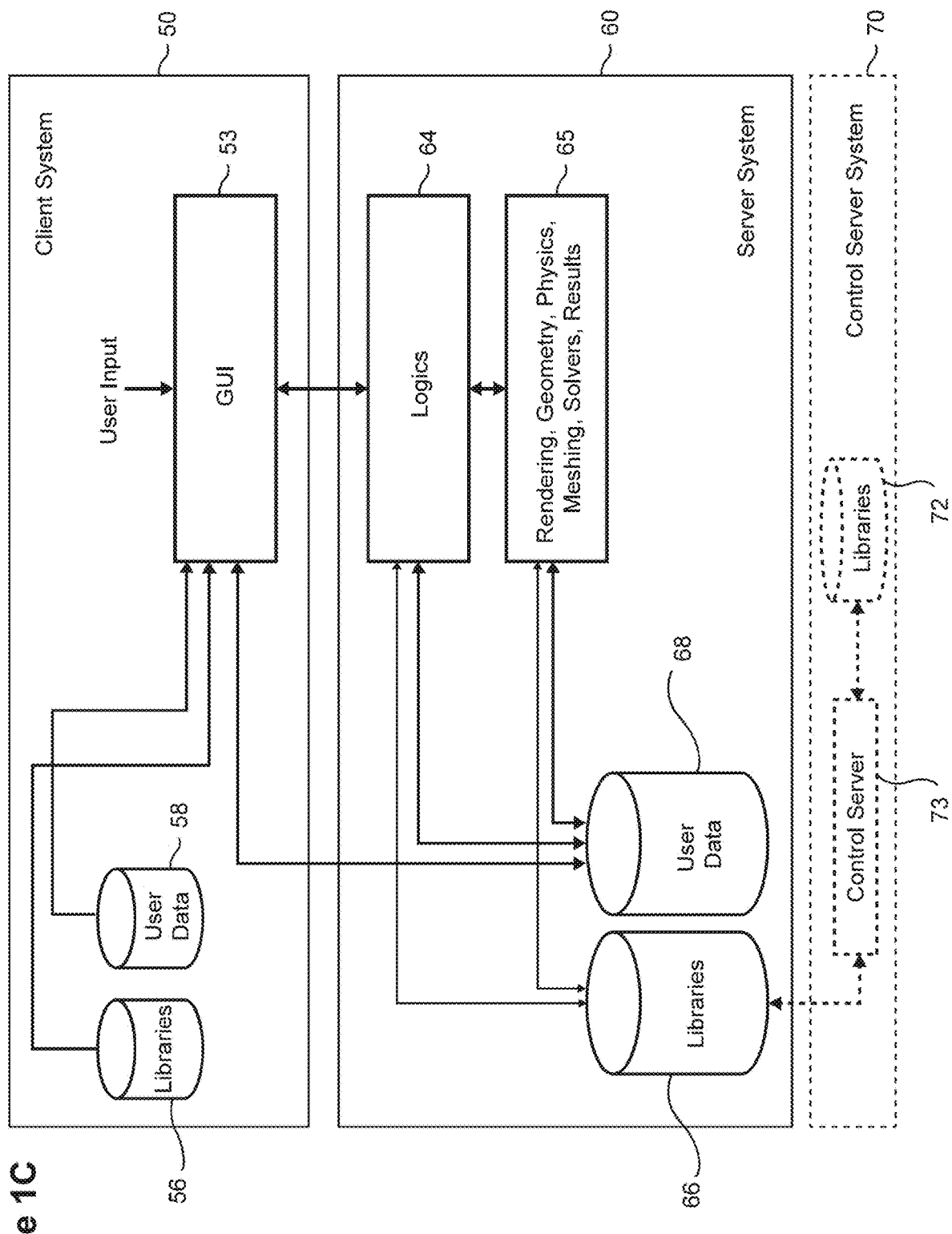

Turning now to FIG. 1C, further non-limiting exemplary aspects of physics simulation computing systems are described. The system can include a client processing system 50 that includes executable components for a graphical user interface 53, where user input may be received and output may be displayed. The client processing system can store user data generated through user input and output received from a server system 60. The client processing system may also locally store executable software component libraries which are used to display graphical user interface(s), receive input, generate input commands, execute output commands, and display output. User data can be stored on client user data storage component 158 or on a server system user data storage component 68. Similarly, library data can be stored locally on a client library storage component 56.

In one illustrative aspect, user input may be received via the GUI 53 of the client processing system 50 based on a user selecting an option via the GUI 53 to create an exemplary geometry, such as a cylinder geometry. The input and input commands may be sent to the communicatively connected server system 60. Output data and output commands received from the server system can then be executed on the client processing system 50 to render and display the exemplary cylinder geometry and to refresh the graphical user interface 53, based on the exemplary user input for a cylinder. Thus, the server system 60 can receive user input data and input commands from a client processing system 50 and use the received data and commands to generate output data and output commands that can be received by the client processing system 50. These output data and output commands determine what will be shown in the graphical user interface 53 in the client processing system 50 and are based on the user input.

The server system can include executable components that determine logics associated with a simulation system for modeling physical systems. For example, upon execution of logics component 64, which is similar to an application program interface component, the logics component 64 can receive input data and input commands from the client processing system 50 and determine how to process received input. The logics component 64 can determine which simulation software components for modeling physical systems should be used to process input data and execute input commands, and which components should be used to generate output data and output commands, based on the user input. The input data and input commands may be relayed by the logics component(s) 64, upon execution, to one or more of rendering, geometry, physics, meshing, assembling, solver, and results components, collectively referred to in FIG. 1C as component 65. The output data and the output commands from component 65 can then be relayed to the client processing system 50 by the logics components 64.

The server system 60 may store and access logics component libraries 66. The server system 60 may also store user data 68 used by the logics components 64. As discuss above, the server system 60 may also include aspects for rendering the graphical user interface in component 65, that builds the geometry, defines the physics, generates the mesh, assembles the numerical model, solves the numerical model, and generates the output data and output commands. Continuing on the illustrative example of the cylinder, a logics component 64 can receive user input in the form of input data and input commands for generating a cylinder and send these data and commands to a geometry component that is part of component 65. The geometry component executes the cylinder command and sends an output to the rendering component that is also a part of component 65. The logics component 64 may then receive the output from the rendering component and send rendering data, for the cylinder geometry together with its settings, to the client processing system 50 for display in the graphical user interface 53.

The server system 60 may also store and access library components 66 for rendering, building the geometry, generating the mesh, assembling the numerical model, solving the numerical model equations, and generating the results.

In some aspects, the graphical user interface 53 and the logics components 64 may send data and commands that may trigger a control check in the rendering, geometry, physics, meshing, assembling, solvers, and results components of component 65, which then may generate a request that is sent to a control server 70. The server system 60 may then receive data from control server system 70 that is used to determine if it should allow the execution of commands. The data sent to the server system 60 from the control server system 70 is generated by the control server 73 using a file that may be stored, for example in the libraries component 72, of the control server system 70.

Simulation processing units, display devices, and/or memory devices are contemplated to be a part of the client processing system 50, server system 60, and/or control server system 70.

Figure 2:
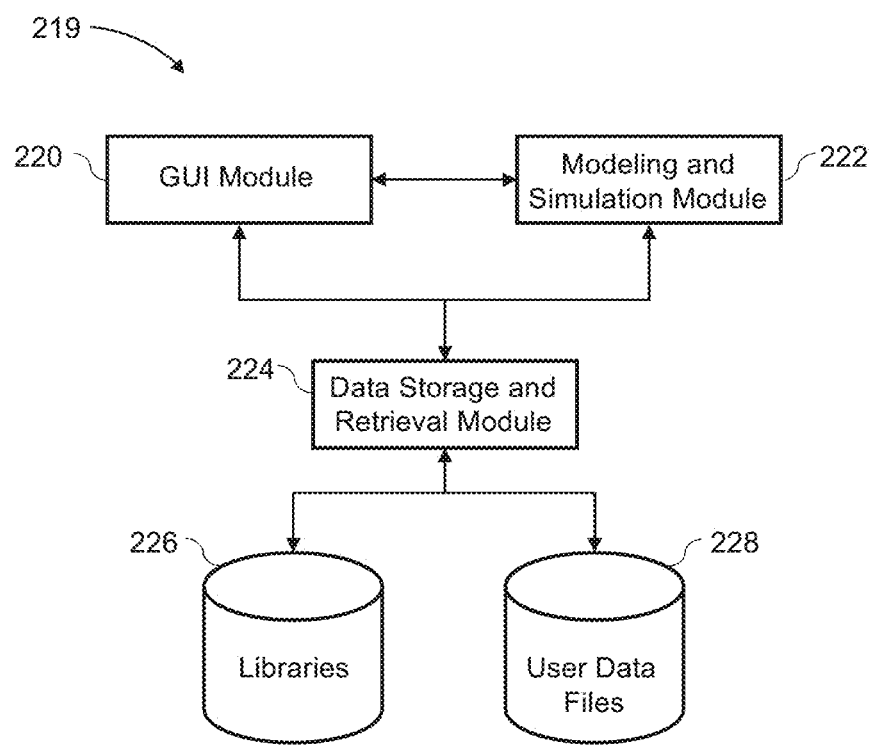
FIG. 2 illustrates an exemplary standalone physics simulation computing system, or one that may reside and be executed in one of the hosts of FIG. 1A, according to some implementations of the present technology.

Referring now to FIG. 2, an exemplary aspect of a simulation computing system 219 for modeling physical systems is illustrated that may reside, for example, on a single computer or in one of a plurality of host computer systems (such as host computers 114a-114n illustrated in FIG. 1A). The simulation computing system may be divided into several components. One exemplary aspect of the system may include a GUI module 220, a Modeling and Simulation module 222, and a Data Storage and Retrieval module 224. The GUI module 220 can provide for interactions with system users. The Modeling and Simulation module 222 can provide for managing and performing physics (including multiphysics) simulations. The Data Storage and Retrieval module 224 can provide for loading and saving the model in a file, and to load and store other types of files which may be used during the simulation or may be used as input or output to the simulation.

The GUI module 220 may communicate with the Modeling and Simulation module 222 by sending and receiving commands. As may also occur on the other modeling and/or simulation computing systems described herein, the act of sending and receiving commands may be performed through an application programming interface ("API") or other similar components. In one aspect of the system, the API may be object oriented, and mix data and function calls within the same structure. In another aspect of the system, the API may use a data structure that is separate from function calls.

It is contemplated that the GUI module 220 can include a plurality of modeling or simulation systems or subsystems. For example, the determination of finite elements using common geometry shape function spaces may operate in the GUI module and/or in other modules (interfacing or otherwise) such as the Modeling and Simulation Module 222 and/or the Data Storage and Retrieval Module 224.

It is contemplated that in certain aspects of the present technology, components of a simulation system may reside on different host computing systems. For example, the GUI module 220 may reside on a personal computer host and the Modeling and Simulation module 222 may reside on a server computer host. It is further contemplated that the Data Storage and Retrieval module 224 may reside on either the personal computer host or the server computer host, or yet another separate computer host. If the computer hosts are not identical, the API can be configured to use a computer network to communicate between hosts. In one embodiment, an object-oriented API may be configured to send data and method calls over the computer network or in another embodiment send data and function calls between the components over a computer network. The API may also be able to handle a Data Storage and Retrieval module 224 which may be located either on the host of the GUI module 220 or the Modeling and Simulation module 222, or on a separate host. In each of those cases, the Data Storage and Retrieval module 224 may be configured to load and store files on each of those hosts.

It is contemplated that in certain aspects, the system 219 may include, or be configured with, operating systems such as Windows 10, Mac OS®, iOS, Android®, Chrome® OS, and the like, or system components other than what is described and represented in the modeling and/or simulation computing system 219 illustrated in FIG. 2. In the exemplary aspect illustrated in FIG. 2, Libraries 226 and the User Data Files 228 can be stored locally within the host computing system. It is further contemplated that in certain aspects, the Libraries 226 and/or User Data Files 228, as well as copies of these, may be stored in another host computer system and/or in the Data Storage System 112 of the computing system 110 in FIG. 1A. However, for simplicity and explanation in paragraphs that follow, it may be assumed in a non-limiting manner that the system 219 may reside on a single host computing system (see FIG. 1A) such as 114*a* with additional backups, for example, of the User Data Files and Libraries, in the Data Storage System 112.

In certain aspects of the present technology, portions of the simulation computing system 219, such as the GUI module 220, the Modeling and Simulation module 222, the Data Storage and Retrieval module 224, and/or the Libraries 226 may be included or executed in combination with other available system package(s). These components may operate on one of the host systems 114*a*-114*n*, and may include one or more operating systems, such as, Windows 10, Windows HPC Server, Unix®, Linux®, Mac OS®, iOS, Chrome® OS, Android®, and the like. It is further contemplated that the modules of the modeling system 219 may be written in any one of a variety of computer programming languages, such as, C, C++, C#, Java®, or any combination(s) thereof, or other programming languages.

It is contemplated that the GUI module 220 may display GUI windows in connection with obtaining data for use in performing modeling, simulation, and/or other problem solving for one or more processes and/or physics phenomena under consideration by a system user. The one or more processes and/or phenomena may be assembled and solved by the Modeling and Simulation module 222. That is, user data may be gathered or received by the system using modules, such as the GUI module 220, and subsequently used by the Modeling and Simulation module 222. Thereafter, the data may be transferred or forwarded to the Data Storage and Retrieval module 224 where the user-entered data may be stored in a separate data structure (e.g., User Data Files 228). It is contemplated that other data and information may also be stored and retrieved from a separate data structure, such as Libraries 226, which may be used by the Modeling and Simulation module 222 or in connection with the GUI module 220.

The various data files that may be associated with a simulation system, such as User Data Files 228 and the Libraries 226, may be stored in any one of a variety of data file formats in connection with a file system used in the host computing system or in the Data Storage System 112. In certain aspects, the system 219 may use any one of a variety of database packages in connection with the storage and retrieval of data. The User Data files 228 may also be used in connection with other simulation and modeling systems. For example, the User Data files 228 may be stored in a format that may also be used directly or indirectly as an input to any one of a variety of other modeling or simulation systems. In certain aspects, data may be imported and/or exported between different modeling systems. The format of the data may be varied or customized in accordance with each of the system(s) as well as in accordance with additional operations that each of the system(s) may include.

In some implementations, it is contemplated that the systems and methods described herein can be used in models combining a plurality of physics interfaces to create a multiphysics model for modeling different physical phenomena or processes. Properties of the physics interfaces can be represented by partial differential equations (PDEs) that may be automatically combined to form PDEs describing physical quantities in a coupled system or representation. It is contemplated that the PDEs may be provided to the solver either independently as one PDE or a system of PDEs, describing a single phenomenon or process, or as one or several systems of PDEs describing several phenomena or processes.

In some implementations, it is contemplated that physical properties can be used to model physical quantities for component(s) and/or process(es) being examined using the simulation system, and the physical properties can be defined using a GUI that allow the physical properties to be described as numerical values. In certain aspects, physical properties can also be defined as mathematical expressions that include one or more numerical values, space coordinates, time coordinates, and/or the actual physical quantities. In certain aspects, the physical properties may apply to some parts of a geometrical domain, and the physical quantity itself may be undefined in the other parts of the geometrical domain. A geometrical domain or "domain" may be partitioned into disjoint subdomains. The mathematical union of these subdomains forms the geometrical domain or "domain". The complete boundary of a domain may also be divided into sections referred to as "boundaries". Adjacent subdomains may have common boundaries referred to as "borders". The complete boundary is the mathematical union of all the boundaries including, for example, subdomain borders. For example, in certain aspects, a geometrical domain may be one-dimensional, two-dimensional, or three-dimensional in a GUI. However, as described in more detail elsewhere herein, the solvers may be able to handle any space dimension. It is contemplated that through the use of GUIs in one implementation, physical properties on a boundary of a domain may be specified and used to derive the boundary conditions of the PDEs.

Additional features of a simulation system for modeling physical systems, such as features that may be found in the Modeling and Simulation module 222, may provide for automatically deriving a system of PDEs and boundary conditions for a physics (including multiphysics in some implementations) model. This technique can include merging the PDEs of the plurality of phenomena or processes, and may produce a single system of coupled PDEs, also using coupling variables or operators to couple processes in different coordinate systems, and may perform symbolic differentiation of the system of PDEs with respect to all the dependent variables for later use by the solver.

It is contemplated that certain aspects of the present technology may include features improving operations of a simulation computing system for modeling one or more of a plurality of engineering and scientific disciplines (e.g., acoustics, chemical reactions, diffusion, electromagnetism, fluid mechanics, geophysics, heat transfer, optics, plasma physics, quantum mechanics, semiconductor physics, structural mechanics, wave propagation, and the like). Certain aspects of a simulation system may involve more than one of the foregoing disciplines and can also include representing or modeling a combination of the foregoing disciplines. Furthermore, the techniques that are described herein may be used in connection with one or more systems of PDEs.

In some implementations, a model including shape optimization and/or topology optimization steps, as described within the present disclosure, may be used as a basis for constructing a computer application (for physics or multiphysics simulation. The computer application may be a stand-alone application with a run-time environment used for a simulation resulting in shape optimization and/or topology optimization. In some implementations, the computer application may operate on a client server platform.

It is contemplated that in certain aspects of the present technology, system(s) of PDEs may be represented in general, coefficient, and/or weak form. The coefficient form may be more suitable in connection with linear or almost linear problems, while the general and weak forms may be better suited for use in connection with non-linear problems. The system(s) being modeled may have one or more associated studies, for example, such as stationary, time dependent, eigenvalue, or eigenfrequency. In the aspects described herein, a finite element method (FEM) may be used to solve for the PDEs together with, for example, adaptive meshing, adaptive time stepping, and/or a choice of a one or more different numerical solvers.

It is contemplated that in certain aspects of the present technology, a finite element mesh may include simplices forming a representation of a geometrical domain. Each simplex can belong to a unique subdomain, and a union of the simplices can form an approximation of the geometrical domain. The boundary of the domain may also be represented by simplices of the dimensions 0, 1, and 2, for geometrical dimensions 1, 2, and 3, respectively.

It is further contemplated that a mesh representing a geometry may also be created by an outside or external application and may subsequently be imported for use into the modeling system(s) described in the present disclosure.

The initial value of the solution process may be given as numerical values, or expressions that may include numerical values, space coordinates, time coordinates and the actual physical quantities. The initial value(s) may also include physical quantities previously determined.

The solution of the PDEs may be determined for any portion of the physical properties and their related quantities. Further, any portion not solved for may be treated as initial values to the system of PDEs.

Topology optimization or shape optimization in a modeling and simulation system uses a solver, which is often a PDE solver, that is referred to as an optimization solver. The optimization solver computes a solution based on a user-defined expression that is referred to as an optimization objective expression. The optimization objective expression is defined by a user to either be maximized or minimized. The value of the optimization objective expression depends on one or more control variables that may also be referred to as design variables.

An optimization objective expression is evaluated by the optimization solver using first initial values of the control variables, and then iteratively using updated control variables to find an optimized solution. A desired optimized solution is a set of control variable values that correspond to the maximum or minimum value of the expression as defined by the user. Depending on the type of solver used as an optimization solver, the optimization solver may use the gradient (with respect to control variables) of the optimization function expression to define the next set of control variable values.

In some implementations, an optimized solution of a model corresponds to the values of the dependent variables of the model as solved by a solver using the optimized output of control variable values from the optimization solver.

In some implementations of GUIs and methods described for the present technology, "import" and "import button" or similar GUI operations may be referred to rather than "use" and "use button". "Use" or "use button" may be a more precise description for using a geometry that is already stored in memory and available to a physics interface without loading or importing the geometry from storage, such as a hard drive. However, such context should not limit the understanding of "import" and "import files" to mean the geometries are written to a file and that there is then a requirement for the user to then load them into the system. Rather, a multi-use aspect of the graphical user interface would be understood.

It is contemplated that a goal of shape optimization includes optimizing an overall shape of a target geometry of the physical object being modeled where the shape is optimized based on one or more optimization objective expressions. For example, shape optimization may include determining a shape of one or more geometries such that the optimization objective expression is minimized or maximized while one or more variables with respect to the shape stays within certain limits.

In some implementations, a method of shape optimization referred to as polynomial boundary shape optimization, generates suitable Bernstein polynomials in response to a user input to the simulation computing system. In a GUI, the user input may be received by the simulation computing system by a user by using a selection apparatus, such as a mouse, touchscreen, touchpad or keyboard, that is associated with a computer running or displaying the model. With the selection apparatus, selections of one or more boundaries or edges of a geometrical representation of a physical object being modeled are received. Further selections can also be received via the selection apparatus to interact with GUI indicia to input a command that the selected boundaries should be shaped optimized. Shape optimization may then be performed by the simulation computing system in response to the optimization input(s), for example, modifying an original expression for the boundary/edge of the geometrical representation using Bernstein polynomials, with the coefficients of the Bernstein polynomials being changed during an optimization process to find an optimized geometrical representation in accordance with the optimization objective expression. At the beginning of the optimization process, the Bernstein polynomial coefficients are zero, resulting in the original boundary expressions. The Bernstein polynomials may be generated automatically in response to the user interacting with GUI elements, such as by defining control variable minimum and maximum values and a polynomial order, as depicted, for example, in FIGS. 3D and 3E.

It is contemplated that modified boundary (or edge) expressions may be applied to PDE expressions, which may be of weak form, representative of the one or more physics to be optimized. It is further contemplated that the present technology desirably allows geometry expressions modified by Bernstein polynomials to be used in any physics, or combination of physics, for example in acoustics, fluid dynamics, electromagnetic, chemical reactions, or heat transfer.

An advantageous aspect of the present technology is that the Bernstein polynomials, including the Bernstein Polynomial coefficients, can be generated automatically by computing systems (e.g., a computer aided engineering systems, physics simulation computing systems) in response to a user command received, for example, by a graphical user interface. Furthermore, the Bernstein polynomials can be applied without further user input the geometry expressions, thereby increasing the efficiency and accuracy in setting up a model that includes shape optimization, as the user does not need to take further steps to generate the Bernstein polynomials, nor to apply them to the geometry expressions. Furthermore, present technology allows for increased speed in obtaining optimization solutions. A Bernstein polynomial expression is depicted in the GUIs shown in both FIGS. 3D and 3F.

Bernstein polynomials satisfy the maximum displacement bound over the entire boundar(ies) for the geometric expression of a model whereas Lagrange polynomials are understood to only satisfy the maximum displacement bound at the interpolation points. Thus, Bernstein polynomials can be more robust to use in shape optimization. FIG. 3D depicts the user selection element 302 for the polynomial order where a fourth order Bernstein polynomials is input into an edit field. FIG. 29 depicts a table 2902 with the Bernstein polynomial expressions for the boundaries 2901 of an exemplary geometrical representation. For higher-order Bernstein Polynomial expressions (or other high order polynomial expressions), the technology described in the present disclosure very advantageously minimizes user error and increases accuracy and efficiency in inputting high-order polynomials. For example, a user, via the GUI in FIG. 3D, can define the boundaries or edges in settings field 304 that should be shape optimized using the Bernstein Polynomials, define a polynomial order using a selection menu or edit field (or similar GUI input operation) under element 302, and a maximum displacement in field 301 controlling the maximum and minimum value of the control variables. Using the user inputs, all the required expressions are then generated and the control variables are available to be updated by an optimization solver, all without any further user input. The user is thus able to perform very sophisticated shape optimization while minimizing user inputs. For example, inputs can be minimized for selecting the boundaries for shape optimization and defining an optimization objective expression in an optimization settings window. In addition, the user may enter a maximum displacement and polynomial order if customization of the default settings is deemed to be preferred.

Before the shape optimization or topology optimization techniques described by in the present disclosure can be implemented, an initial geometrical representation needs to be created of a physical object to be modeled. To create the geometrical representation, select actions and in some instances, related GUI elements, for constructing models are described. These select actions and GUI elements provide an understanding of how the shape optimization or topology optimization described in the present disclosure may be added as additional features to an existing model.

In some implementations, a user may use a computing system, including a computer aided engineering product, to construct a model including an initial geometry representative of a physical object. The shape may at least be partially optimized based on some preliminary criteria established for the particular design situation. The model may include one or more physics features originating, for example, from one or more user interfaces for modeling a specific physics or for modeling multiple physics (i.e., multiphysics).

Next, a user may select a shape optimization attribute to be associated with selected boundaries of the initial geometry. In response to the selection of a shape optimization attribute, the computing system may provide a display to the user of one or more settings windows. In the setting windows, the user may provide various relevant user inputs for the shape optimization attribute.

The user may use an indicator apparatus (e.g., a mouse, touch screen) associated with a computing system, or similar electronic device for displaying and/or performing the modeling, to indicate one or more boundaries of the initial geometry to be shape optimized with a specific shape optimization operation. The indication input(s) may be performed either by selecting the one or more boundaries from a graphical representation of the geometry, for example by moving a mouse pointer over, and then clicking on said boundaries, and/or by similarly selecting indicia representative of the one or more boundaries from a selection list (or similar GUI entity) of boundaries of the geometry displayed in a graphical user interface. The user may also define a maximum displacement and a polynomial order using GUI input elements, such as example edit fields or selection menus.

Next, in response to a user identifying shape optimization attributes and boundaries to be optimized, the computing system without further user input can construct Bernstein polynomials based on the user selected boundaries, maximum displacement, and polynomial order. In some implementations, default values may be used for the maximum displacement and polynomial order. The Bernstein polynomials include Bernstein polynomial coefficients for each boundary previously identified by the user. The Bernstein polynomials are representative of displacement modifications to the geometry expressions to be shape optimized. Construction of other optimization expressions are contemplated, as discussed further below for a free shape optimization.

Following construction of the Bernstein polynomials, the geometry expressions modified by Bernstein polynomials may be used to construct PDEs representative of the modeled physics. The PDEs at least partially include expressions of Bernstein polynomials, including the Bernstein polynomial coefficients. Next, an optimization procedure is implemented to modify the Bernstein polynomial coefficients to update the initial geometry expression and create a modified geometry, along with updated PDEs.

In some implementations, the geometry is optionally updated based at least partially based on the modified Bernstein polynomial expressions, and/or one or more dependent variables representative of, or related to, some physical property are calculated at least partially based on the modified Bernstein polynomial expressions.

Next, a logical operation is performed to determine if an optimized value related to the geometry expressions or physical properties has reached an optimization threshold, such as an optimized solution having been achieved or the maximum number of iterations having been performed. If the answer is "YES", then the geometry is updated based at least in part on the modified Bernstein polynomial expressions, and/or a one or more dependent variables representative of, or related to, some physical property calculated based at least in part on the modified Bernstein polynomial expressions. The dependent variables, or more in some implementations a graphical representation of the values of said dependent variable in the graphical representation of the physical object, are displayed to the user. If the answer is "NO", then then the optimization procedure is repeated to again modify the Bernstein polynomial coefficients to update the previously updated geometry expression and create an updated modified geometry, along with further updated PDEs.

In some implementations of shape optimization, another method may be used, referred to a free shape optimization, which utilizes a filter approach to perform shape optimization. In the free shape implementation, a filter length is introduced where the amount of mesh deformation depends on the filter length. The filter length is typically understood to be related to the mesh size. For a small filter length, the individual mesh vertices may be moved more independently during the optimization process, thereby modifying the shape of the boundary. For a large filter length, the filter contribution to the displacement becomes larger, such that mesh vertices of boundaries move together. The boundary may then translate or move, but changes shape to a lesser extent than with smaller filter lengths. An exemplary equation for calculating the displacement, d, using a control variable c, a filter length $R_{min}$, and a Laplace operator acting on the displaced boundary is depicted in FIG. 3E. The system user defines filter length (e.g., filter radius) and a control variable min and max for the displacement equations. The displacement equations are PDEs related to the boundary that are constructed by the computing system without further user input and used by the computing system to at least partially modify a discretized geometry in an optimization procedure. During the optimization process, optimized control variables, with respect to an optimization objective expression, are determined.

Turning to FIGS. 3 to 33, exemplary GUIs and method steps are depicted for topology optimization and shape optimization of geometrical representations of physical objects being modeled, for example, in a simulation, or other, computing system.

Figure 3A:
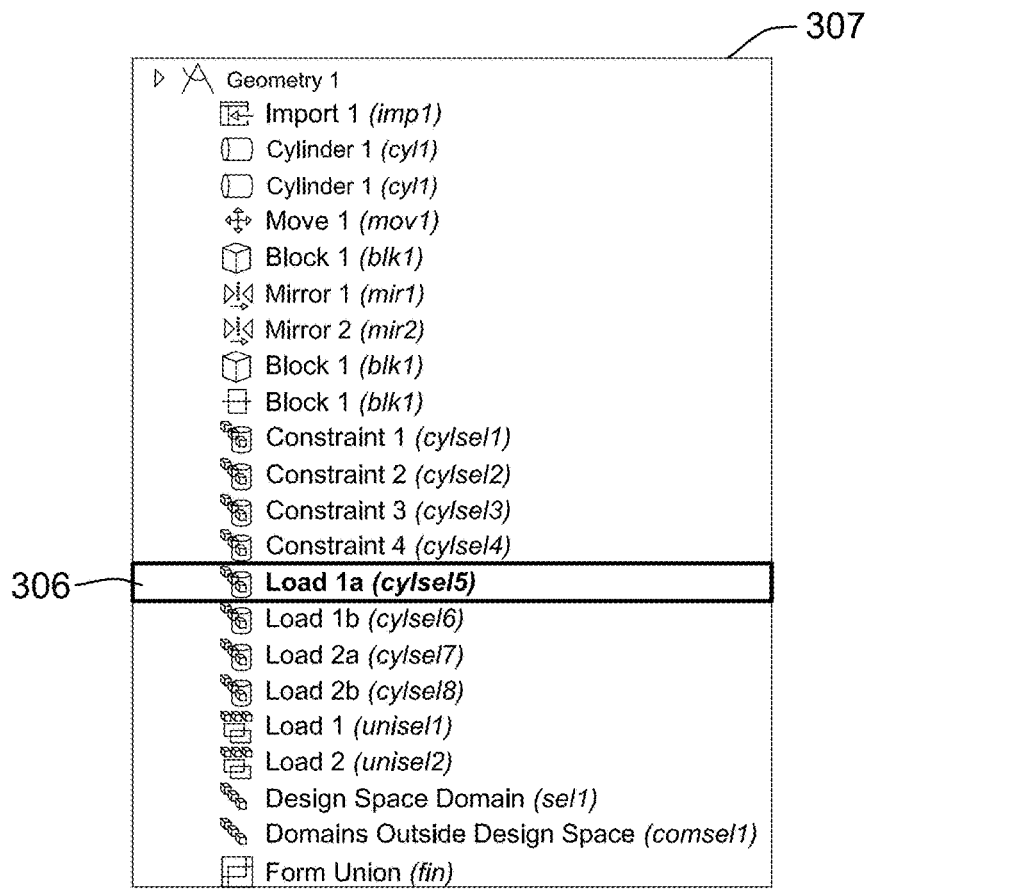
FIGS. 3A-3C depict GUI elements for accessing, viewing, and defining parts of a geometrical representation of a physical object being modeled, according to some implementations of the present technology.
Figure 3B:
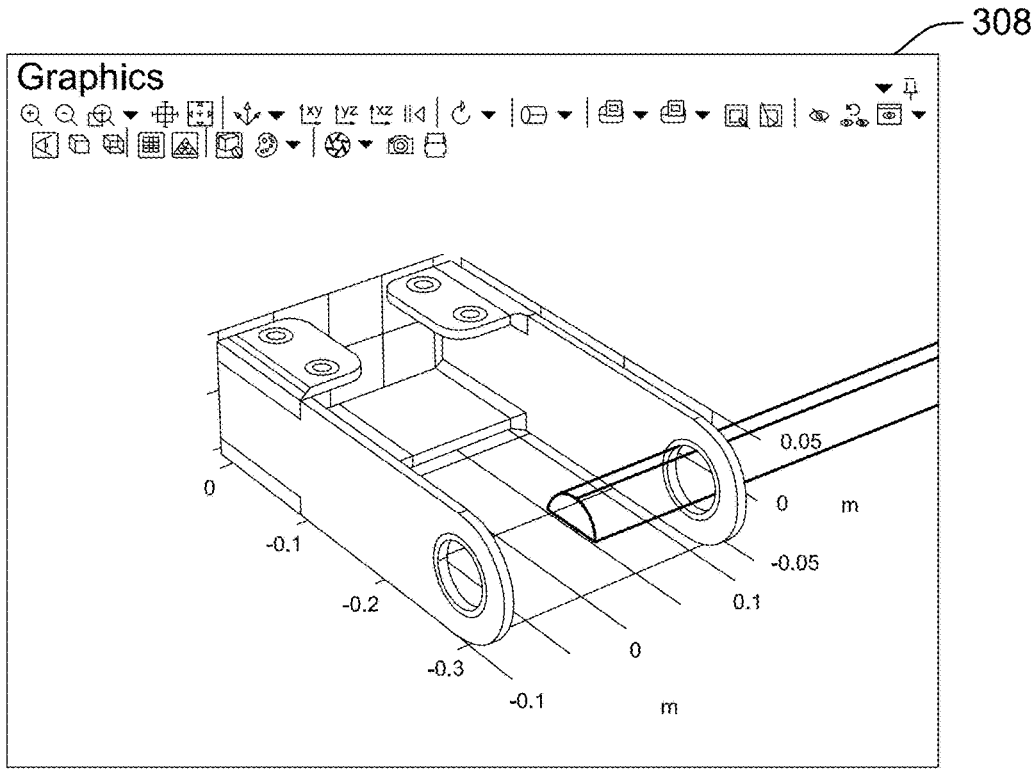
Figure 3C:
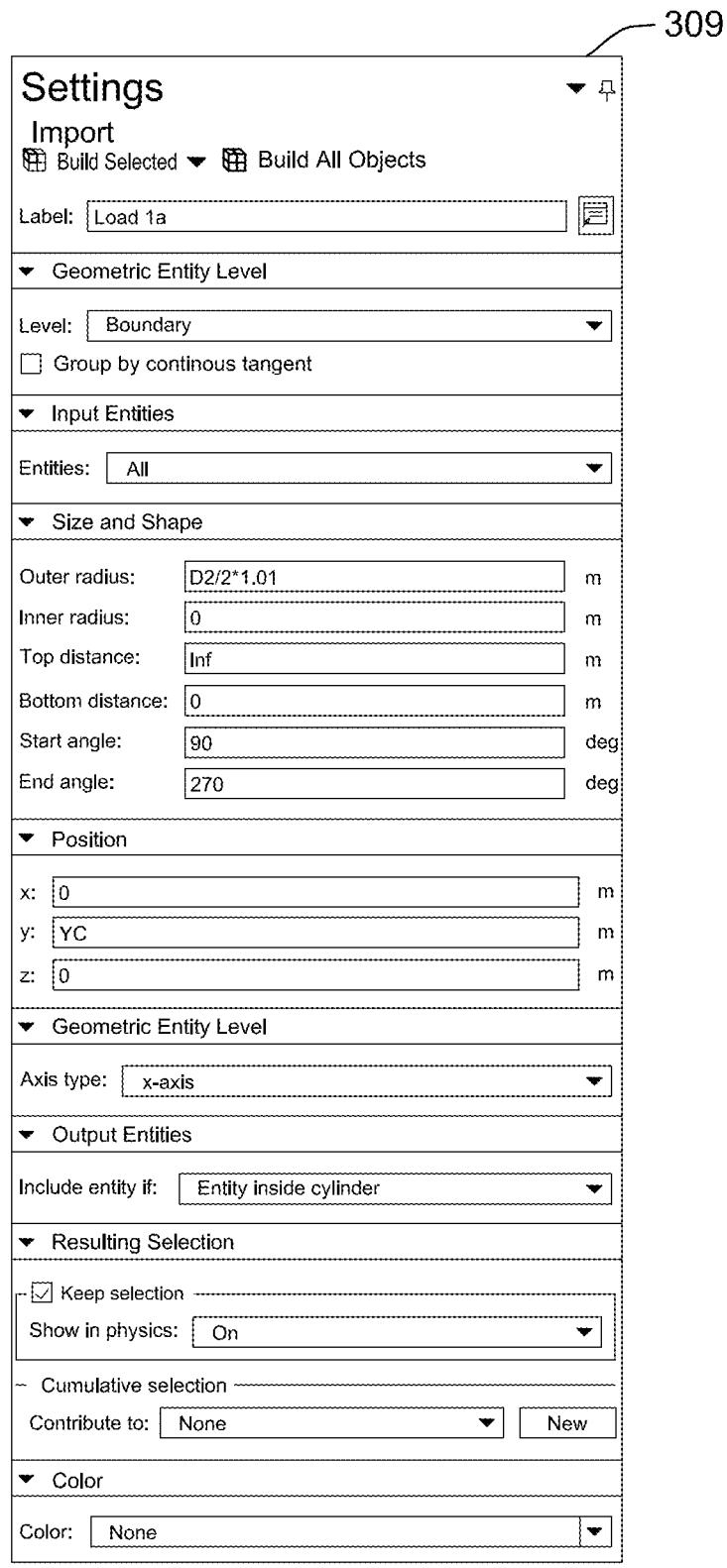
Figure 3D:
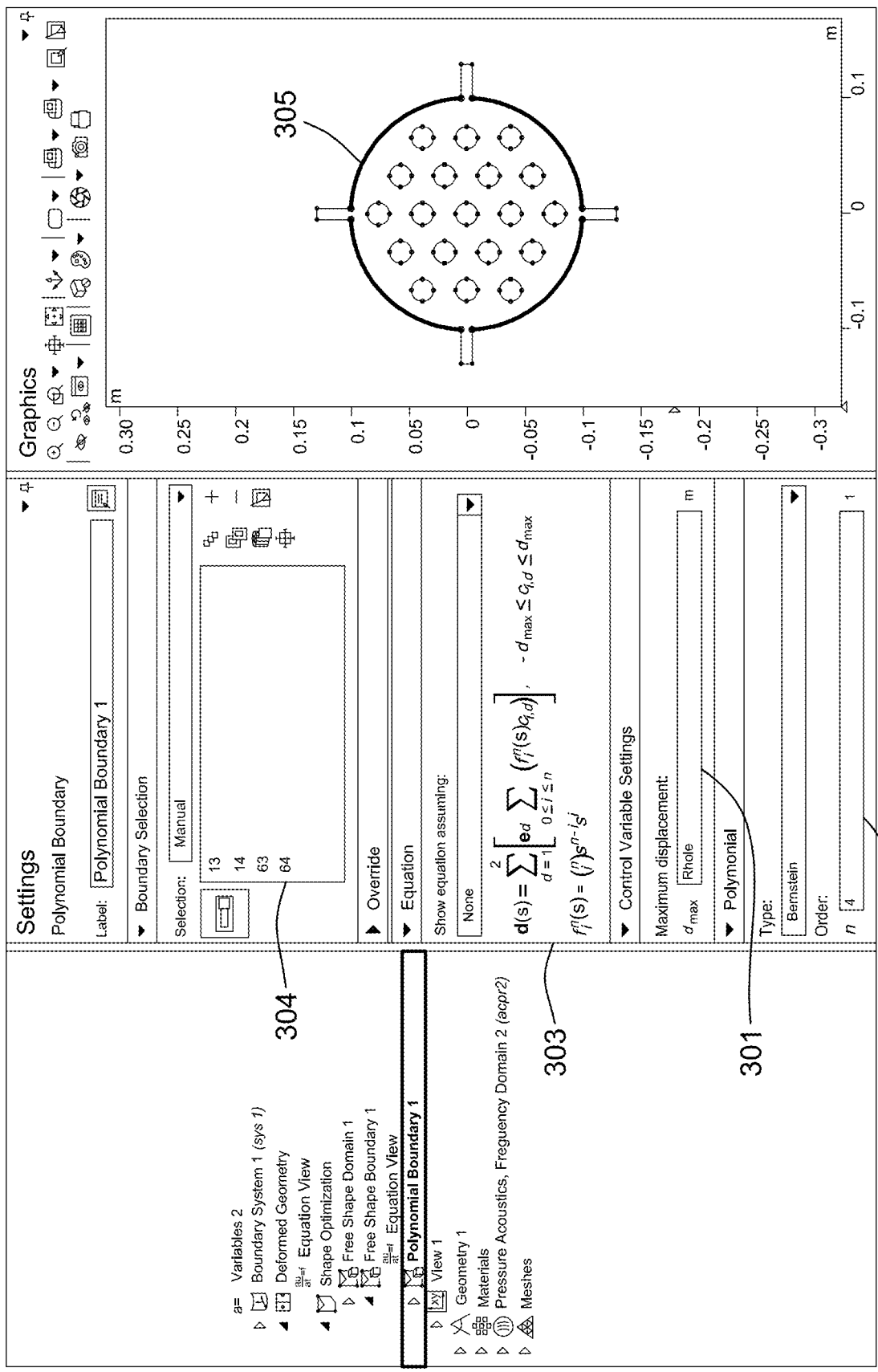
FIGS. 3D-3F depict settings windows including exemplary equations for shape optimization using a polynomial boundary and a free shape optimization using a filter, according to some implementations of the present technology.
Figure 3E:
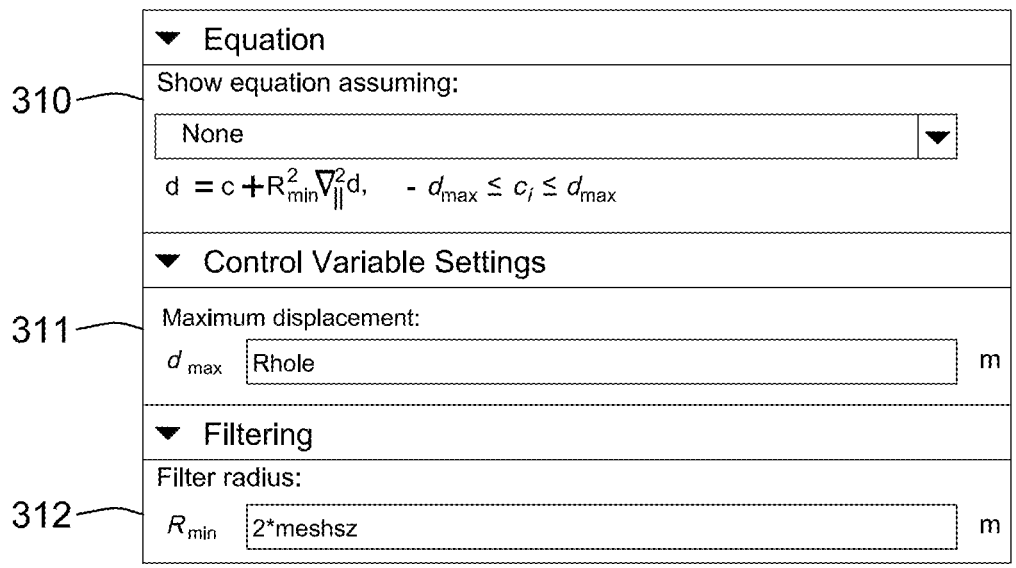

Referring now to FIGS. 3A-3F, exemplary windows including GUI elements for defining shape optimization parameters for an exemplary physical object being modeled in a simulation, or other, computing system. FIGS. 3A to 3C depict GUIs including selectable GUI elements and edit fields for an exemplary portion of the geometry, named "Load 1a", that may be created or imported into a physics model. In FIG. 3A, the geometry is selected from a user input selection of indicia 306 from a menu window 307 of exemplary geometries. In FIG. 3B, a graphics window 308 displays a geometric representation of the physical object associated with the selected indicia 306. FIG. 3C is a settings window 309 depicting exemplary setting for the model associated with indicia 306 and the geometric representation displayed in the graphics window 308.

Figure 3F:
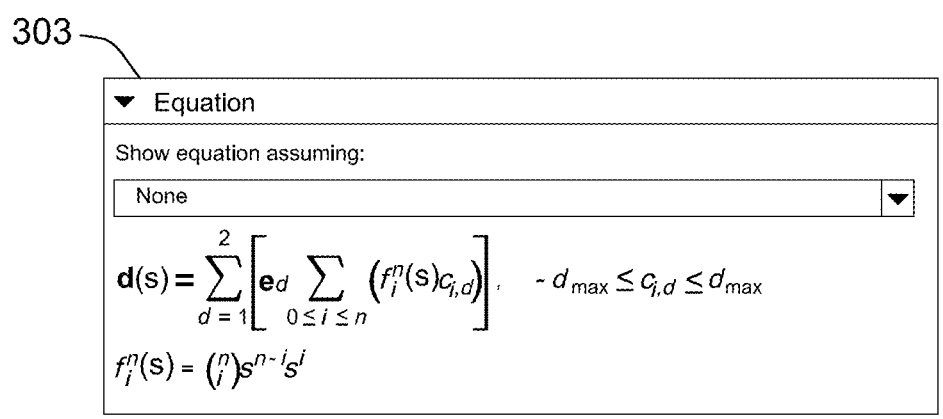

As discussed above, FIGS. 3D to 3F depict exemplary GUIs for inputting settings for shape optimization of a physical object to be modeled. For example, in FIG. 3D, boundaries or edges can be defined in boundary settings field 304 that should be shape optimized using Bernstein Polynomials. A polynomial order settings field 302 can be used to define a polynomial order for a defined polynomial displayed in the Equation field 303 for the polynomial boundary. FIG. 3F provides a close-up of the displayed equation field 303 including the exemplary Bernstein Polynomial. Furthermore, a displacement field 301 defines a maximum displacement controlling the maximum and minimum value of the control variables. FIG. 3D further depicts a graphics window for displaying the geometric representation a boundary for which the setting will apply.

Referring now to FIG. 3E, another implementation of an equation field 310 is depicted for a different type of shape optimization. As discussed above, equation field 310 is for free shape optimization where the displayed equation is for calculating displacement, d, using a control variable, c, a filter length $R_{min}$, and a Laplace operator acting on a displaced boundary. A displacement edit field 311 defines a maximum displacement controlling the maximum and minimum value of the control variables. In addition, the filter length is defined in the filter length field 312, which for the example of FIG. 3E is defined as a radius.

Figure 4A:
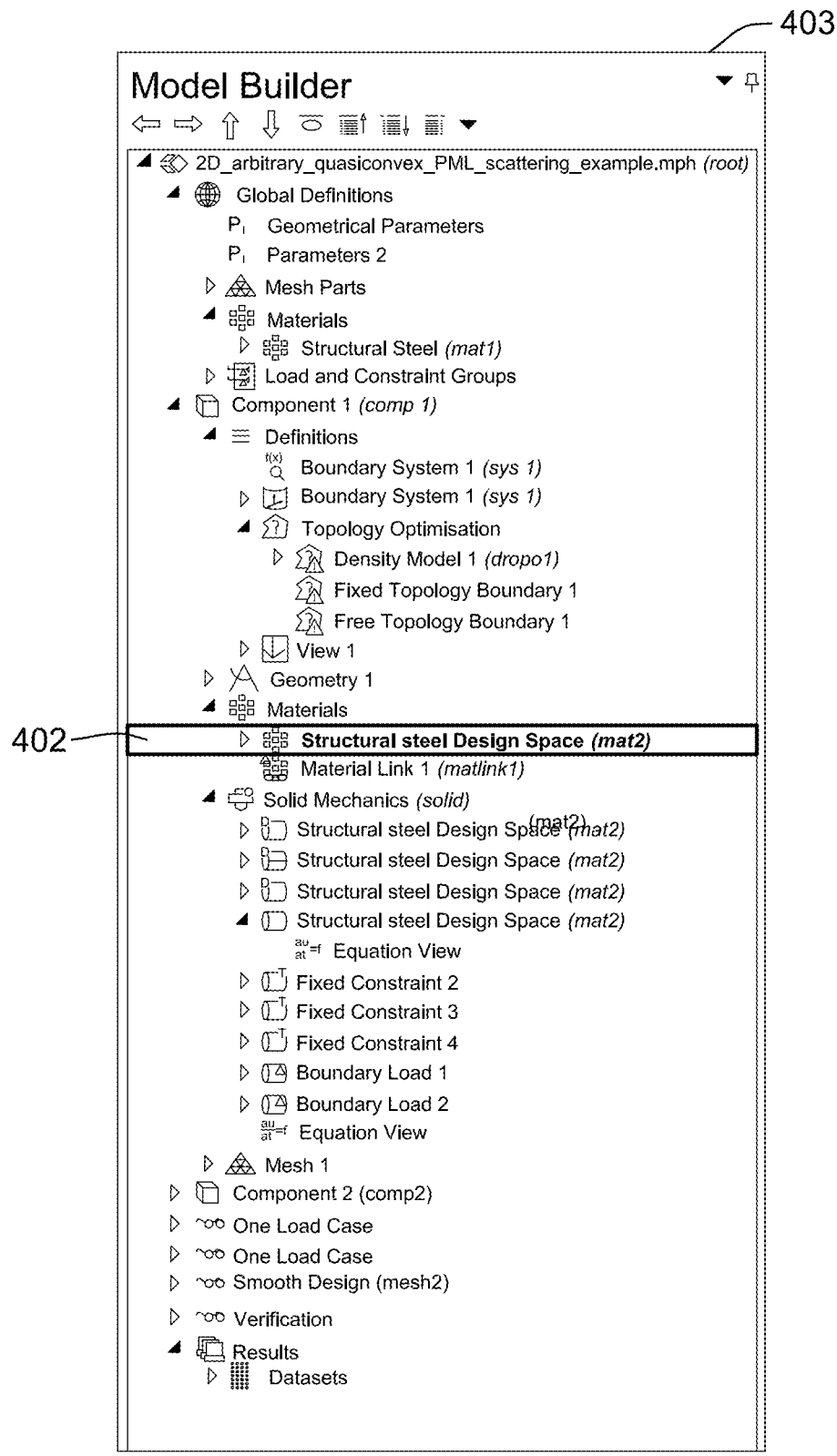
FIGS. 4A-4B depict GUI elements in the form of model tree icons and an associated settings window for setting material properties including modification using a material volume factor of the physical object being modeled, according to some implementations of the present technology.
Figure 4B:
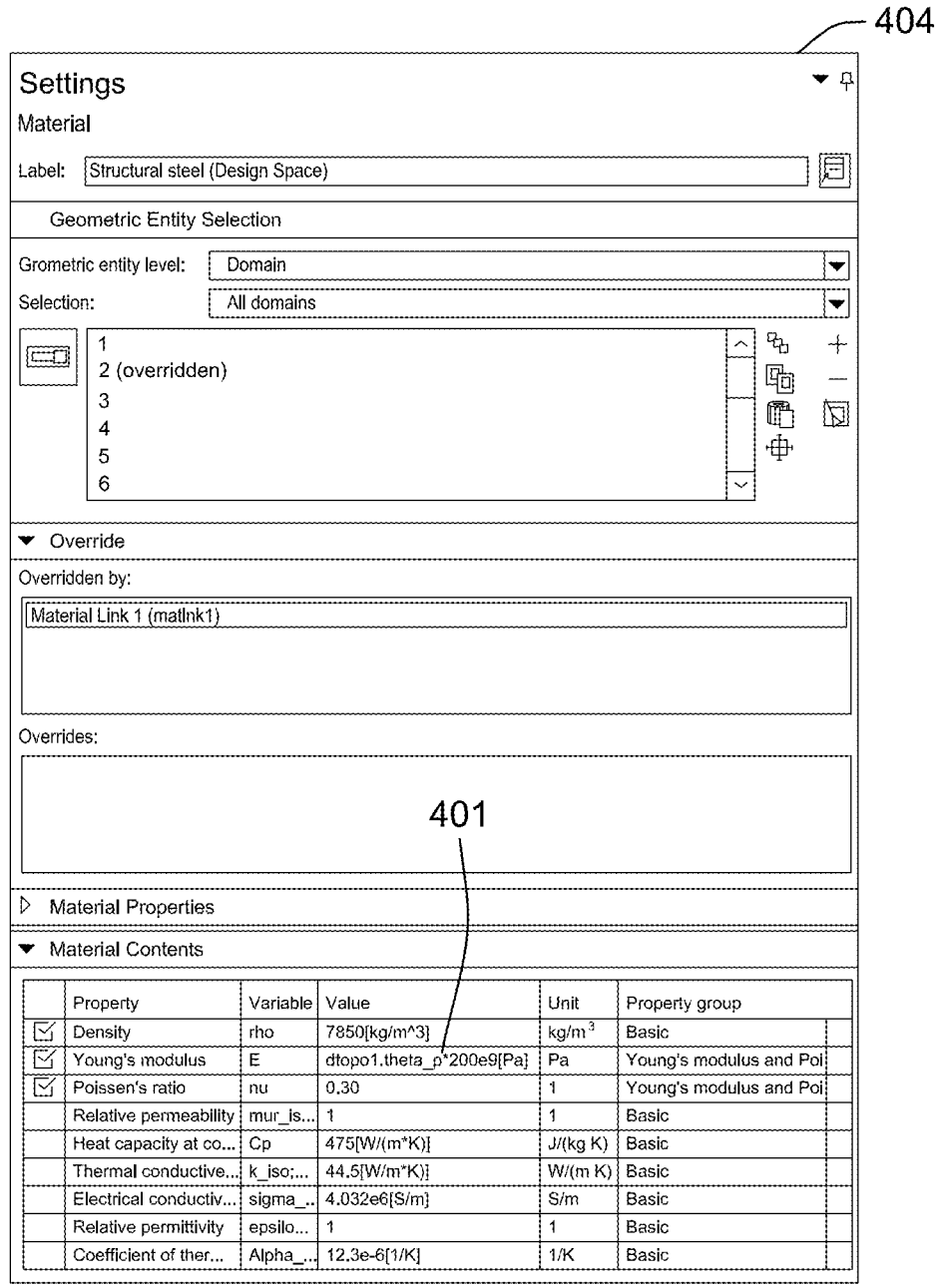

Referring now to FIG. 4A to 4B, exemplary GUIs are depicted including selectable GUI elements and edit fields for materials properties. In FIG. 4A, the materials are selected for a user input selection of indicia 402 from a menu window 403 listing the different model parameters in a model tree format. In FIG. 4B, a materials settings window 404 depicts exemplary settings for the model associated with indicia 402, such as a Young's modulus and associated parameters including an associated value field 401. The material properties included in the setting window may be applied to the geometry from the exemplary geometry of FIGS. 3A-3F.

Figure 5:
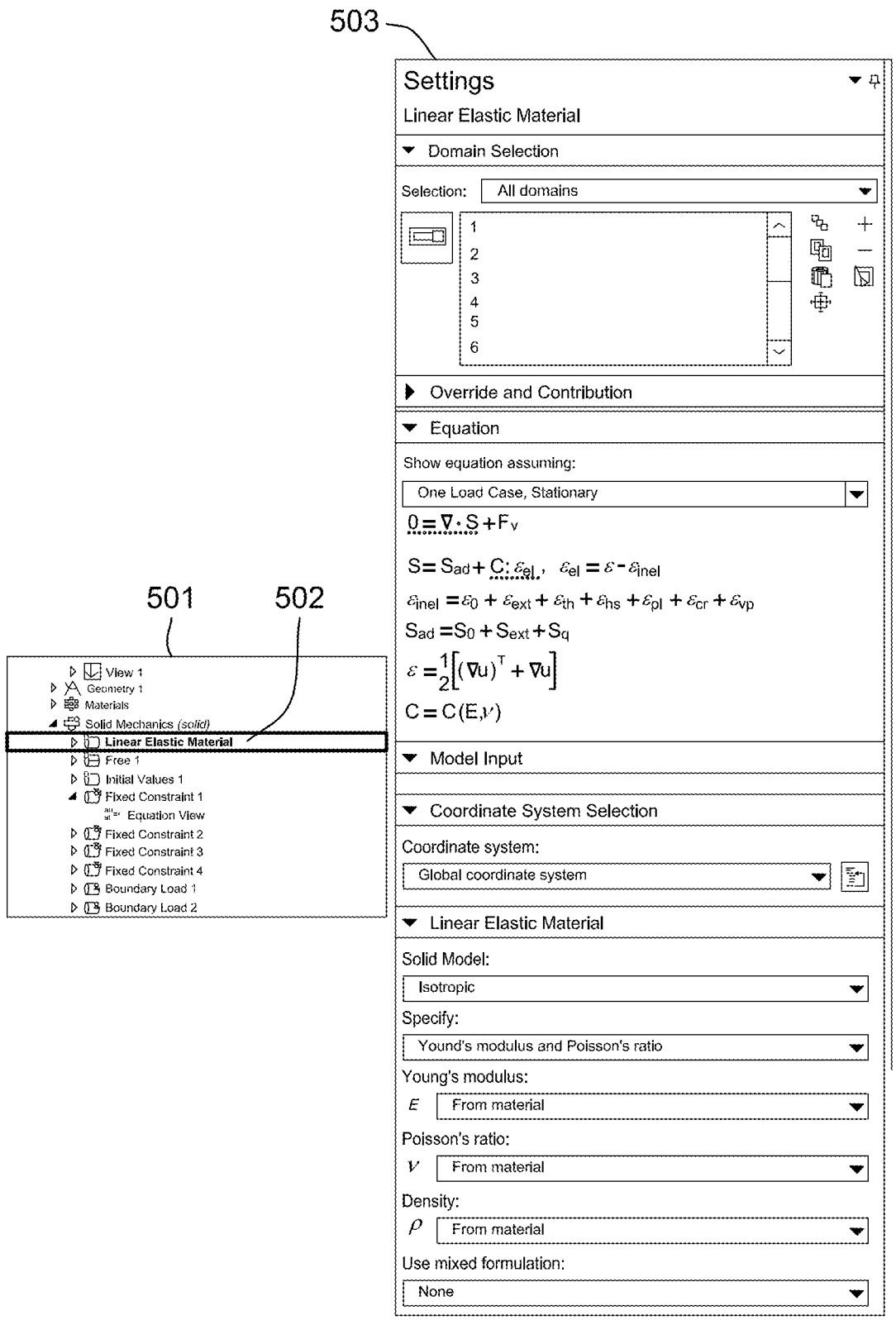
FIG. 5 depicts an exemplary physics settings window and associated model tree icons for the physical object being modeled, according to some implementations of the present technology.
Figure 6A:
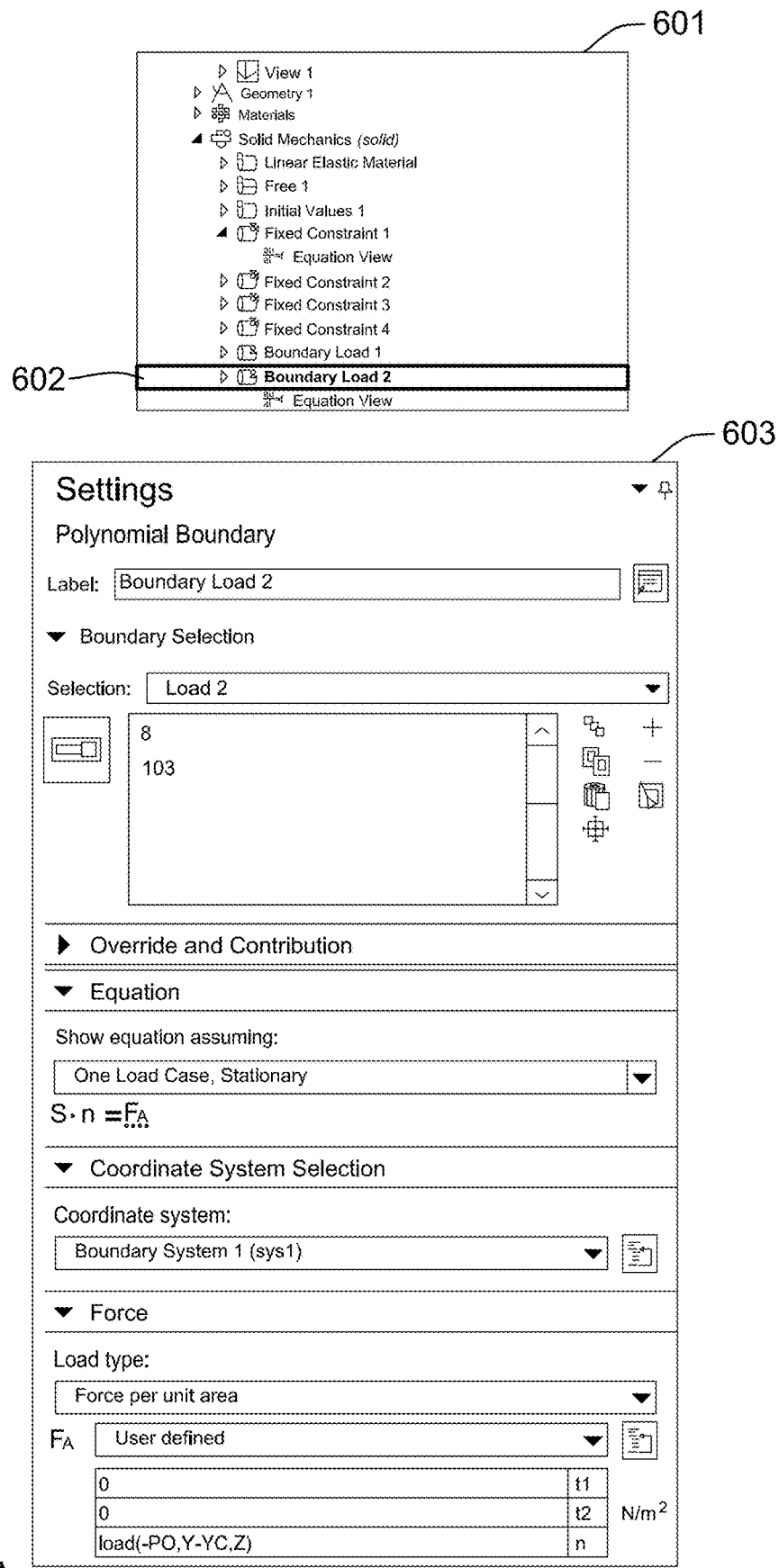
FIGS. 6A-6B depicts an exemplary settings windows and a graphical representation of the physical object being modeled for setting a boundary condition, according to some implementations of the present technology.
Figure 6B:
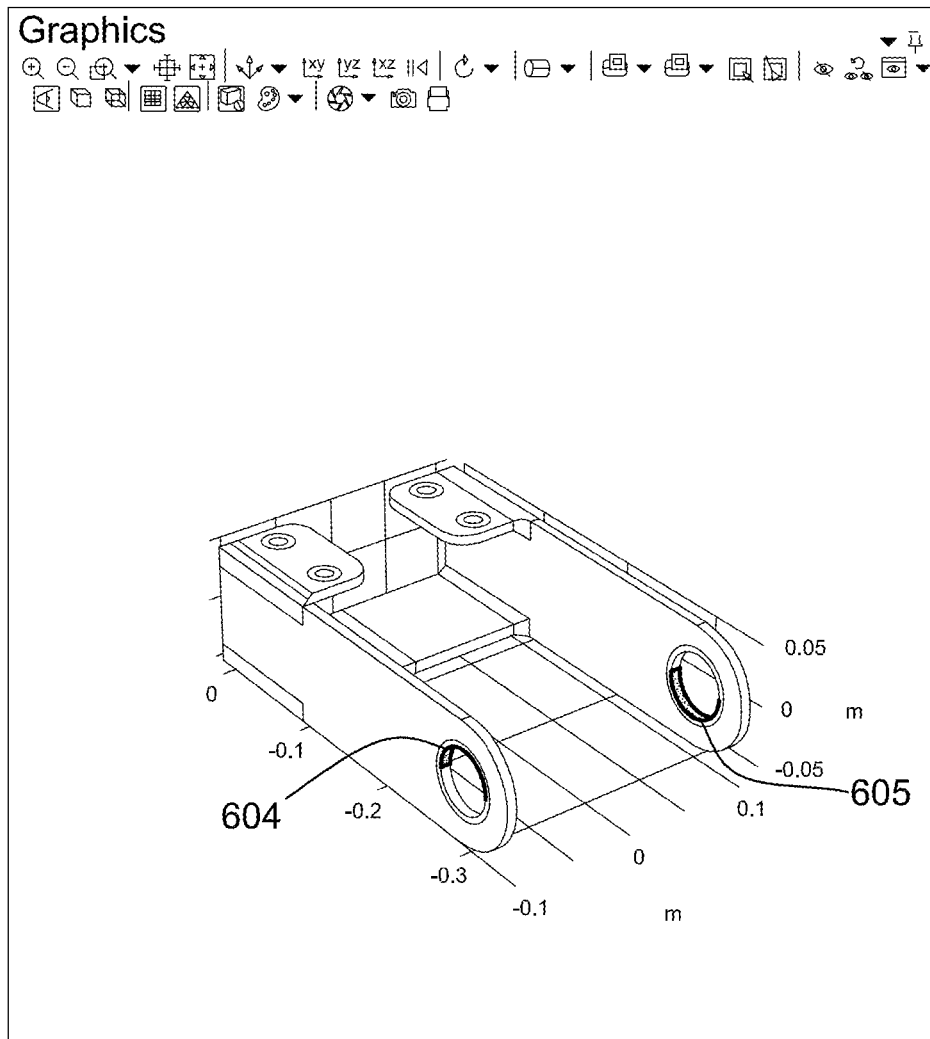

Referring now to FIGS. 5, 6A, and 6B, exemplary GUIs are depicted where one or more physics features may be selected and a physics model constructed. The constructed physics model may include physics, constraints, and conditions, such as one or more boundary conditions. For example, in FIG. 5, the settings window 503 for a linear elastic material is presented in response to a user input selection of indicia 502 from a menu window 501 listing the different model parameters in a model tree format. Similarly, in FIG. 6A, the settings window 603 for a boundary load linear elastic material is presented in response to a user input selection of indicia 602 from a menu window 601 listing the different model parameters in a model tree format. FIG. 6B depicts a graphics window with a geometrical representation of the physical object being modeled including the portions 604, 605 of the geometrical representation to which the setting apply.

The model of a physical object may include physical quantities, the geometry, and derivatives of the geometry such as generated meshes. The model may take the form of a combined set of equations which may be of PDE form and in particular, for some implementations, using weak form PDEs.

Figure 7A:
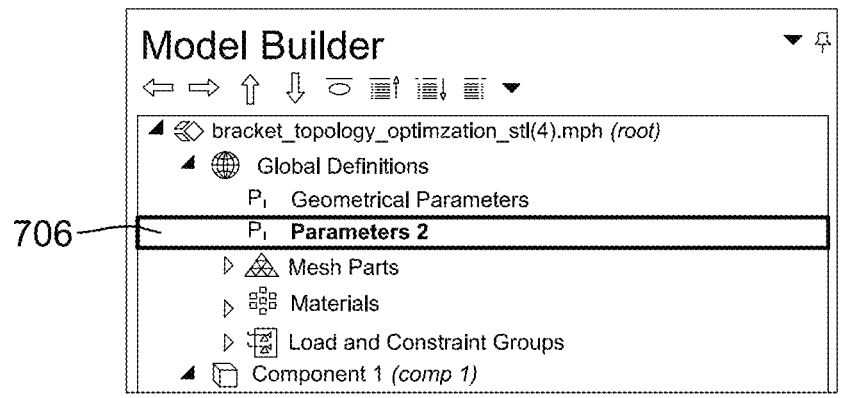
Figure 7B:
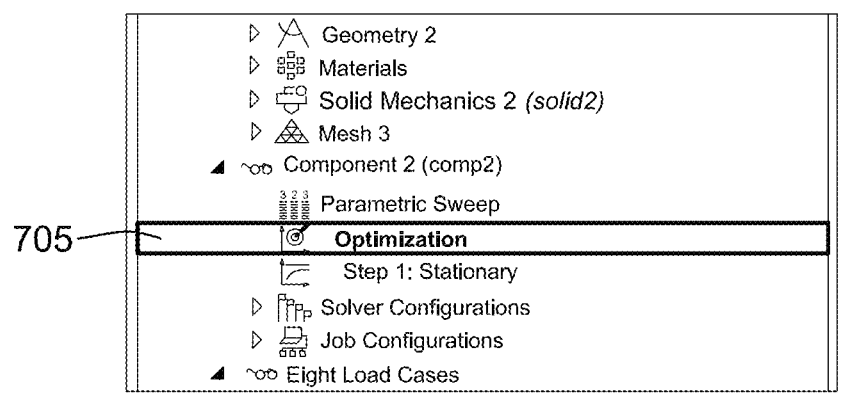

Referring now to FIGS. 7A to 7C and 8A to 8C, exemplary GUIs are depicted for selecting or constructing an optimization objective expression for optimization of a physical object being modeled. The optimization objective expression may at least partially depend on the one or more physics interface selected, as illustrated for example in FIGS. 5, 6A, and 6B. For example, in FIG. 7C, the settings window 707 for parameter setting is displayed in response to a user input selection of indicia 706 in FIG. 7A from a model builder menu window listing in a model tree format. Similarly, the settings window 708 for optimization settings is displayed in response to a user input selection of indicia 705 in FIG. 7B from also a model builder menu window listing in a model tree format. In FIG. 7C, the parameters settings window 707 can include parameter fields 701, and the optimization setting window 708 can include optimization objective expression fields, such as 702 for the expression itself and 704 for the type of optimization, along with control variable fields 703, along with options for the optimization solver.

Figure 8A:
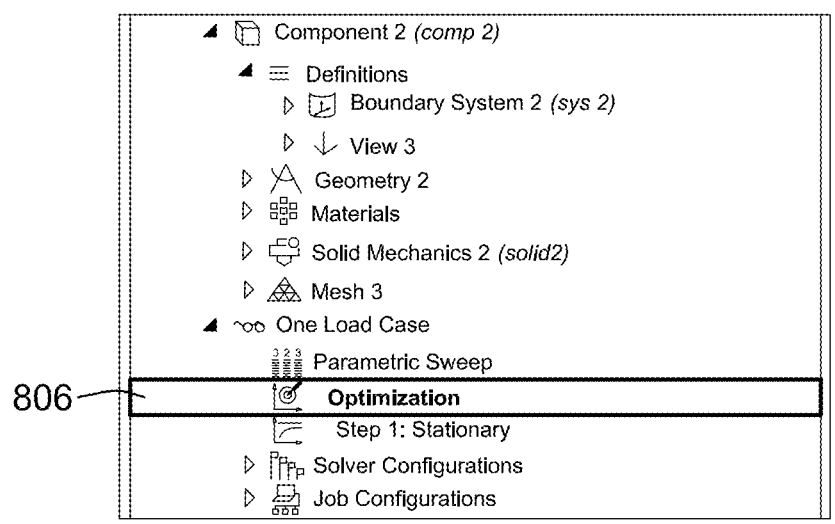
FIGS. 8A-8C depict further exemplary settings windows for shape and topology optimization solvers, including a selection menu for selecting the type of solver, according to some implementations of the present technology.
Figure 8B:
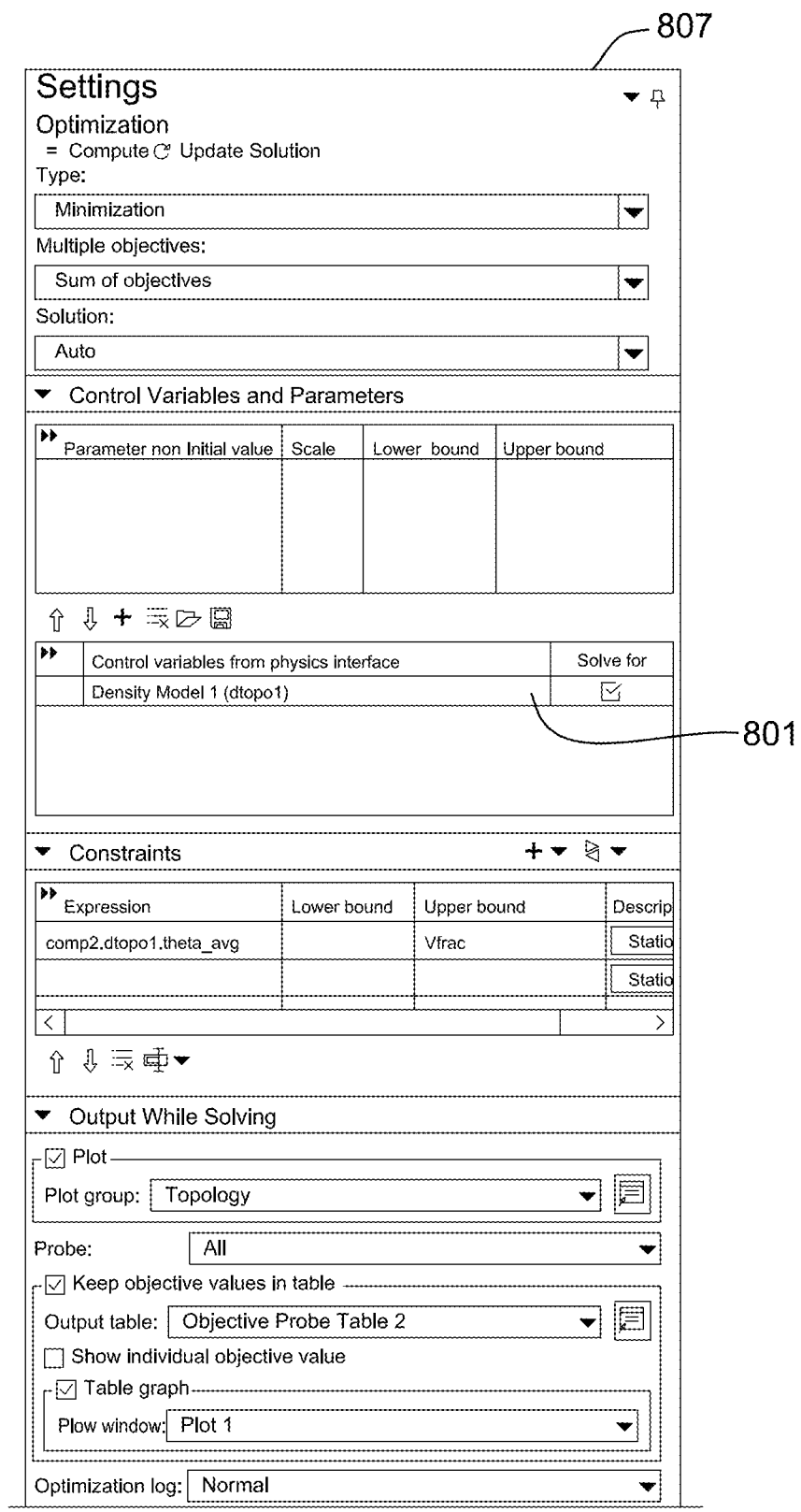
Figure 8C:
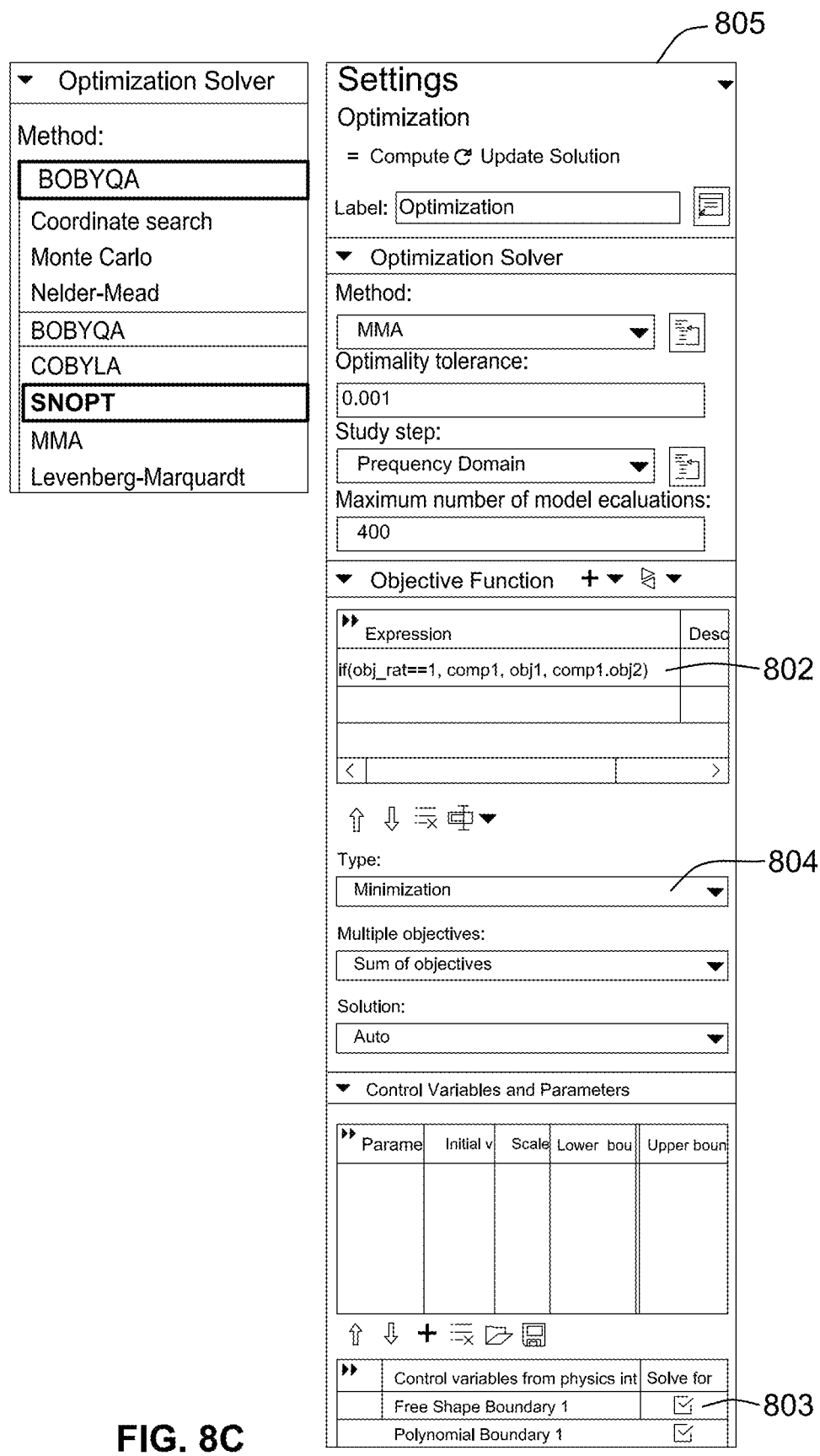

In FIG. 8B, the settings window 807 for topology optimization settings is displayed in response to a user input selection of indicia 806 in FIG. 8A from a model builder menu window listing in a model tree format. Alternatively, the settings window 805 in FIG. 8C for shape optimization setting can be displayed in the response to a user input selection of indicia 806 in FIG. 8A. In FIG. 8B, the optimization settings window 807 can include control variable field 801, along with constraints and output fields. In FIG. 8C, the optimization setting window 805 can include objective expression fields, such as 802 for the expression itself and 804 for the type of optimization, along with control variable fields 803 and options for the optimization solver. Optimization according to the objective expression in the optimization settings window 805 is tied to the control variables from the respective shape optimization settings windows, in accordance with user settings in the control variable field 803.

The type of study for a simulation may be defined where a user may select an optimization type of study and define the optimization settings such as solver type, tolerances, the type of optimization (e.g., should the objective expression be minimized or maximized), and the maximum number of iterations.

Various optimization solvers are contemplated, including method of moving asymptotes (MMA), bound optimization by quadratic approximation (BOBYQA), coordinate search, Monte Carlo, Neider-Mead, Levenberg-Marquardt, constrained optimization by linear approximation (COBYLA), or Sparse Nonlinear OPTimizer (SNOPT).

Figure 9A:
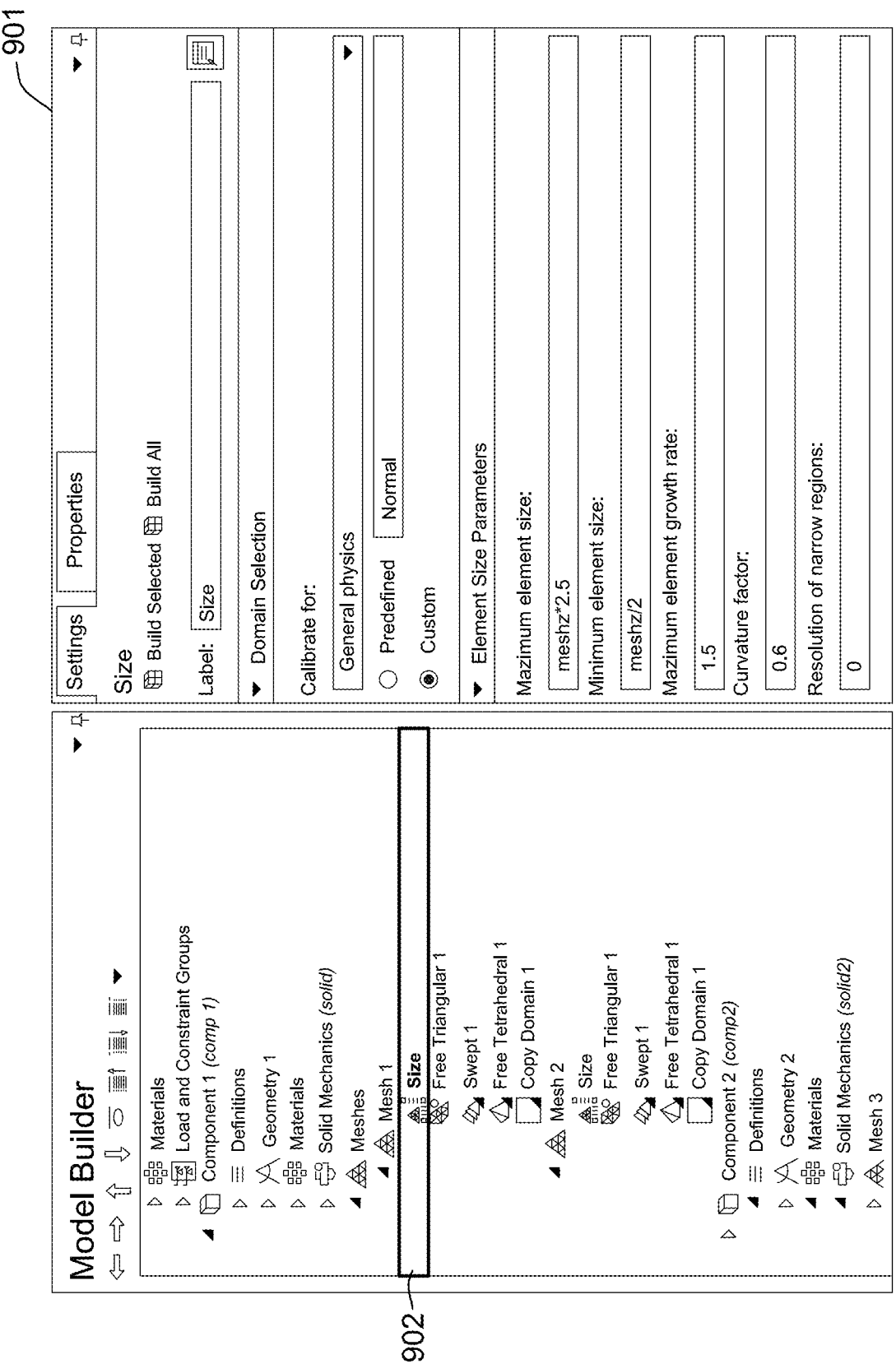
FIG. 9A-9B depict exemplary model tree icons and associated settings windows and graphical display widow for a creating a meshed representation of a physical object being modeled, according to some implementations of the present technology.
Figure 9B:
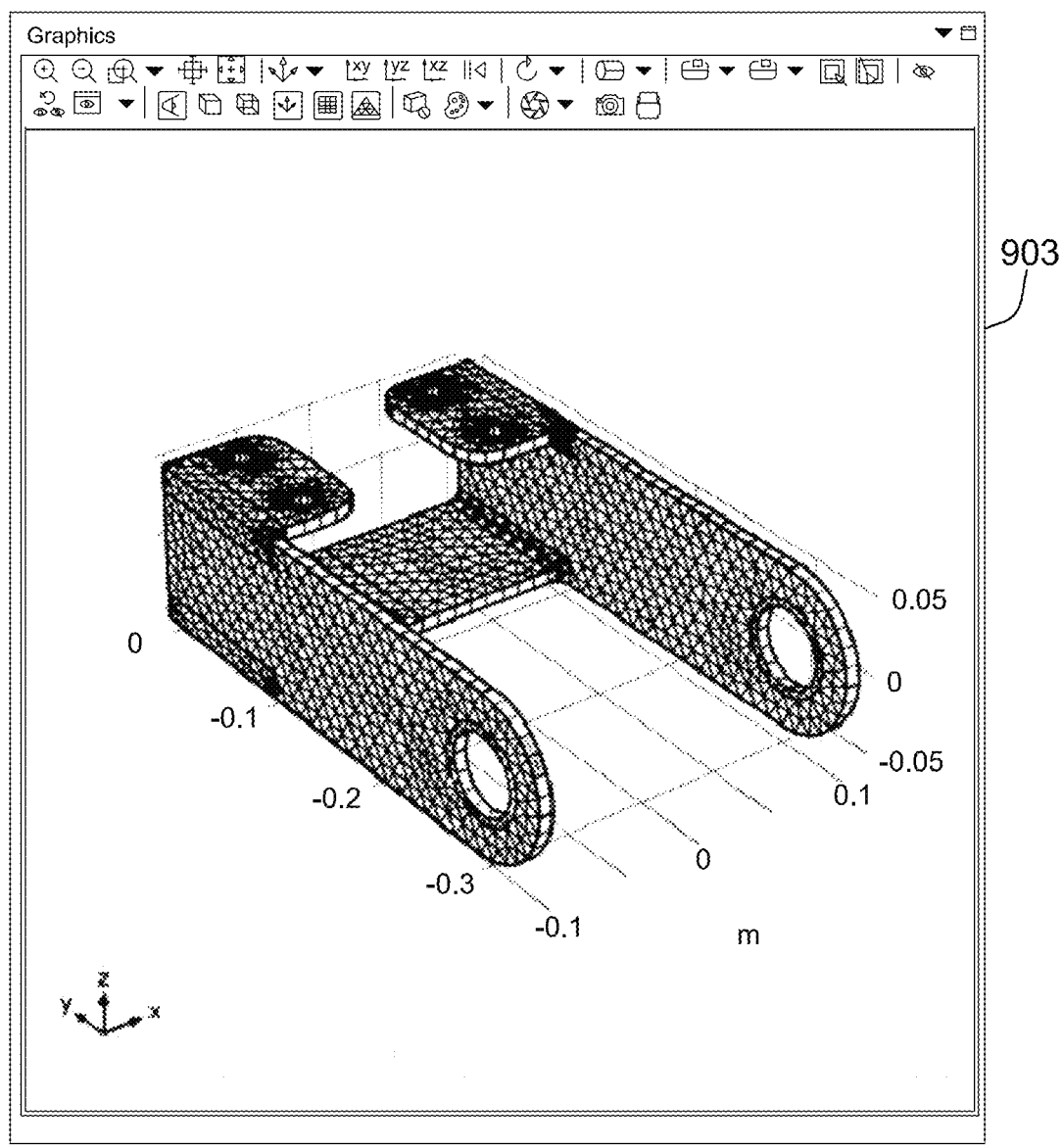

Referring now to FIGS. 9A and 9B, exemplary GUIs are depicted for discretizing a geometry of a physical object being modeled. In FIG. 9A, a settings window 901 for mesh size settings is displayed in response to a user input selection of indicia 902 from a model builder menu window listing in a model tree format. In FIG. 9B, a geometrical representation of the meshed geometry of the physical object being modeled is displayed in graphics window 903. The geometry and model of the physical object being modeled may be discretized by constructing a mesh representative of the geometry. The mesh is then used in a discretized model. The specific geometry and a mesh displayed in graphics window 903 is representative for topology optimization. Meshing for shape optimization would be expected to be analogous to the meshing illustrated in FIGS. 9A and 9B.

Figure 10:
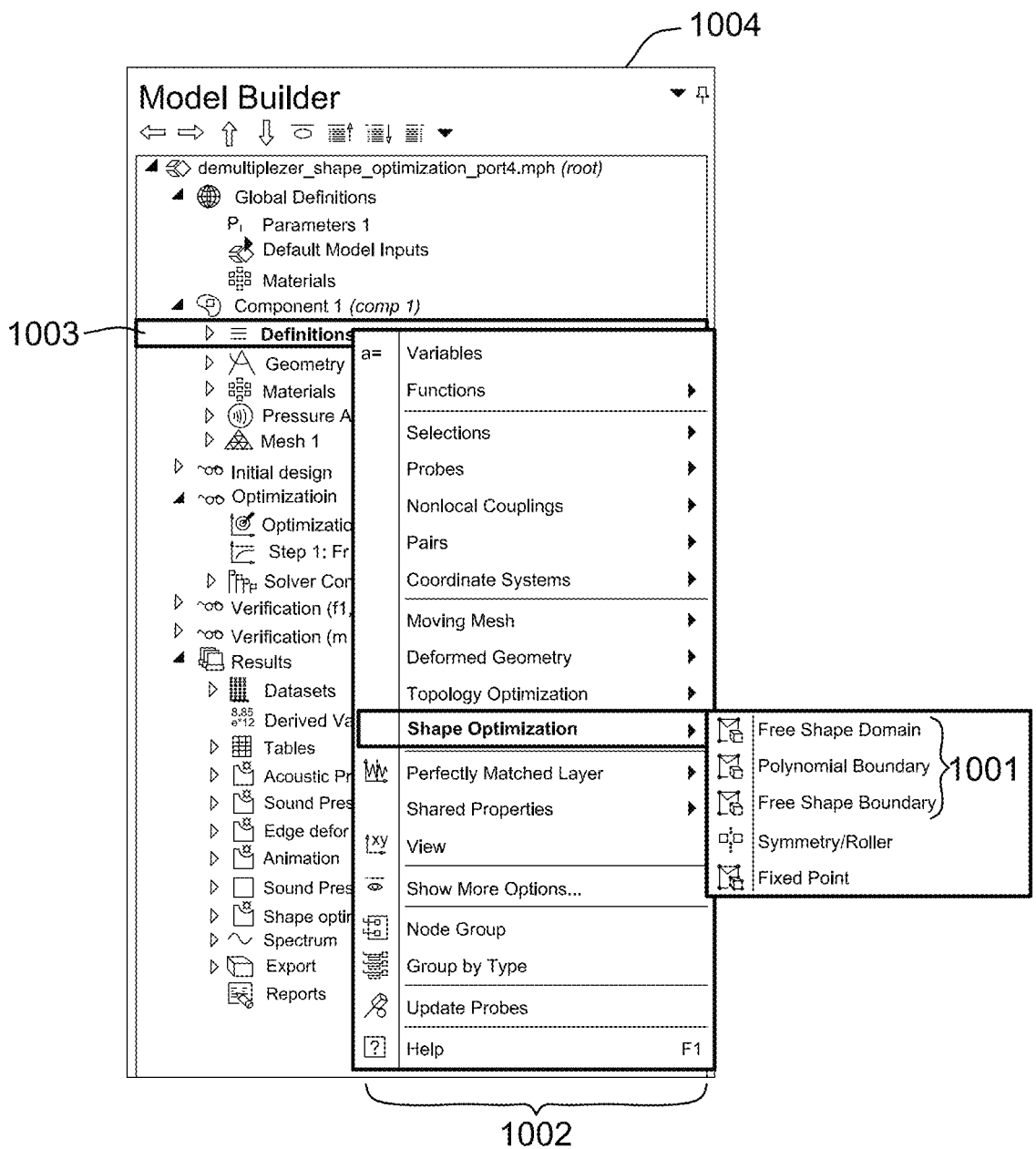
FIG. 10 depicts exemplary GUI elements and methods for a user to add a shape optimization feature to a model, according to some implementations of the present technology.

Referring now to FIG. 10, exemplary GUIs are depicted for selecting a shape optimization indicia 1001 through user interaction with a user interface 1004, such as a model tree interface. The selecting interaction(s) may be performed for example by the user clicking on a user interface element with a mouse, or for example, using a touchscreen. The selectable GUI element representative of a shape optimization may be displayed in a context menu 1002 accessible through an interaction with GUI elements, for instance an icon 1003 in a ribbon or nodes in a model tree.

Figure 11A:
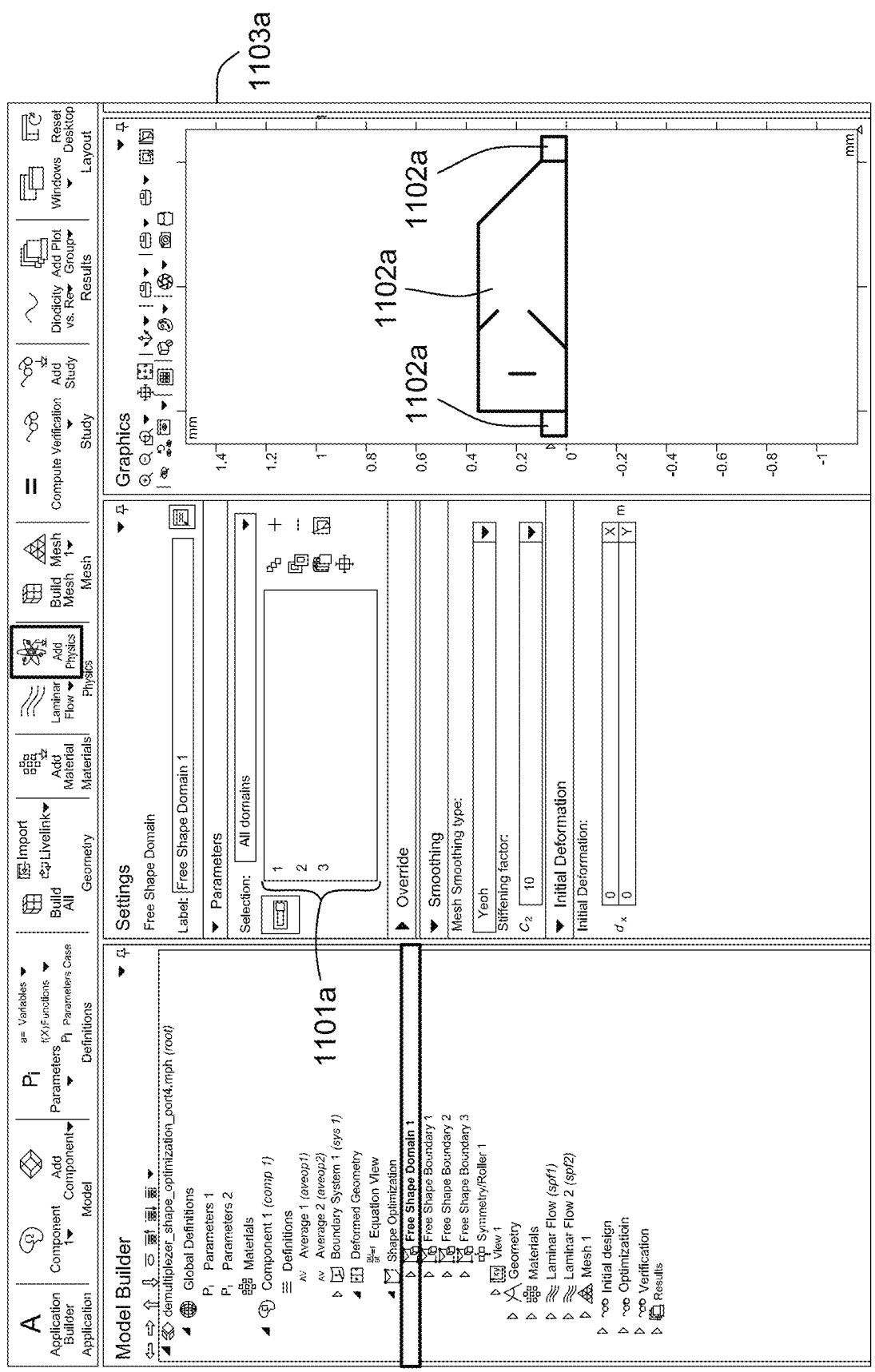
FIGS. 11A-11C depict exemplary free domain settings window and corresponding graphical display window for shape optimization of a physical object being modeled, according to some implementations of the present technology.
Figure 11C:
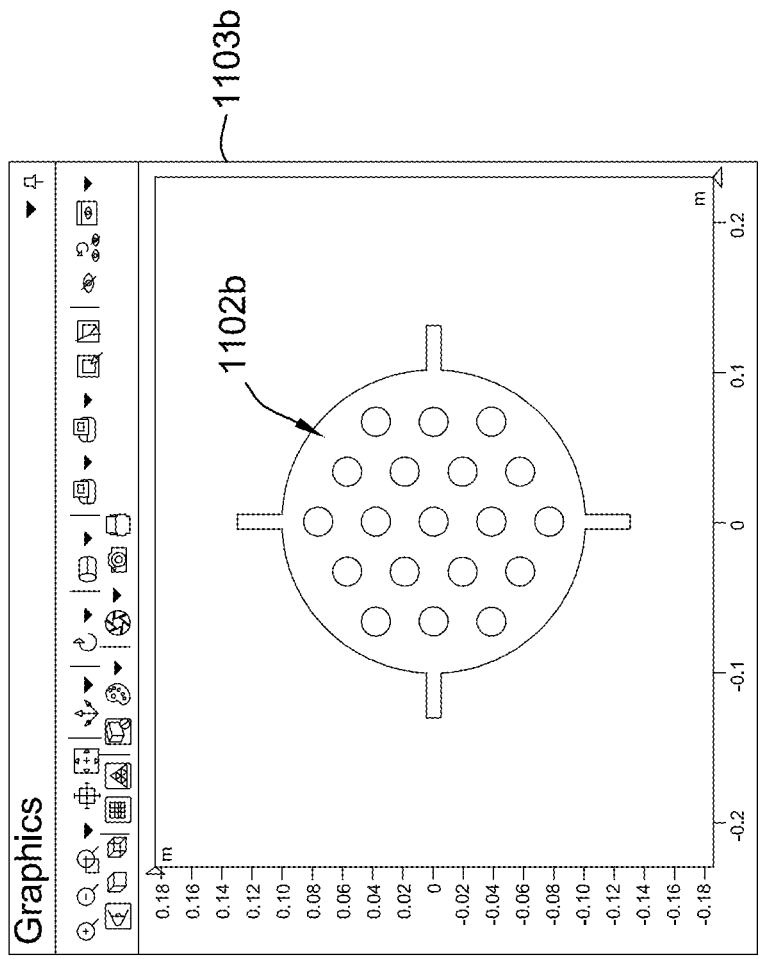
Figure 11B:
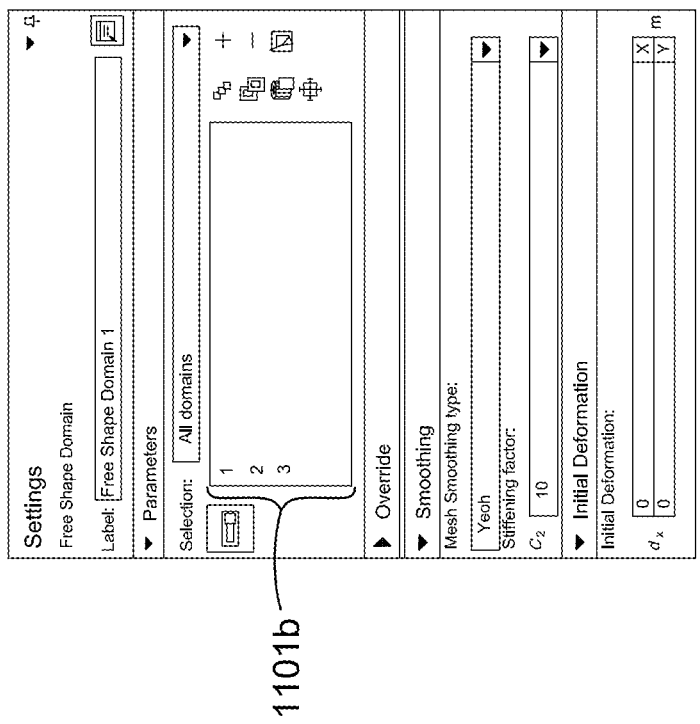

Referring now to FIGS. 11A to 11C, exemplary GUIs are depicted for a shape optimization interface for defining settings of the portions of a geometry to be shape optimized, along with selecting the method of optimization to be performed on the defined portions. FIGS. 11A and 11C depict two exemplary geometries in graphics windows 1103a, 1103b. In some implementations, a user may initially identify or select that all domains in contact with boundaries that should be shape optimized are to be free shape domains. For example, a domain may be selected by a user selecting or identifying a number representative of the said domain from a list, such as by clicking on, or in a specific vicinity of the number in a list-box 1101a, 1101b. In another example, the domain can be selected by the user selecting or identifying the domain in a graphical representation of the geometry 1102a, 1102b. In both non-limiting examples of the list-box 1101a, 1101b and the graphical representation 1102a, 1102b, "Domain" has been selected in an associated drop-down menu to ensure only the selection of domains, rather than, for example, incorrectly selecting boundaries. In the exemplary implementations depicted in FIGS. 11A to 11C, the defining of domains as a free shape domain allows ensures a smooth deformation of the interior elements, while accommodating the boundary deformation. Without it, the maximum displacement would be limited by the element size Including a free shape domain may therefore be desirable to ensure sufficient deformation of boundaries in many models adjacent to domains, but may be unneeded, for example, when using shape optimization on a shell. It is contemplated that in some modeling situations it is desirable that certain parts of the optimized geometry representation are left unchanged by the optimization. These may be parts that are integral to the overall functionality of the physical object being modeled, such as in the case of mounting holes for a bracket.

Figure 12:
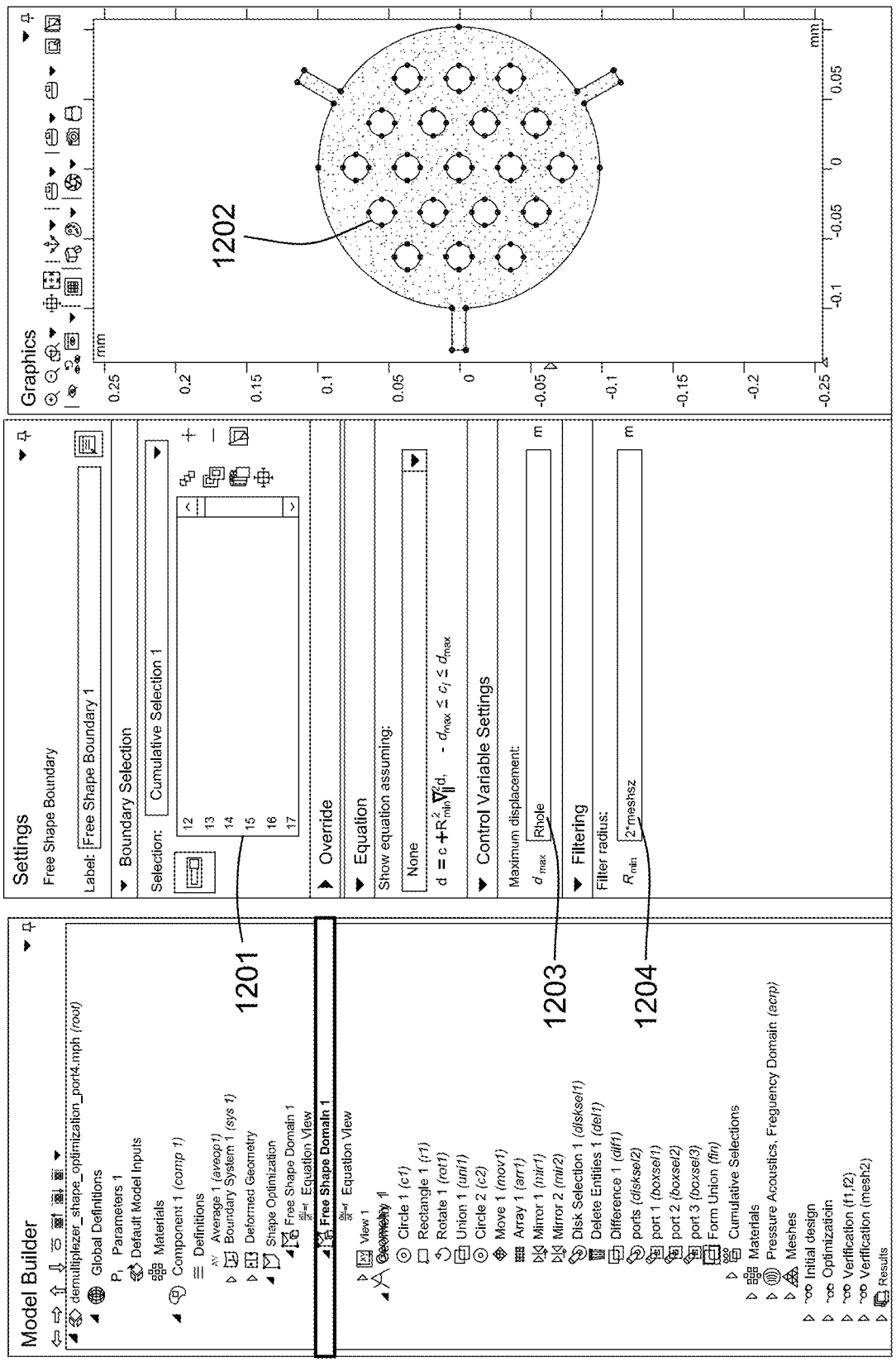
FIG. 12 depicts a free shape boundary settings window and corresponding graphical display window for shape optimization of a physical object being modeled using a filter setting, according to some implementations of the present technology.

Referring now to FIG. 12, an exemplary GUI is depicted for defining one or more free shape boundaries and associated settings for shape optimization. For example, a user may select or otherwise identify a free shape boundary using a GUI element, such as GUI element 1001 in FIG. 10. A settings window may then be displayed in response to the free shape boundary selection or identification, and the user may select or otherwise identify boundaries that should be free shape boundaries by selecting numbers representative of the boundaries from a list, for example by clicking on, or in a specific vicinity of a number in a list-box 1201. In some implementations, the user can select or otherwise identify a boundary in a graphical representation of the geometry 1202. The user interface may also display an input field 1203 where a user may input a maximum value for the control variable 1203, and a value related to the filter length 1204.

As previously depicted in FIG. 3D, in some implementations a user may define one or more polynomial boundaries (e.g., Bernstein Polynomials) and associated settings for shape optimization. The user may select polynomial boundary using a GUI element (e.g., element 1001 in FIG. 10). Then, similar to FIG. 12, a settings window may be displayed in response to the boundary selection. The user may then select boundaries that should be polynomial boundaries by selecting numbers representative of the boundaries from a list, as described above for a list-box 304 (FIG. 3D), 1201, or in a graphical representation of the geometry 305 (FIG. 3D), 1202. The user interface may also display an input field where a user may input a maximum value for the control variable 303 (FIG. 3D), 1203, and the order of the polynomial type 302 (FIG. 3D) in the situation of a Bernstein Polynomial. It is contemplated that in some implementations only free shape boundaries may be used or only polynomial boundaries may be used. It is contemplated that the optimization may depend on multiple user-defined optimization objective expressions. In such cases, the overall optimization may depend on, for example, the sum of the defined objective functions.

In some implementations, a user may input initial values for control variables. It is also contemplated that initial values of control variables may be define using default values.

Figure 13:
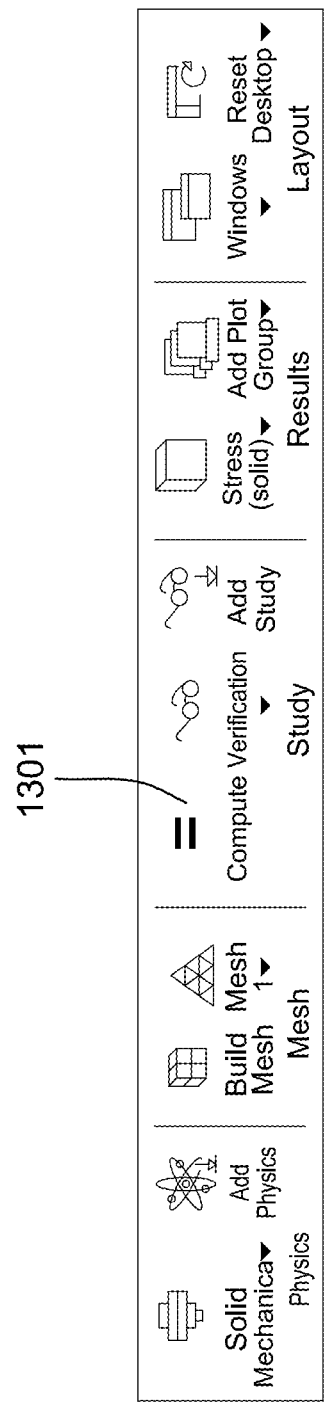
FIG. 13 depicts an exemplary GUI element located in a GUI ribbon for initiating optimization and/or simulation of a model, according to come implementations of the present technology.

Referring now to FIG. 13, an optimization simulation may be initiated in accordance with the user definitions by a user interacting with a GUI element 1301 operative to initiate the simulation. The simulation may initiate the optimization process using the initial defined value of the control variable (or the initial value of the control material volume factor).

It is contemplated by the present technology that displacements may be determined by the simulation or other computing system based on optimization expressions, either directly presented by the present disclosure or other optimization expressions that may be applicable, where the optimization is dependent initially on initial value(s) of the control variables. It is contemplated that mesh nodes belonging to free shape boundaries and/or to polynomial boundaries may be moved according to the determined displacements. Mesh nodes belonging to internal domains and mesh nodes otherwise belonging to the free shape domain may be displaced in accordance with a free shape domain smoothing function, creating a shape modified mesh.

The optimization objective expression may be determined based on the shape modified mesh. The gradient(s) of the optimization objective expression may also be determined. It is contemplated that various physical properties associated with the physical object being modeled may be determined at each iteration. Various plots and graphs corresponding to or related to the properties may optionally be updated and displayed in a GUI or in an associated display. Then, new control variables may be constructed by the optimization solver that may be at least partially based on the gradients of the optimization objective expression. Next, similar to how displacement were determined for the initial values, displacement determinations are repeated, except based on the new control variables. Similarly, mesh nodes may be moved according to the determined new displacements and optimization objective expressions updated, along with updates of gradients of the objective optimization objective expression being determined. The optimization process is repeated using the newly determined control variables either until the defined maximum number of iterations is reached or until the optimization solver determines that an optimized solution has been achieved. The solution of the topology or shape optimization may be saved to a data structure for further modeling assessment.

Figure 14A:
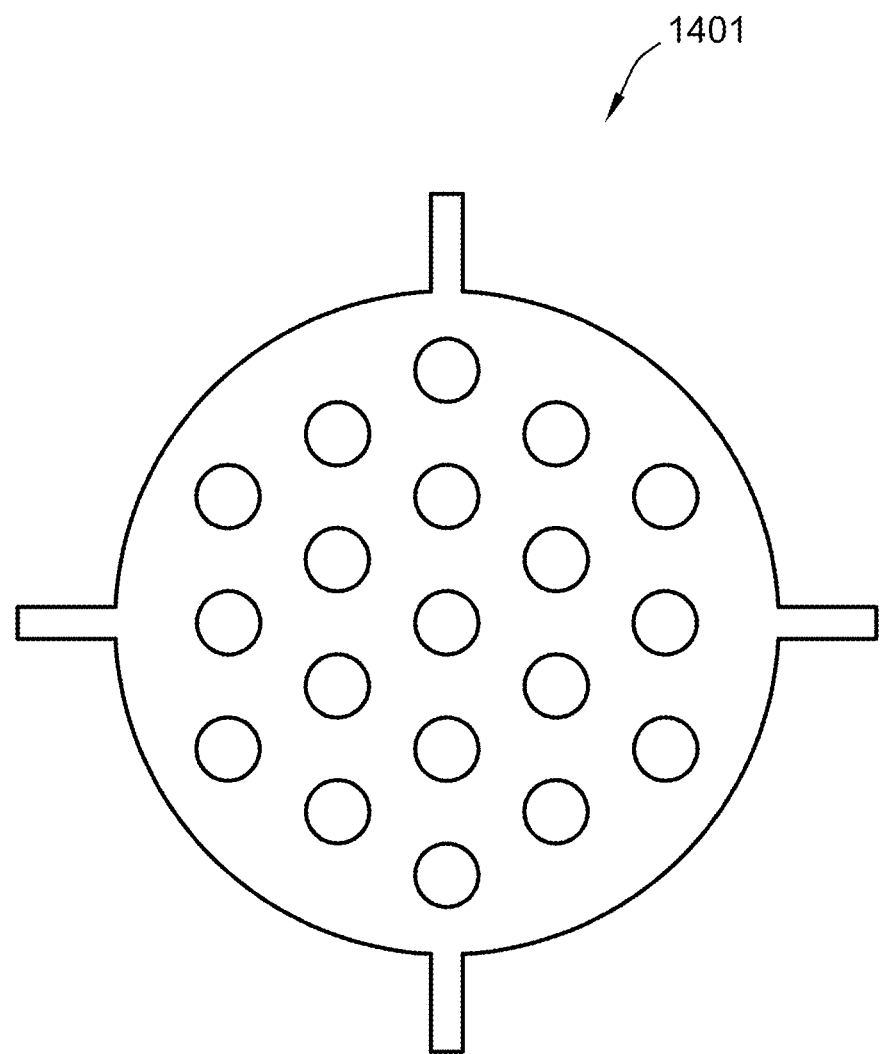
FIGS. 14A-14D depict a non-optimized physical object (FIG. 14A) being modeled in the form of an acoustics demultiplexer which is then shape optimized (FIGS. 14B-14D) to enhance output of three different audio frequencies, according to some implementations of the present technology.
Figures 14B, 14C, 14D:
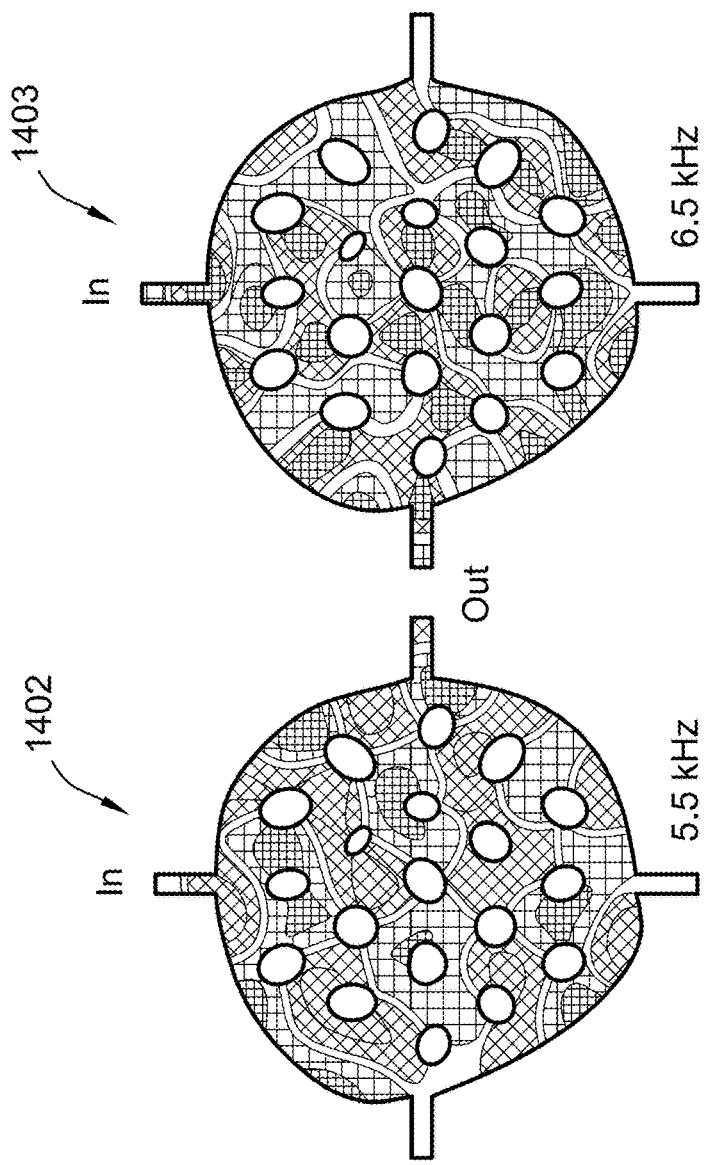

A graphical representation of a shape optimized geometry may be displayed to the user. For example, referring to FIG. 14A, an exemplary initial geometry 1401 is depicted for an acoustics demultiplexer. FIGS. 14B to 14D depict a shape optimized geometry 1402, 1403, 1404 of the acoustics demultiplexer that is based on the initial geometry 1401. The initial geometry was shape optimized to maximize an output of sound of 5.5 kHz (FIG. 14B), 6.5 kHz (FIG. 14C), and 7.5 kHz (FIG. 14D) at the different ports of the modeled acoustic demultiplexer.

In some implementations, plots, graphs, and values corresponding to or related to physical properties determined based on the shape or topology optimization of the physical object being modeled may be displayed in a GUI or in an associated display.

For topology optimization, the topology of a geometrical representation of a physical object being model is optimized with respect to one or more objectives by changing the topology of the geometrical representation. For example, a geometry that is originally a block, may be modified by topology optimization to include one or more holes, or a solid cylinder may be topology optimized to become a hollow cylinder like a tube. One of the benefits of performing such optimizations is to reduce the weight of a physical object while retaining sufficient object strength.

In some implementations, the density method is used when applying topology optimization to finite element models. The density method is advantageous because the topology is not changed by changing the mesh representation of the physical object. Changing the mesh representation would be a computationally intensive task that could further require correction of some mesh elements. Instead, material properties associated with the mesh elements representing the physical object are changed in the density method, while leaving the mesh geometrically unchanged. For example, assume the goal of a topology optimization is to reduce the weight of a steel cylinder while maintaining a certain degree of stiffness. A mesh representing the steel cylinder may be created and the optimization procedure may change the density and Young's modulus of the interior of the cylinder, resulting in a mesh where the mesh elements further from the exterior boundary of the cylinder have a very low density and very low Young's modulus, while the elements closer to the exterior of the boundary maintain a high density and Young's modulus. At a later stage in this method, low density/Young's modulus volumes/areas are redefined as holes in the original geometry, generating a new topology.

The density method involves the definition of a control variable field, $\theta_c$, which is bounded between 0 and 1. In solid mechanics, $\theta_c=1$ corresponds to the material from which the structure is to be built, while $\theta_c$ close to 0 corresponds to a very soft material. By default, the void Young's modulus is 0.1% of the solid Young's modulus. In fluid mechanics, convention dictates that $\theta_c=1$ corresponds to a dense fluid, while $\theta_c=0$ is a permeable material, though only slightly permeable, with an inverse permeability factor, $\alpha$; i.e., a damping term is added to the Navier-Stokes equation:

$$\rho\frac{Dv}{Di} = -\nabla p + \eta\nabla^2 v - \alpha(\theta_c)v \quad \text{Equation 1}$$

The damping term is 0 in fluid domains, while a large value is used in solid domains. These different values give a good approximation of a no-slip boundary condition on the interface between the domains.

The density model feature which may be added to a model of a physical object that a user wishes to topology optimize supports regularization via a Helmholtz equation. This introduces a minimum length scale using the filter radius, $R_{min}$.

The mesh edge length is taken as the default filter radius and it works well, but it should be defined as a fixed value in order to produce mesh-independent results.

$$\theta_f = R_{min}^2 \nabla^2 \theta_f + \theta_c \quad \text{Equation 2}$$

Here, $\theta_c$ is the raw control variable also referred to as the control material volume factor, which is modified in the optimization iteration process, and $\theta_f$ is the filtered variable also called filtered material volume factor. The mesh edge size is the default value for the filter radius. While this works well in terms of regularizing the optimization problem, it's important to set a fixed length (larger than the mesh edge size) to get mesh-independent results.

An analogy to the density method would be to consider a gray scale picture. If $\theta_f$ values ≤1 are interpreted pictorially as a grayscale (being lighter the closer the value is to 0), while $\theta_f=1$ is interpreted as black, then The Helmholtz filter gives rise to significant grayscale, which does not have a clear physical interpretation with respect to material properties. The grayscale can be reduced by applying a smooth step function in what is referred to as projection in topology optimization. The density model topology application supports projection based on the hyperbolic tangent function, and the amount of projection can be controlled with the projection steepness, $\beta$.

$$\theta = \frac{\tanh(\beta(\theta_f - \theta_\beta)) + \tanh(\beta\theta_\beta)}{\tanh(\beta(1 - \theta_\beta)) + \tanh(\beta\theta_\beta)} \quad \text{Equation 3}$$

$$\theta_p = \theta_p(1 - \theta_p)\theta^{psimp} \quad \text{Equation 4}$$

where, $\theta_\beta$ is the projection point. $\theta$ is the projected material volume factor and $\theta_p$ is the penalized material volume factor.

Projection makes it possible to avoid grayscale, but grayscale can still appear if the optimization problem favors it. If the same interpolation function is used for the mass and the stiffness, grayscale is optimal in volume-constrained minimum compliance problems. It is thus common to use interpolation functions that cause intermediate values to be associated with little stiffness relative to their cost (compared to the fully solid value). This may be considered as a penalization of intermediate values for the material volume factor, and the density model setting interface (see FIGS. 16A and 17A) supports two such interpolation schemes for solid mechanics: solid isotropic material with penalization (SIMP) and rational approximation of material properties method (RAMP) interpolation. Darcy interpolation is provided for fluid mechanics. The interpolated variable is called the penalized material volume factor, $\theta_p$, and is used for interpolating the material parameters, e.g., for SIMP interpolation, the psimp exponent can be increased to reduce the stiffness of intermediate values, so that grayscale becomes less favorable.

$$\theta_p = \theta_{min} + (1 - \theta_{min})\theta^{psimp} \quad \begin{array}{l}\text{Penalized material volume} \\ \text{factor using } SIMP\end{array} \quad \text{Equation 5}$$

$$\theta_p = \theta_{min} + \frac{(1 - \theta_{min})}{1 - q(1 - \theta)} \quad \begin{array}{l}\text{Penalized material volume} \\ \text{factor using } RAMP\end{array} \quad \text{Equation 6}$$

$$\theta_p = \frac{q_{Darcy}(1 - \theta)}{q_{Darcy} + \theta} \quad \begin{array}{l}\text{Penalized material volume} \\ \text{factor using } Darcy\end{array} \quad \text{Equation 7}$$

$$E_p = E\theta_p \quad \text{Equation 8}$$

Here, E is the Young's modulus of the solid material and $E_p$ is the penalized Young's modulus to be used throughout all optimized domains.

The penalized Young's modulus can be defined as a domain variable, or alternatively it can be defined directly in the materials as a material property. A non-limiting example of being defined direct on the materials as a material property is depicted in FIG. 4, for Young's modules value 401 where the original expression for the Young's modulus, editable in a material settings window edit field is modified by a user so that it is multiplied by dtop1.theta_p control variable, such that the Young's modulus in a mesh element is dependent on the penalized material volume factor values(s) associated with that element. In some implementations, a modeling and simulation system can be configured such that such an edit is performed, without any further user input, in response to a user adding topology optimization to the model, and dependent on the filtering that is enabled for the topology optimization.

It is contemplated that filtering and projection operations discussed above may be disabled. When the filtering is disabled, the filtered variable becomes undefined and the projection instead uses the control material volume factor directly. If the projection is disabled, the material volume factor still exists, but it becomes identical to the projection input (which if filtering is enabled is equal to the filtered material volume factor).

In some implementations of topology optimization, validation simulation is performed using the topology optimized geometrical representation, but using material properties that correspond to the actual materials that would be used for the physical object being modeled. An advantageous feature of the present technology is that the generated topology optimized geometrical representation is easily accessible within the physics simulation system, and that user definitions that were made in the topology optimization model are maintained in the topology optimized geometrical representation, so that the user does not have to construct the same definitions several times. For example, FIG. 3D depicts a setting window with a bracket and a list of named geometry selections (parts of the geometry) with corresponding settings. The exemplary depicted named selections and corresponding settings are time consuming to setup so it is very advantageous for a user to be able to maintain the named selections in a topology optimized geometry, rather than to have to re-create them from a topology optimized geometry. Named selections are often used to apply a boundary condition or material property to a specific set of boundaries/domains, so maintaining named selections is advantageous for reducing modeling time and maintaining consistency in modeling, including improving accuracy, for example when reassigning boundaries and domains to named selections.

Figure 15A:
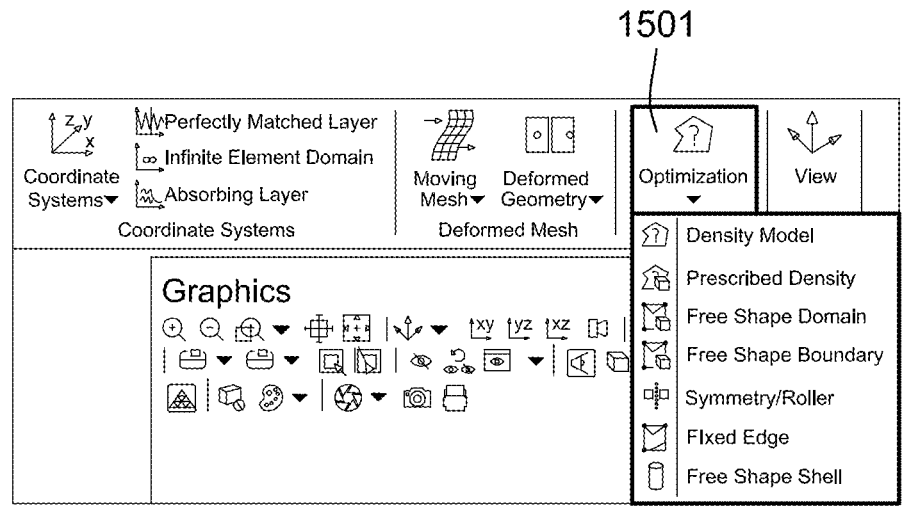
FIGS. 15A-15C depict exemplary GUI elements and methods for a user to add a topology optimization feature to a model, according to some implementations of the present technology.
Figure 15B:
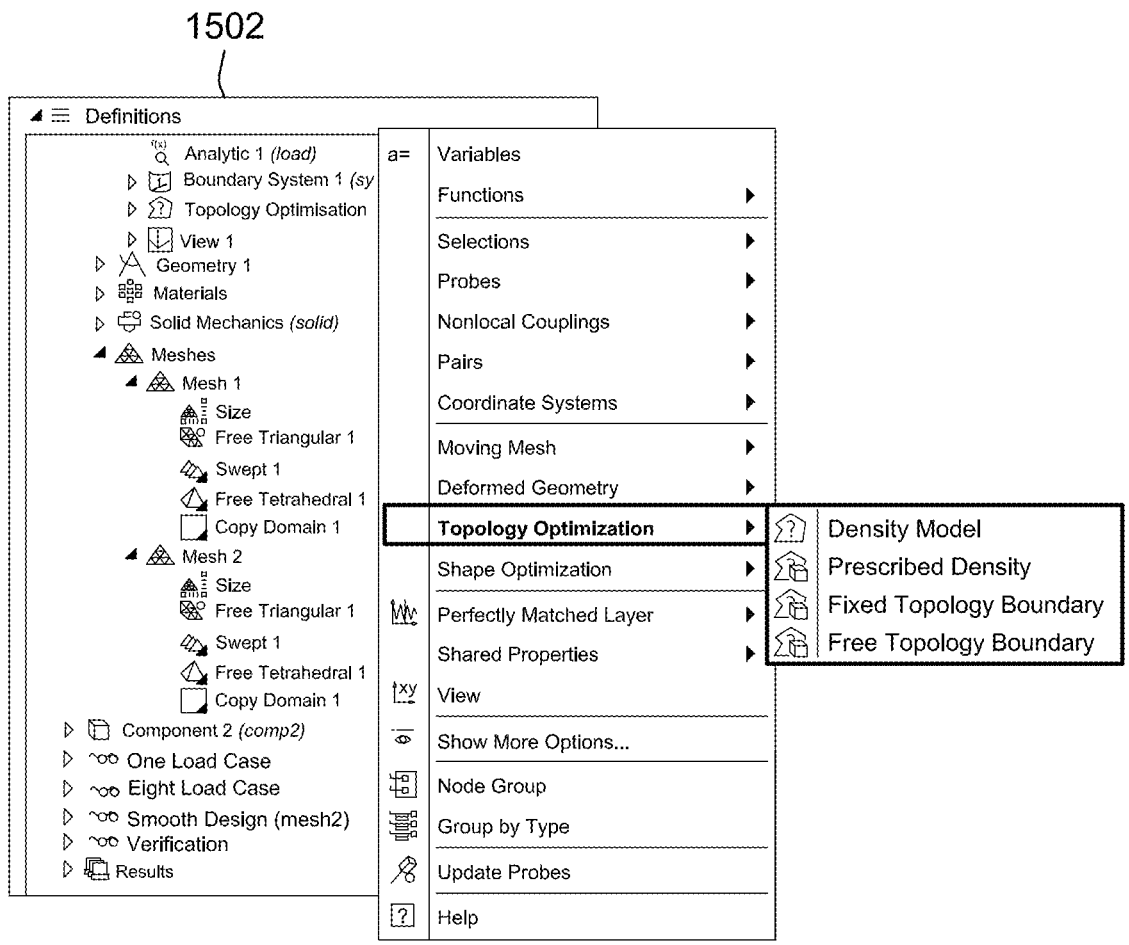
Figure 15C:
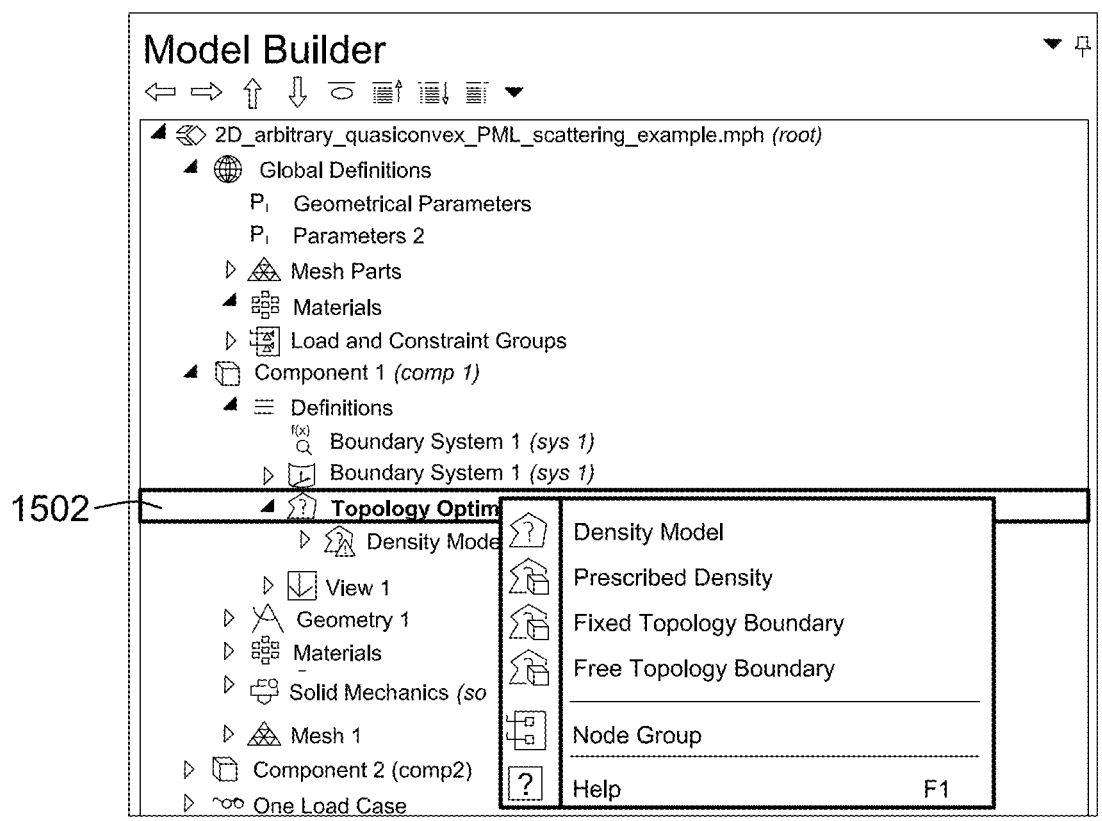

Referring now to FIGS. 15A to 15C, an exemplary topology optimization interface is depicted. Topology optimization operations are selected in a user interface by the user interacting with a user interface element representative of a topology optimization. For example, the user interface element representative of a topology optimization may be displayed in a selection menu accessible through an interaction with GUI elements, such as a ribbon icon 1501 or model tree nodes 1502.

Figure 16A:
FIGS. 16A-16C depict an exemplary settings window for topology optimization, and GUI elements for selecting what parts to topology optimize for the physical object being modeled, according to some implementations of the present technology.
Figure 16B:
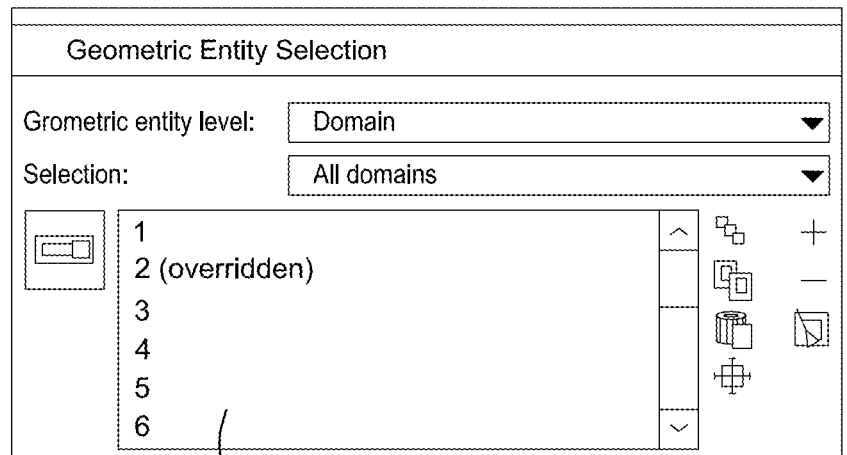
Figure 16C:
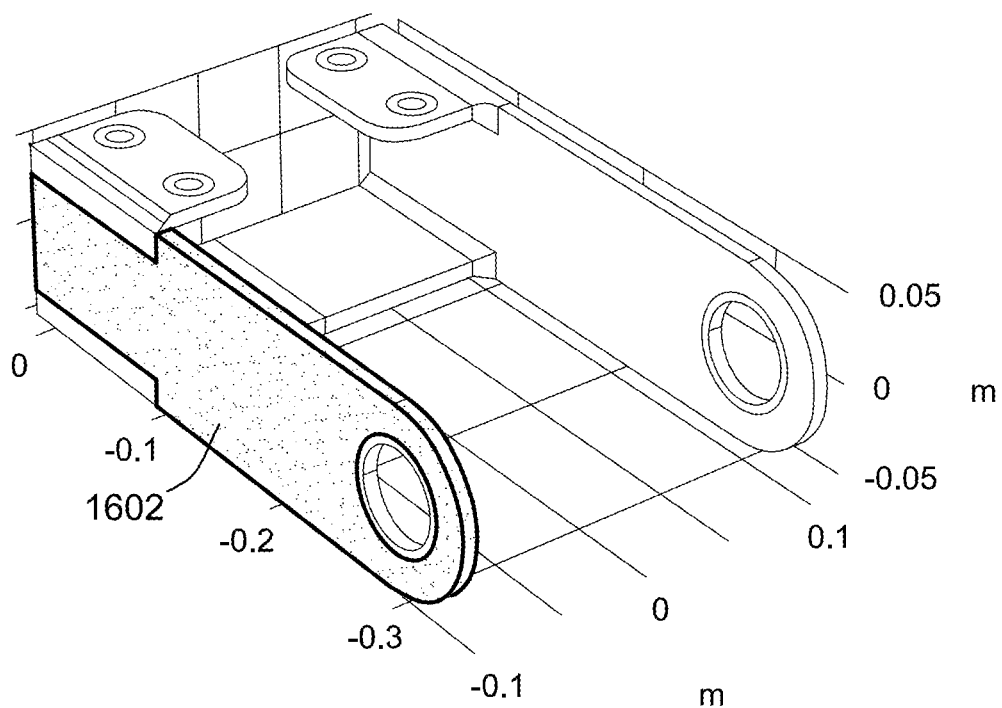

Referring now to FIGS. 16A to 16C, exemplary setting windows are depicted for defining what portions of the geometry should be topology optimized. Two examples of selections by a user interacting with a GUI are depicted. In a first method depicted in FIGS. 16A and 16B, a domain is selected by selecting a number representative of the domain from a list, for example by clicking on, or in a specific vicinity of the number in a list-box 1601. In a second method depicted in FIG. 16C, the domain is selected by the user selecting the domain in a graphical representation of the geometry 1602. In both the case with the list-box and with the graphical representation, "Domain" has been selected in an associated drop-down menu to allow only the selection of domains (as opposed to for instance boundaries). "Domain" may be a default setting for topology optimization. In some implementations, it may be desirable for certain parts of the optimized geometry representation to be left unchanged by the optimization. These may be parts that are integral to the overall functionality of the physical object being modeled. It is contemplated that user selections and inputs that are described may be applied in different order than described herein.

Figure 17A:
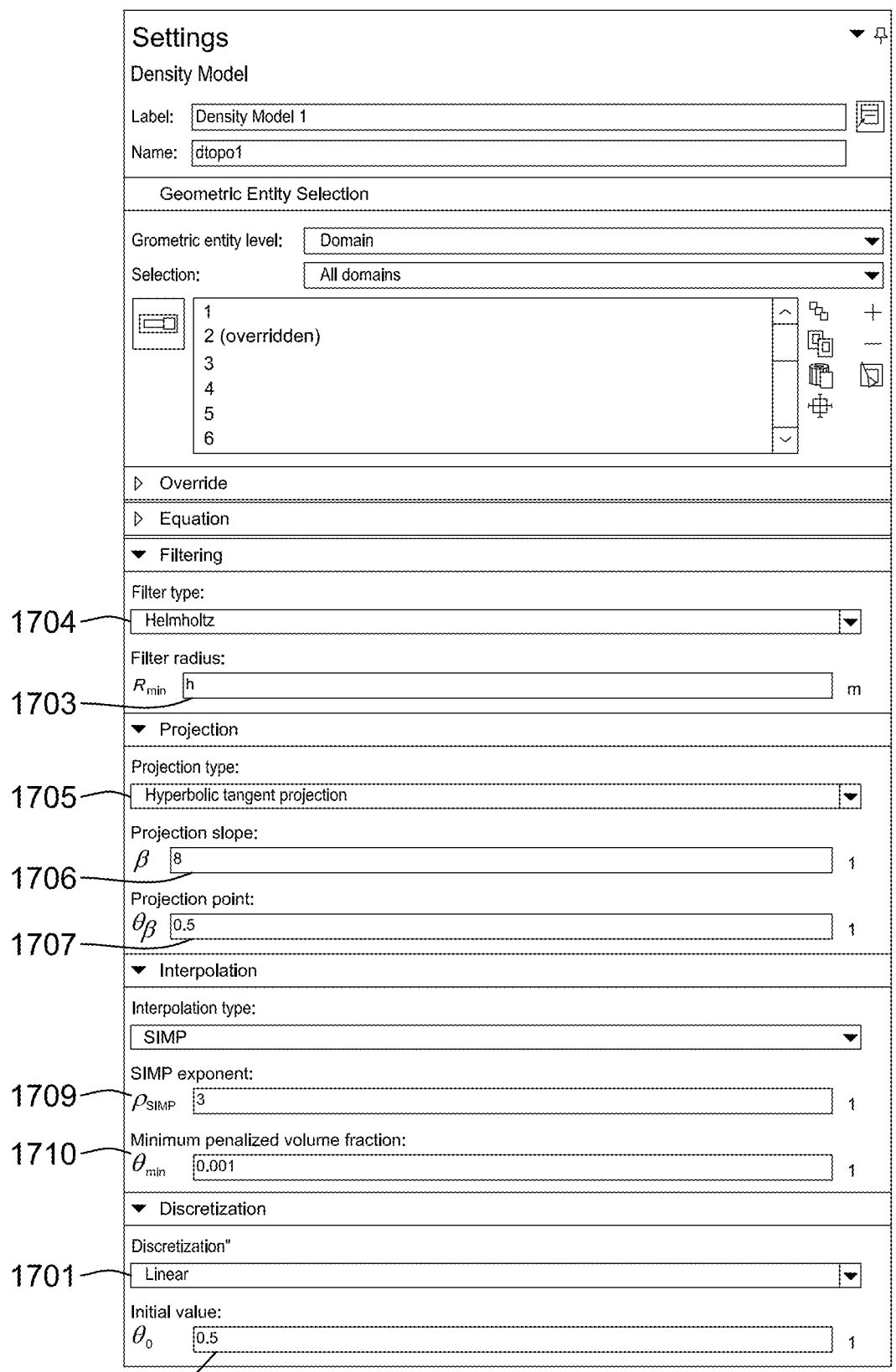
FIGS. 17A-17B depict an exemplary settings windows for topology optimization including a selection menu for defining interpolation type, according to some implementations of the present technology.
Figure 17B:
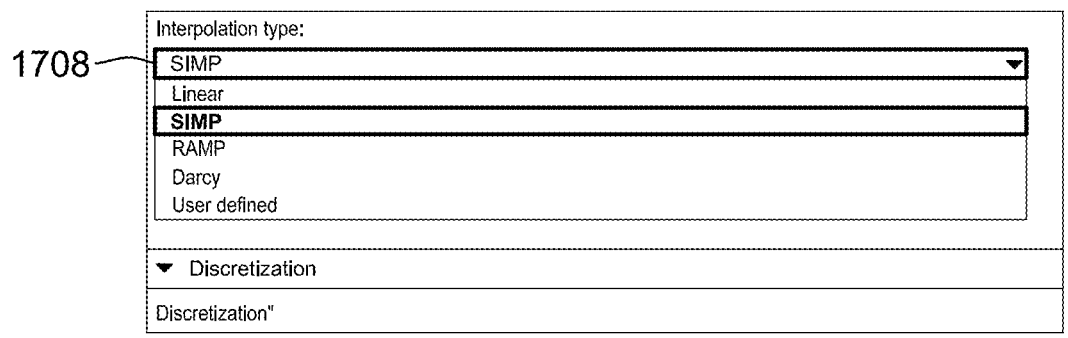

Referring now to FIGS. 17A and 17B, an exemplary density model settings window for topology optimization is depicted that includes defining design variable settings. A design variable may either be associated with mesh element nodes for allowing a continuous representation using a linear 1701, or possibly quadratic, cubic etc. interpolation, or the design variables may be associated directly with individual mesh elements resulting in a discontinuous representation. A user may select one of the options using a GUI and selection tool. FIG. 17A depicts an example of a method of selection using a drop down menu. Other methods such as representative check boxes and list boxes would be non-limiting examples of other viable methods of selection in a GUI. The user interface may also display an input field where a user may input an initial value for the design variable 1702.

The setting window in FIG. 17A further includes GUI elements for defining filtering, projection, and penalized material volume factor determination method. A user may select if filtering should be applied to the topology optimization and what the filter radius should be via edit field 1703. Furthermore, via drop down menu 1704, the user can select the kind of filter that should be applied to the topology optimization, in particular the user may select a Helmholtz filter, or the user may select that no filtering should be applied. A user may select if a projection should be applied to the topology optimization by selecting the type of projection, or alternatively, no projection, from a drop down menu 1705. For the scenario where a type of projection is selected, the user may then define parameters for the projection, such as projection slope 1706 and projection point 1707 using GUI input fields. A user may further select a method for determining the penalized material volume factor by selecting a method from a drop down menu 1708 including the available choices. It is contemplated that default selections may be dependent on the one or more physics interfaces, such that Darcy interpolation is the default selection if the user previously selected a fluid mechanics interface, and SIMP (or RAMP) are default choices if the user previously selected a solid mechanics interface.

Each selection of a method for determining the penalized material volume factor may have associated input fields that are displayed in the GUI in response to the method selection. For example, the selection of SIMP displays an input field for the SIMP exponent 1709 and the Minimum penalized volume fraction, $\theta_{min}$ 1710. The selection of RAMP displays an input field for the RAMP parameter $q_{RAMP}$. The selection of Darcy displays an input field for Darcy penalization $q_{Darcy}$. In some implementations, a linear interpolation can be selected. For a user defined interpolation, an input field may be displayed in response to the user selecting a "user defined interpolation", where the user may define an expression.

It may be advantageous for these selections to be grouped in close vicinity to other selections effecting the topology optimization. In FIG. 17A to 17B this is done by grouping all such selections in one settings window.

In the next step for the topology optimization, expressions for determining material volume factors are constructed based on the user inputs. Material volume factors that may be constructed are include (i) control material volume factor, with a domain control variable field (dtopo#.theta_c); (ii) filtered material volume factor, with a domain dependent variable (dtopo#.theta_f); (iii) projected material volume factor, with a domain variable (dtopo#.theta); (iv) penalized material volume factor, with a domain variable (dtopo#.theta_p); and (v) average material volume factor over the topology optimized domain(s), with a global variable (dtopo#.theta_avg). The relationship between these material volume factors are discussed elsewhere in this application. Note that # refers to an integer based on the number of topology optimization features added to a model. In the described examples, # is 1, giving dtopo1.thetap etc.

Next, an expression (or a set of expressions) is defined, modifying one or more material properties using a material volume factor, thus creating an expression defining one or more modified material properties. In particular, the penalized material volume factor or the projected material volume factor may be used to define a modified material property. For example, the Young modulus value for one or more of the materials assigned to at least parts of the geometry may be multiplied by the penalized material volume factor, where the penalization may use the SIMP method. In some cases, the modification of a material property may have been performed in a prior step.

In the next step of the topology optimization, reference is made to FIGS. 7 and 8 regarding selecting or constructing an optimization objective expression. The optimization objective expression may at least partially depend on one or more previously selected physics interfaces. Furthermore, the optimization objective expression may depend on a modified material property, described elsewhere in this sequence of steps. In the example of FIGS. 7 and 8, the optimization objective expression is related to the minimization of the total elastic strain energy, which is computed during simulation, together with a constraint that the average θ value does not surpass a certain value (e.g., in this non-limiting example, 0.6, see 701 and the constrain expression in FIG. 8B).

Next, the type of study for the simulation may be defined where the user may select an optimization type of study and define the optimization settings such as solver type, tolerances, the type of optimization (for instance should the objective function be minimized or maximized), and the maximum number of iterations. It is contemplated that gradient based solvers are desirable for density method topology optimization.

Figure 18:
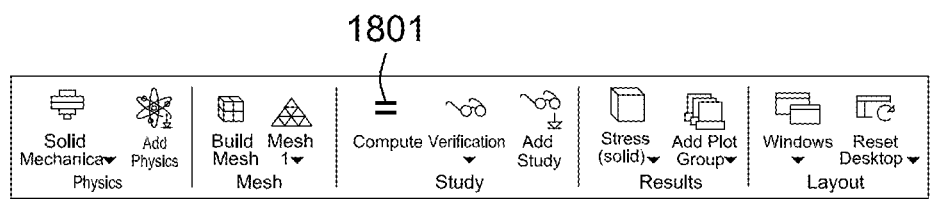
FIG. 18 depicts an exemplary GUI element for initiating a topology optimization, according to some implementations of the present technology.

Referring now to FIG. 18, the topology optimization simulation may be initiated in accordance with the user definitions by a user interacting with a GUI element related to functionality to initiate the simulation. For example, the user may select a GUI button 1801 saying "compute". The simulation may initiate using the initial value of the design variable (the initial value of the control material volume factor), defined in the density model setting window at input field 1702, though the use of a default setting is also contemplated.

Next, filtered material volume factors, projected material volume factors, penalized material volume factors, and average material volume factor may be computed without further user input based on the expressions presented elsewhere herein and dependent initially on the initial value(s) of the control material volume fraction and dependent on contributions from an optional prescribed density on non-optimized domains. A prescribed density allows the user to have a smooth (continuous) transition from topology optimized domains using Helmholtz filtering where the density may vary, to areas having a fixed density, typically amounting to θ=1. This prescribed density is implemented by overwriting any filtered variables on the domains that are set to have a prescribed density, and then extending filtering from the prescribed density domain to any surrounding topology optimized domains.

Next, the optimization objective expression, which is dependent on computed filtered material volume factor values, projected material volume factor values, penalized material volume factor values, or average material volume factor, may be determined. The gradient(s) of the optimization objective expression may also be determined. Various physical properties associated with the physical object being modeled may be determined at each iteration and various plots and graphs corresponding to or related to the properties may be displayed in the GUI or in an associated display.

In the next topology optimization step, new control material volume factor values may be constructed by the optimization solver that are at least partially based on the gradients of the optimization objective expression.

Next, new filtered material volume factors, projected material volume factors, penalized material volume factors, and average material volume factor may be computed without further user input based on the expressions presented elsewhere herein and dependent on the new control material volume factor values and dependent on contributions from an optional prescribed density on non-optimized domains.

Next, the steps of determining the optimization objective expression and related gradients, constructing new control volume factor values, computing of new volume factors are repeated either until the maximum number of iterations is reached or until the optimization solver determine that an optimized solution has been achieved.

The results of the topology optimization may be saved to a data structure for further assessment.

Figure 19A:
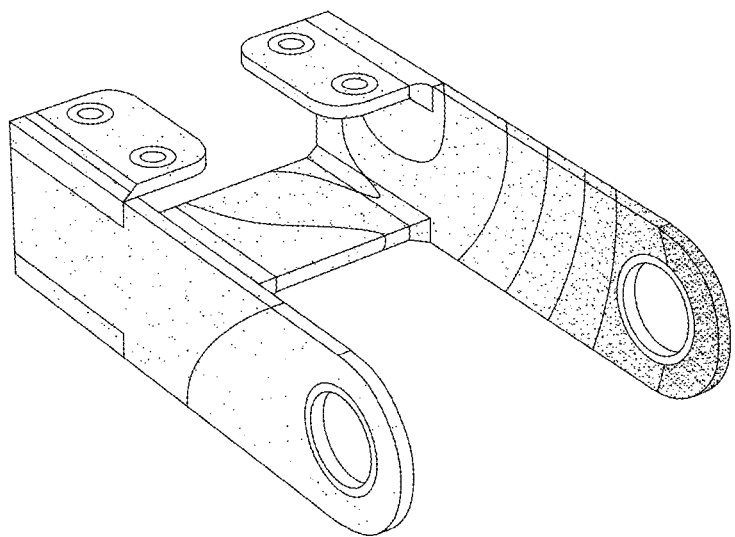
FIGS. 19A-19B depict exemplary graphical representations of a physical object being modeled in the form of a non-optimized bracket (FIG. 19A) and a topology optimized bracket (FIG. 19B) subjected to a load, according to some implementations of the present technology.
Figure 19B:
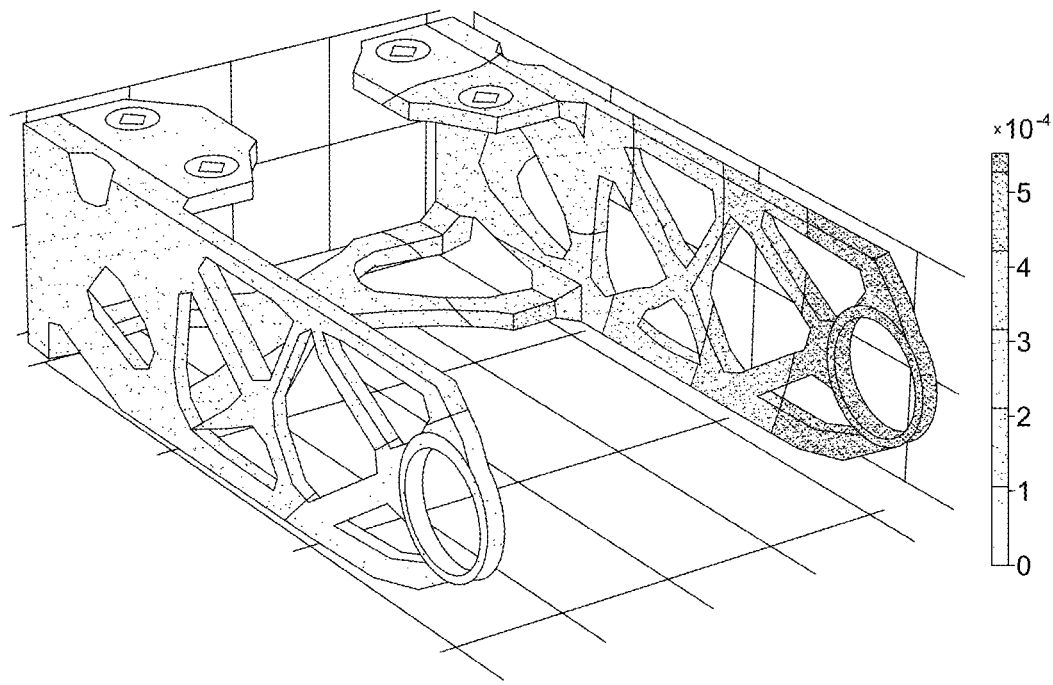

Plots, graphs, and values corresponding to or related to physical properties determined based on the physical object being modeled may optionally be displayed in the GUI or in an associated display, along with a graphical representation of the topology optimized geometry. Referring to FIG. 19, an exemplary topology optimized geometry is displayed including the initial geometry in FIG. 19A through the density model optimized geometry in FIG. 19B.

A mesh of the physical object being modeled is not expected to change as a result of having performed a topology optimization using the density method. However, as a result of modeling, the user will obtain a model consisting of a mesh associated with material volume factor values, for example, but not limited to, $\theta_c$, $\theta_f$, $\theta$, and $\theta_p$ values associated with the respective mesh nodes or on the mesh elements depending on the discretization method used. In addition, the mesh will be associated with various fields related to physical properties calculated by the simulation computing system. The combination of mesh data and associated properties, such as named selections, and calculated physical properties or quantities, and material volume factors may be referred to as mesh datasets.

$\theta$ values are representative of the material volume factor. Parts of the mesh (elements or nodes) with values of $\theta$ close to zero represent those parts of the optimized representative geometry that do not contribute meaningfully to the material properties of the optimized representative geometry with respect to the optimization goal (that is, parts that can be removed in an optimized design). Parts of the mesh with $\theta$ values close to one on the other hand represent those parts of the mesh that contribute meaningfully to the material properties of the optimized representative geometry with respect to the optimization goal so these parts should be maintained in an optimized design.

It would be desirable for a user performing optimization modeling to easily and quickly obtain a geometric representation of the topology optimized modeled object based on said $\theta$ values, that is, a geometric representation including those parts of the mesh where $\theta$ values are above a certain value. This may be achieved by using physics modeling and simulation methods including topology optimization using the density method, a computer aided engineering product, that includes a selection-filter feature that may be applied to the topology optimization results, and applying the selection-filter feature resulting in an output corresponding to a geometric representation of those parts of the mesh that correspond to mesh elements or mesh element nodes with associated $\theta$ values within a specific range of values (where parts of the range may be implicit, for instance $0.5<\theta$, correspond to $\theta$ above 0.5 and below or equal to 1).

Figure 20A:
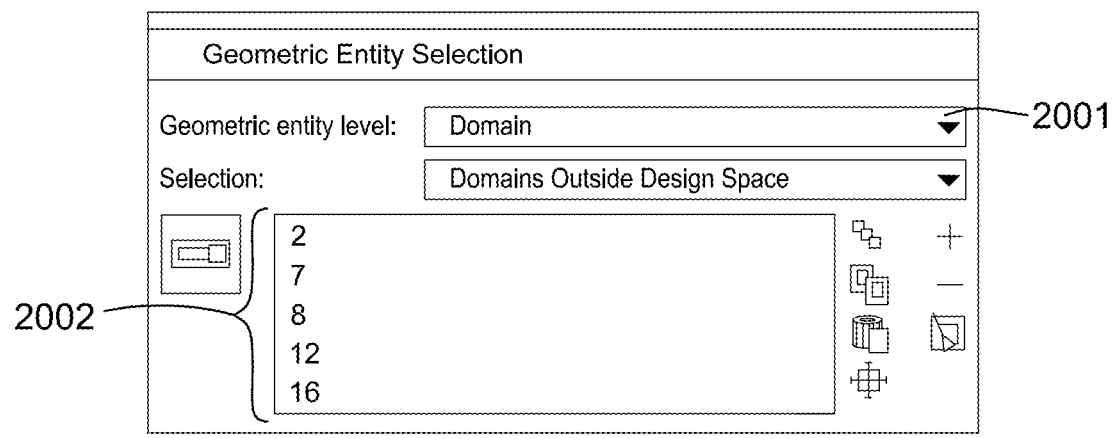
FIGS. 20A-20B depict an exemplary named selection of parts of a physical object being modeled, according to some implementations of the present technology.
Figure 20B:
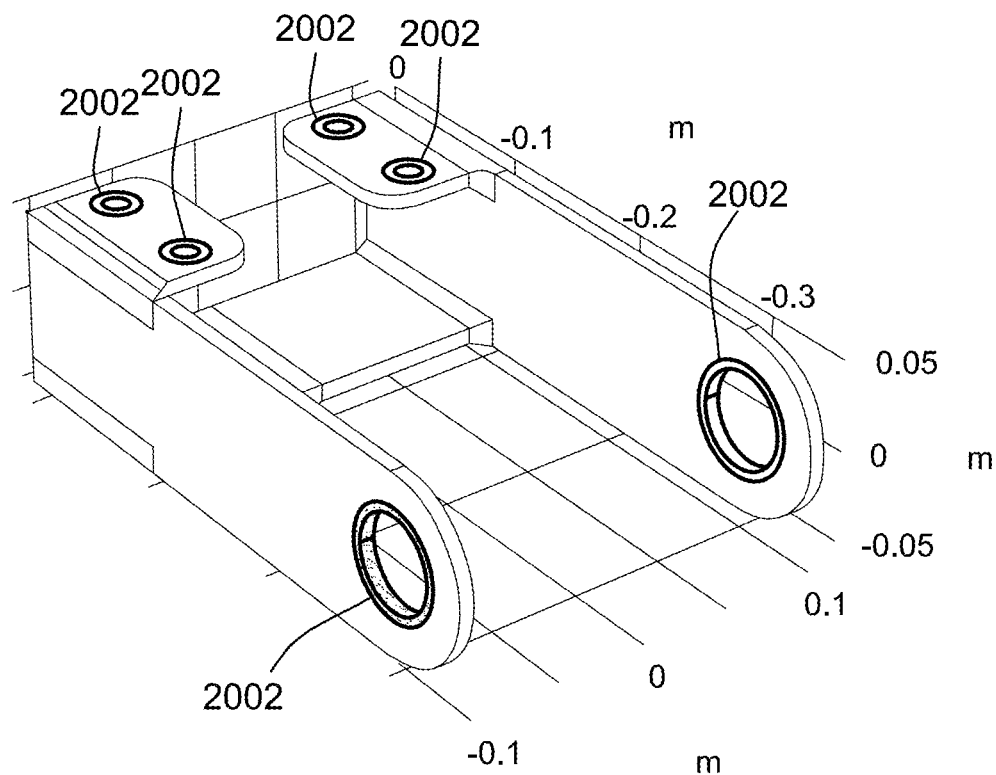
Figure 21A:
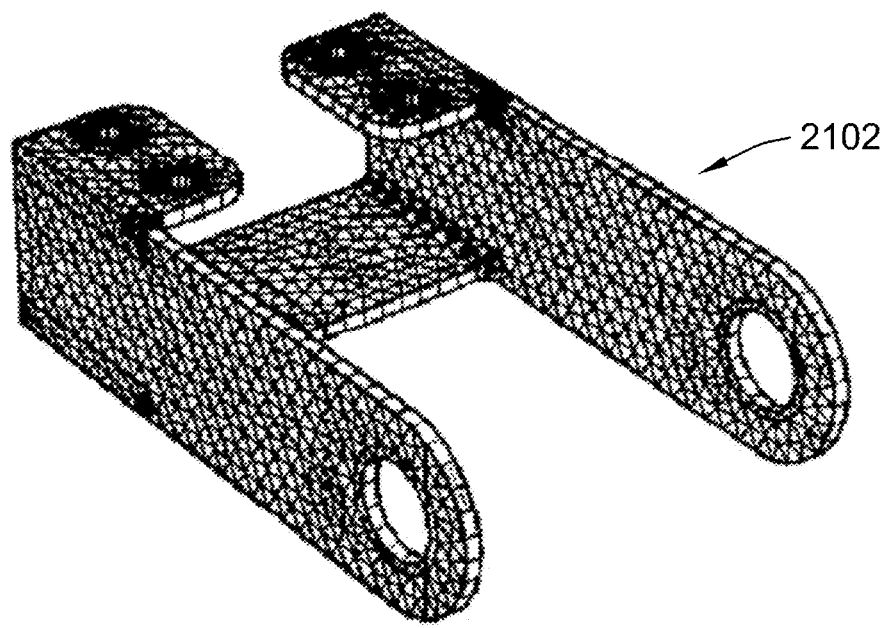
FIGS. 21A-21B depict an exemplary non-optimized mesh and a topology optimized mesh where mesh elements of the topology optimized mesh are mapped to the non-optimized mesh, according to some implementations of the present technology.
Figure 21B:
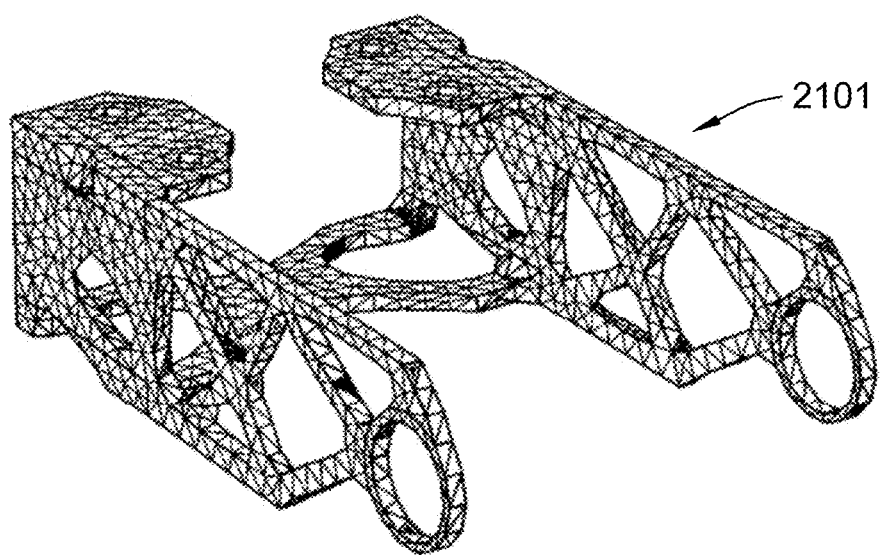
Figure 22A:
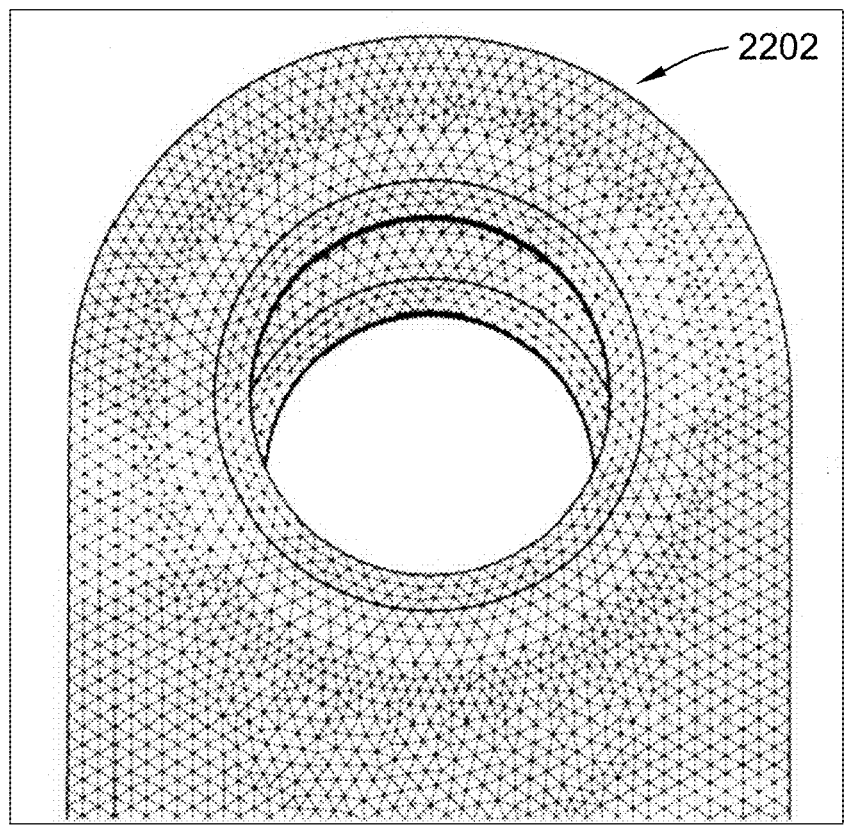
FIGS. 22A-22B depict an exemplary finely meshed version of a non-optimized mesh and a topology optimized mesh where mesh elements of the topology optimized mesh are mapped to the non-optimized mesh, according to some implementations of the present technology.
Figure 22B:
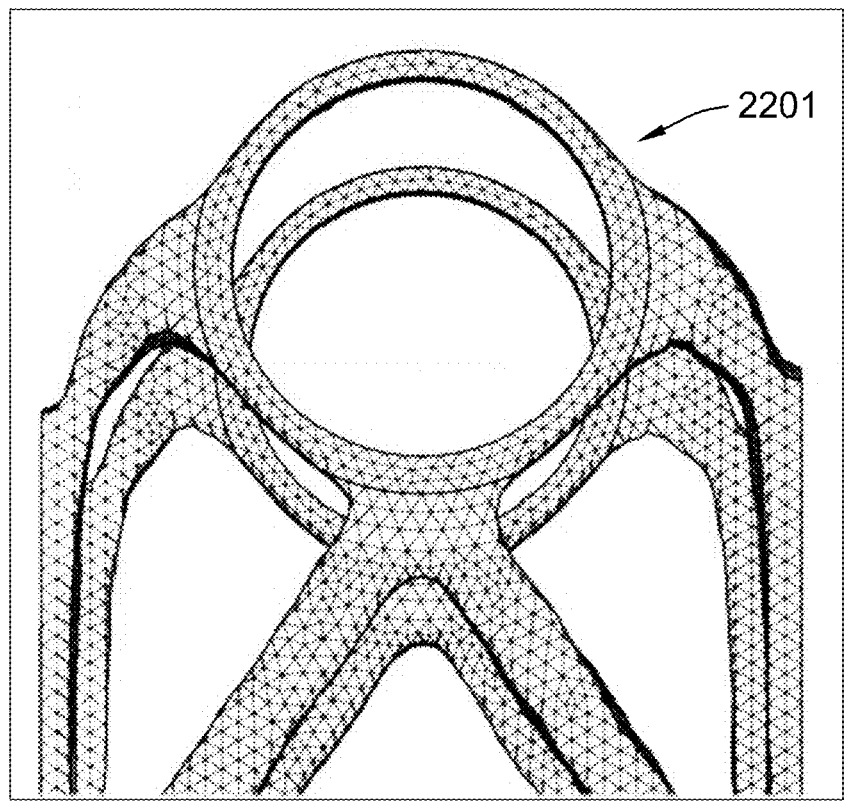

It is contemplated that a geometrical representation of an optimized geometry, including only coordinate information, that for example, is in the form of an STL-file, may be sufficient. However, in a modeling scenario, it may be desirable to a user may want not only the geometrical representation of the optimized geometry from the topology optimization, but also the geometrical representation of the topology optimized geometry, with all selections of geometric entities in particular with respect to boundary conditions (and domain, edge and point constraints/conditions) of the model intact. A named selection is a named listing of, one or more geometric entities, in an unmeshed state. Such a selection may be user generated, or automatically generated. Named selections are useful from a modeling perspective because it simplifies grouping of parts of the geometric representation that share some sort of aspect. For example, a material or boundary condition can easily be defined by a user to a multitude of geometric entities without having to interact with each geometric entity. It is sufficient for the user to interact only with the named selection. For each named selection, a listing of geometric entities forming said named selection is maintained. The mesh formed from a geometry contains information regarding which geometric entit(ies) a mesh element is a part of During simulation containing topology optimization, information regarding what geometric entities a mesh element is a part of may be lost in the resulting topology optimized mesh. The present application describes a way to retain the information regarding what geometric entities a mesh element in the topology optimized mesh belongs to, thereby maintaining information regarding which geometric entities and thereby named selections, if any, each mesh element in a topology optimized mesh belongs to. Referring now to FIG. 20, an exemplary named selection 2001 "Domains Outside Design Space" is depicted of domains, including the 2, 7, 8, 11, 12, 16 geometric domain entities 2002.

In the topology optimization described herein, mesh elements do not move during the optimization procedure. This means that generally there is a mesh element in the topology optimized mesh (that is the mesh that exists after the topology optimization procedure has finished) that share the same coordinates and connectivity between parts of the mesh element as in the non-topology optimized mesh (meaning the mesh that exists before the topology optimization is initiated). Therefore, each mesh element in the topology optimized mesh may be mapped to the non-topology optimized mesh based on their coordinates and connectivity. Since the model data structure also contains data about which geometric entities, and thereby which named selections each element in a non-topology optimized mesh belongs to, then using said mapping, each mesh element may be associated with information regarding which geometric entity and thereby which named selection(s) it is a part of.

Referring now to FIGS. 21A to 22B, a topology optimized mesh 2101, 2201 is mapped to a non-topology optimized mesh 2102, 2202, which is a mesh based on the geometric representation containing the named selection 2001.

On mesh elements where the θ value transitions from being included in the topology optimized mesh to not being included, only the part of the mesh element corresponding to such θ values that should be included, may be included in the topology optimized mesh. Such a part of a mesh element, may be used to form a new mesh element. The new mesh element may be mapped to a part of a non-topology optimized mesh based on sharing coordinates and connectivity with the part of a mesh element. The mesh element may then be mapped to a named selection based on the information concerning what geometric entit(ies) the part of the mesh element belongs to.

Named selections may be transferred to a topology optimized topology. This is very helpful for a user that wants to perform additional modeling of an optimized topology, and for re-creating a non-meshed geometric representation containing the named selections. Often simulation of such a model will be for verification purposes using standard material properties (as opposed to material properties modified by material volume factors), therefore boundary conditions and similar settings of the model may be the same or similar to the boundary conditions applied in the physics interface for the topology optimization, but due to the changed topology the number of boundaries (and therefore possibly any indexation of boundaries) etc. will likely be different between the geometrical representation of the pre-optimized model object and the post optimized physical object being modeled.

It is contemplated that where user wants to perform other types of modeling on a geometric representation of the optimized physical object being modeled, several boundary conditions would still be the same as in the original model, for example, a fixed constraint defining that those parts of the geometry should stay immobile.

The selection-filter proposed herein maintains all associated named selections. This solves the problem that a user who would use a selection filter that merely extracts the geometry coordinates (and possibly θ values) for all θ values >0.5 (or other value) would run into, such as manually having to re-apply all boundary conditions when using the optimized geometric representation of the model object, or re-creating all named selections. The output from a selection filter may be referred to herein as a filtered dataset.

It is contemplated that the output geometric representation may or may not have smoothing applied to it. In particular using the approach described herein using a Helmholtz filter, a projection step, and a penalization step, it may be desirable to construct a geometric representation consisting only of those parts of the mesh where θ values are above 0.5. It is contemplated that all θ values that are above or are equal to 0.5 would be similarly desirable. Values other than 0.5 are also contemplated.

Such a selection-filter feature may execute automatically by default as a result of presenting an output from a topology optimization interface It is contemplated that such automatic execution of the selection-filter feature may be toggled "on" or "off".

Another way to implement a selection-filter feature would be to not execute it automatically, but to couple such execution to user interaction with a GUI element, for instance a radio button, check box or icon representative of outputting a selection-filter geometry. It is contemplated that such a selection-filter feature may be associated with one or more GUI input elements such as an input field an edit field or a drop-down menu containing one or more values representative of the range of θ values which should be required for inclusion in an output selection-filter geometry.

Method steps are described below for generating a representation of a topology optimized geometry.

Figure 23A:
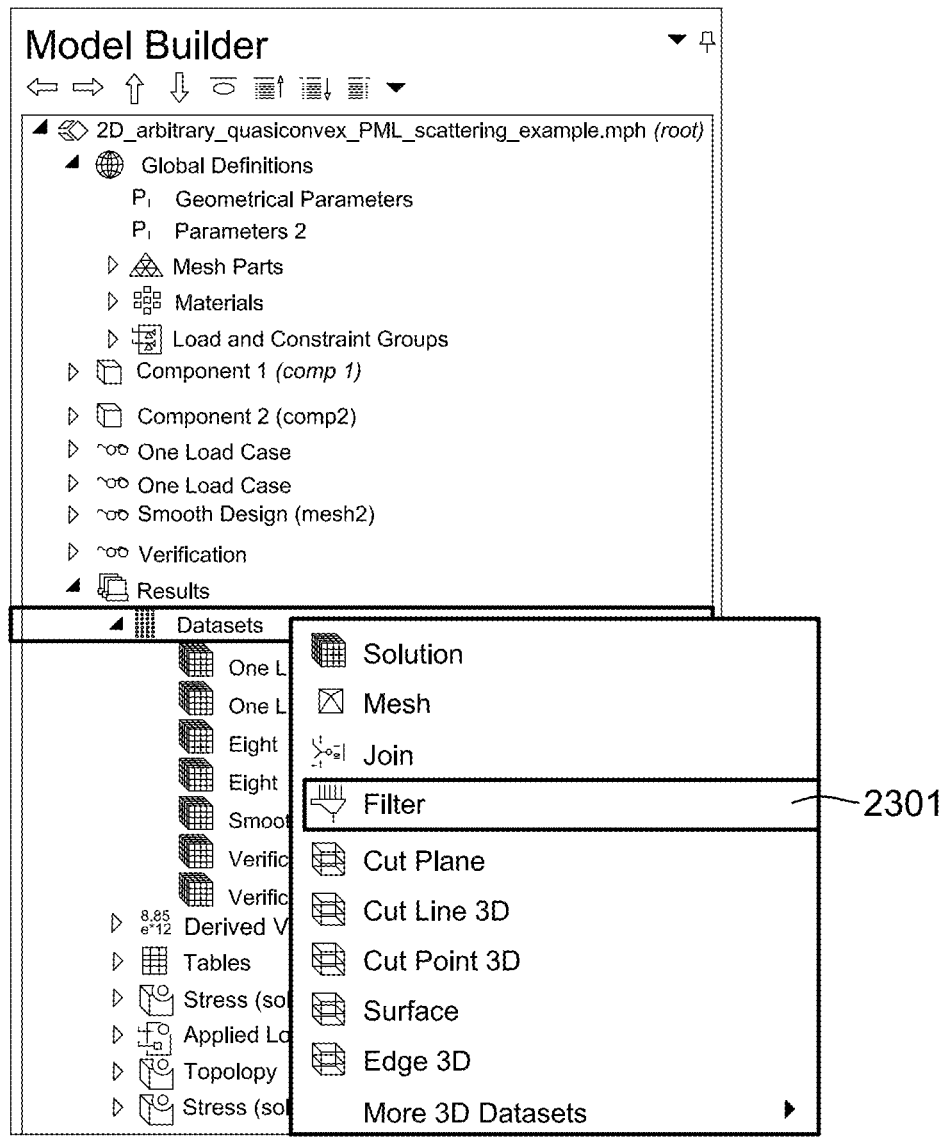
Figure 23B:
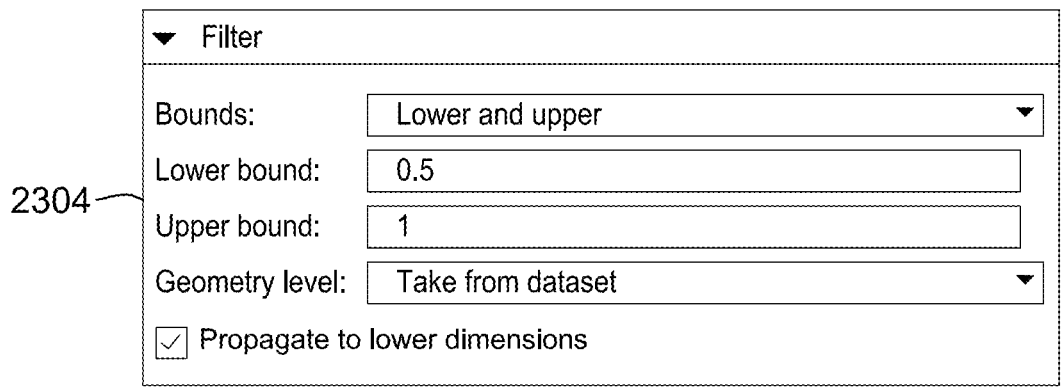

Referring now to FIGS. 23A to 23C, a user may add a selection filter feature to a topology optimization results dataset. The user may add a selection feature by clicking a selection filter GUI element displayed in the GUI, for instance displayed in a selection menu in response to the user right clicking a datasets GUI element 2301. In response GUI elements for obtaining user input settings for the selection filter may be displayed, these GUI elements may be grouped in a selection filter settings window 2302.

Next, a user may define selection filter settings. The dataset input may be selected, for example, from a drop-down or selection menu of available simulation result datasets. In some implementations, it is contemplated that the selection filter sub feature is added as a sub feature to a particular dataset where the input dataset may be the dataset to which the selection filter sub feature was added to. Further settings include an expression and bounds field 2303 used for the filtering, shown as θ (dtopo1.theta) and 0.5 as a lower bound (1 being the highest possible value). Both settings may be entered by a user by typing them into the corresponding input/edit field. Both an upper and a lower bound may be defined, and an upper bound input field may be added if the user selects "lower and upper" bound from a drop-down menu 2304. A name for selection filter may be created, either using a default name (such as filter 1, filter 2 etc.) or user defined name entered in an input field 2305.

Figure 24A:
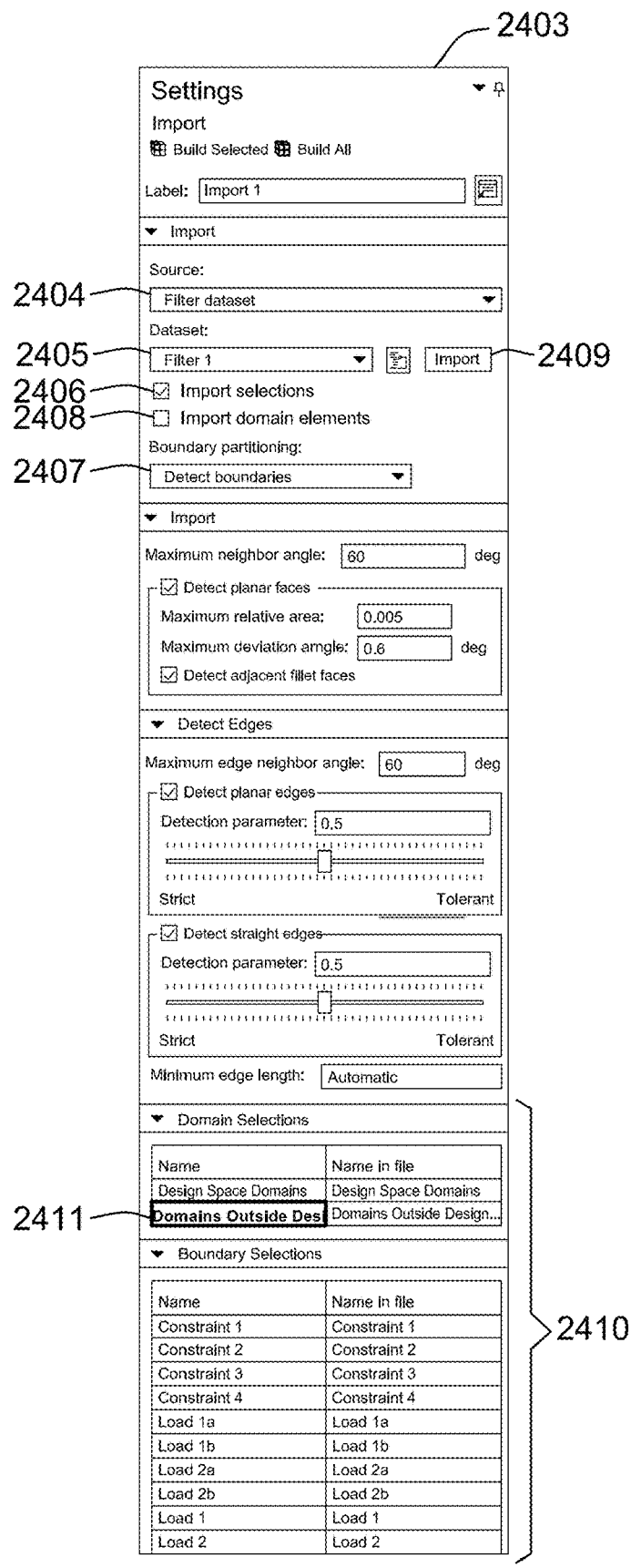
FIGS. 24A-24C depict exemplary GUI elements and an exemplary settings window for creating a new mesh based on a filtered mesh dataset that optionally include named selections from the original mesh, according to some implementations of the present technology.
Figure 24B:
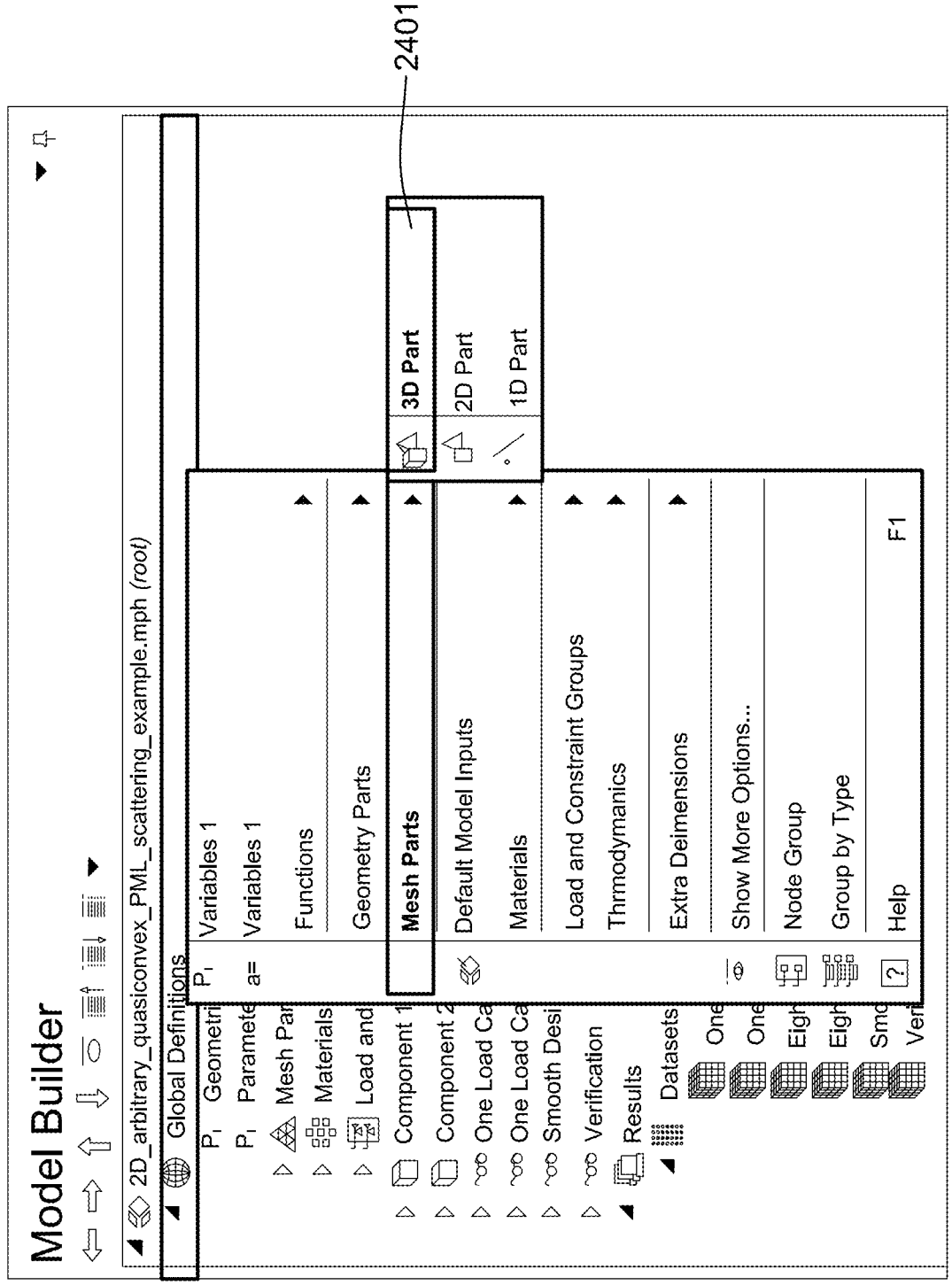
Figure 24C:
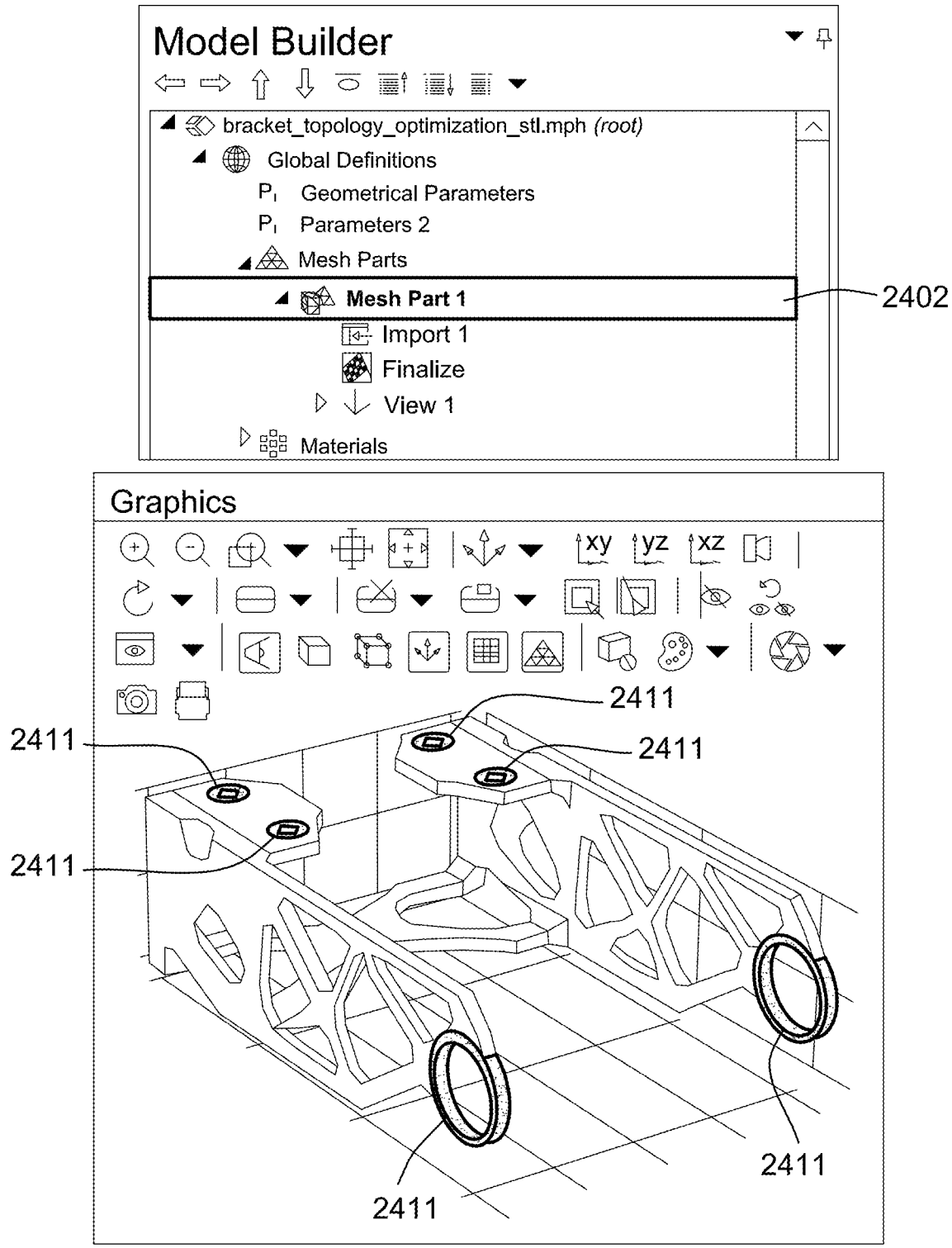
Figure 25:
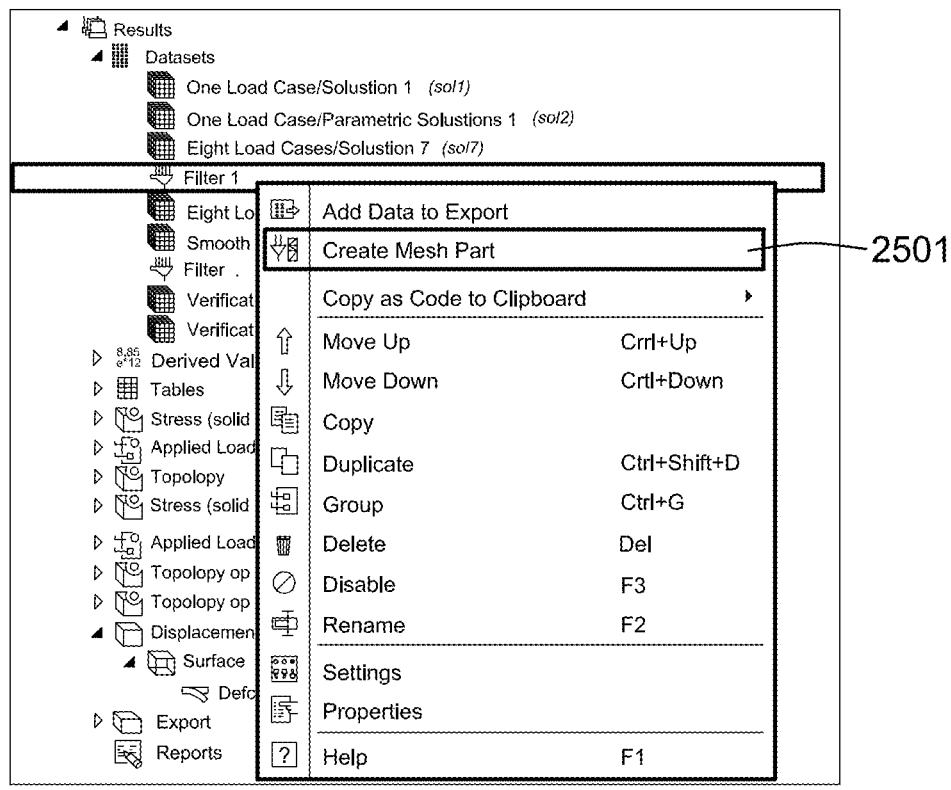
FIG. 25 depicts GUI elements for initiating the creation of a mesh based on a filtered mesh dataset, according to some implementations of the present technology.

Referring now to FIG. 24A to 24C, a topology optimized geometry as defined by the selection filter may be constructed including maintained selections. The depicted topology optimized geometry may be used in any model. The user may initiate the creation of the geometry by clicking on a GUI element associated with creating a mesh part, or in the shown non-limiting case, accessed by right clicking another GUI element associated with model components 2401, thereby displaying a selection menu including the GUI element associated with creating a mesh part. In some aspects, the user may right click the selection filter, displaying a selection menu and select "Create mesh part" element 2501 as depicted in FIG. 25.

In response to initiating the creation of the geometry, a mesh part (which is a mesh based on the output from a selection filter feature) may be created, represented in the GUI by a mesh part GUI element with a user definable name, although a default name may (Mesh Part 1, Mesh Part 2 etc.) be created at first 2402. The topology optimized geometry based on the selection filter feature settings may then be selected as input for the mesh part by clicking the "import" GUI element shown below 2402rt. A multitude of GUI elements associated with settings for the creation of the mesh part import may be displayed to the user. These GUI elements may be grouped, for instance in a settings window displayed to the user in the GUI 2403.

Using the settings window, the user may use the drop down/selection menu to select "filter dataset" as a source 2404, where a second drop down menu displaying all available filter datasets may be shown in response. The user may select the filter dataset (identified by name) from the second drop down/selection menu 2405.

A GUI element, such as a check-box indicating that all selections associated with the selected dataset should also be included, may be checked by default 2406. The user may also select to detect boundaries when importing selections, which may correspond to a processing of the topology optimized mesh. Boundaries and edges may be detected and indexed automatically where the user may specify whether such detection should be executed by selecting "detect boundaries" 2407 from a drop down menu or a GUI element associated with an instruction to detect boundaries in the mesh.

In some implementations, a default discretized geometry representation that is generated is a surface representation including associated domain information, where the surface mesh elements are associated with domain information defining where a domain is defined.

If a user that wishes to include domain elements, which may be necessary if the user wants to perform simulation requiring domain elements without regenerating a non-discrete geometry (and then re-meshing), the user may do so by checking the import domain elements check box 2408 in the example shown in FIG. 24A, or through a similar GUI element associated with importing domain elements. Not including domain elements in the mesh part by default may be advantageous because of the much lower memory requirements for creating a mesh part out of surface elements (that is 2D mesh elements) with domain information associated with the surface mesh detailing where in the 3D space there is a domain, compared to creating a mesh part using domain elements (that is 3D mesh elements). It may be desirable for the user to generate a non-discretized geometry based on the mesh part, and surface elements with associated domain information may typically be sufficient for such generation, and then re-mesh that geometry based on continued modeling needs. Another advantageous aspect of creating a mesh part out of surface elements with associated information concerning where in the 3D space a domain is located, is that (automatic) modification to surface mesh elements in order to obtain higher quality surface elements (for triangular elements for instance a low-quality element would be one that has an internal angle close to 180 degrees), is more likely to be successful or may be performed using less processor and/or memory resources than it is to modify all low-quality domain elements that may exist close to the θ cut-off value. In some implementations, close to the cut-off value of θ, typically 0.5, mesh elements may be low quality because the original mesh elements may have been cut, with only a part of a mesh element that corresponds to the required eight existing in the topology optimized mesh.

A user may initiate the generation of the mesh part by interacting with a GUI element associated with executing the generation of the mesh part according to the settings defined by the user, for example, by clicking on an "import" button 2409 in the GUI. If the user changes any of the settings and performs the same interaction with the GUI element (for example, clicks the "import button" again) the mesh part will be regenerated according to the new user settings.

If the user indicated that associated selections should be included, all associated selections 2410 listed by name and selectable in a list menu will be displayed to the user. In response to the user clicking one of the associated selection list items, the corresponding selection in a graphical representation of the model object may be highlighted 2411, as depicted in FIG. 24C.

Figure 26A:
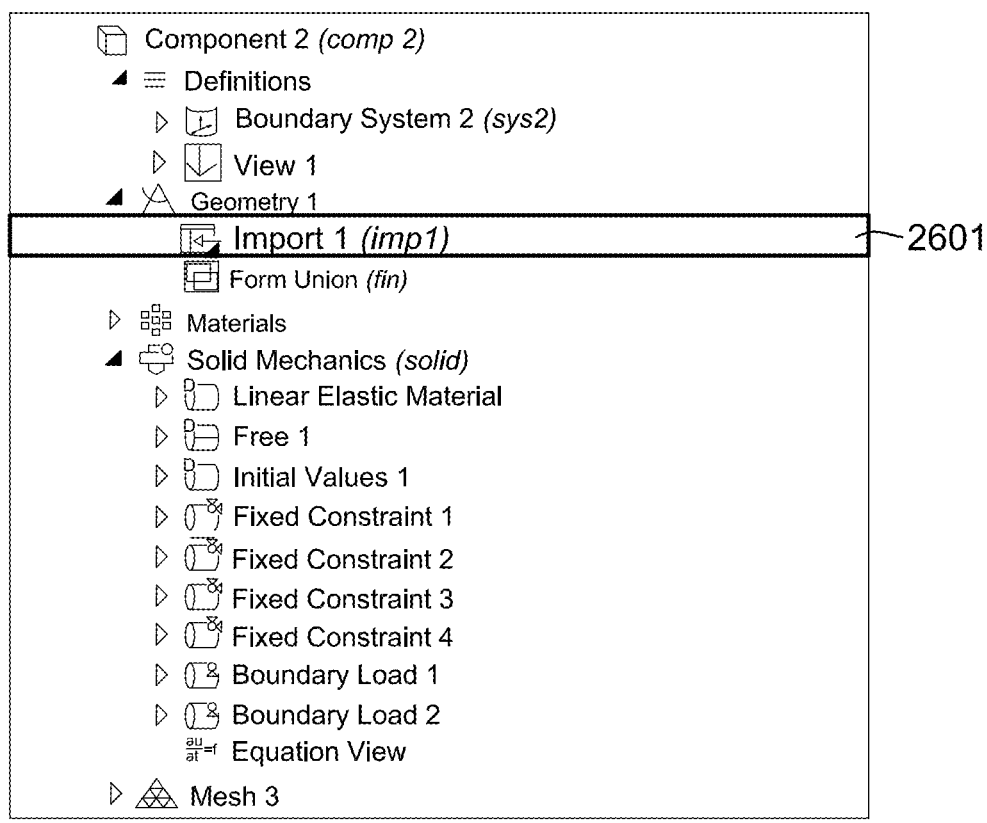
FIGS. 26A-26B depict exemplary GUI elements and settings window for creating a geometry based on a mesh from a filtered dataset, according to some implementations of the present technology.
Figure 26B:
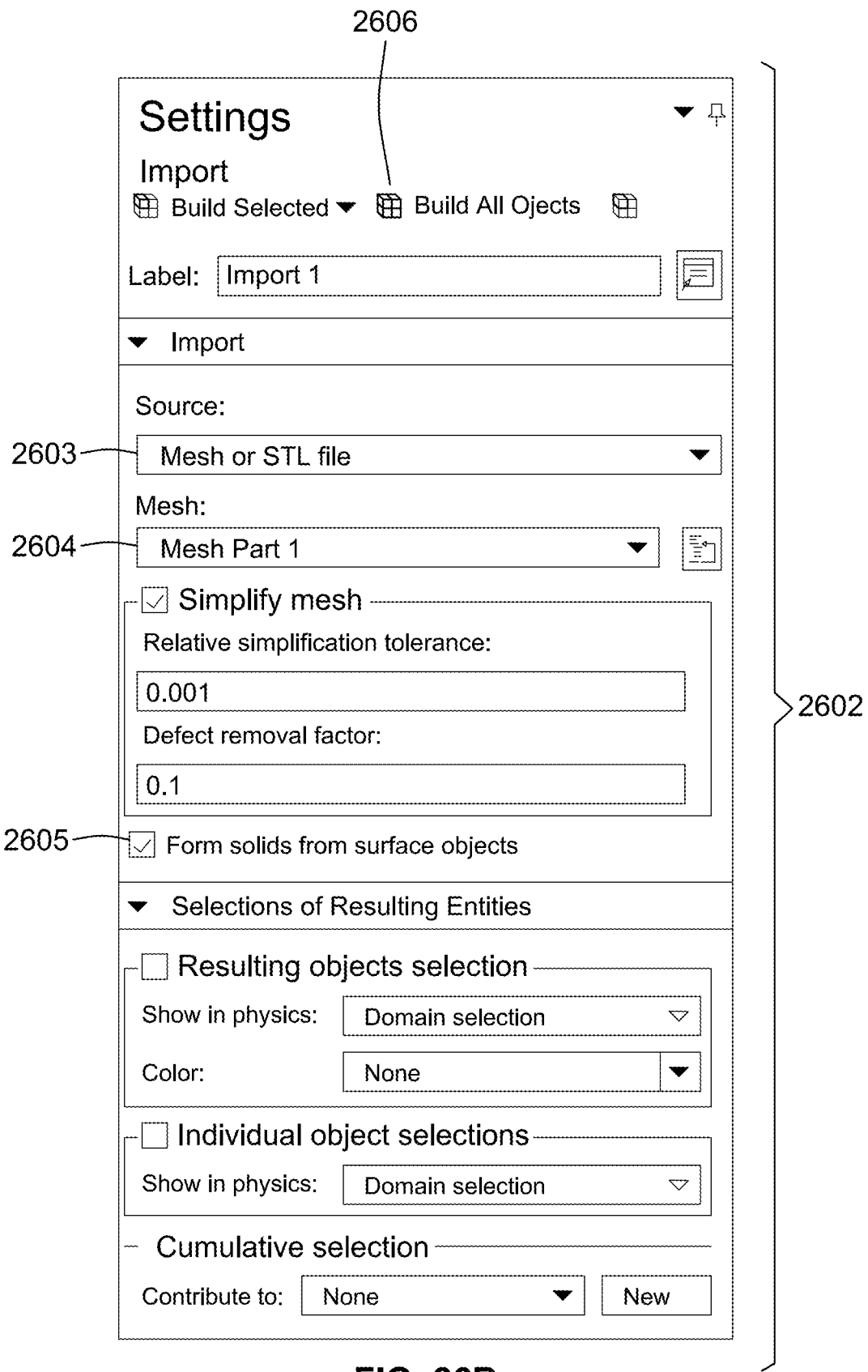

Referring now to FIG. 26A to 26B, exemplary GUIs are depicted for a non-discretized geometry representation to be generated within an existing model component. The user may generate such a non-discretized geometry representation by right clicking/clicking on a geometry GUI element under the model component where the geometry representation should be generated. In response to the user selection, a selection menu may be displayed, including an import GUI element 2601. In response, a set of GUI elements may be displayed, grouped for example in a settings window 2602.

Next, the user may use a GUI element, such as a drop down menu, to select the type of source for the geometry import 2603. The user may select a menu item corresponding to sources at least partially including meshes, from a second drop down menu or similar GUI item that may be displayed, where the selections in the menu include at least a reference to the generated mesh part. Using the second drop down menu, the user may select the drop down menu item referring to the generated mesh part 2604, such as "Mesh Part 1". The settings window 2602 may include a GUI check box 2605, "form solids from surface objects". In response to check box 2605 being checked, surface mesh elements associated with domain information may form domains. The check box 2605 may be checked by default. The settings window 2602 may also include user input fields for defining that the mesh should be simplified when constructing a non-discretized geometry. The user may instruct the system to construct the non-discretized geometry in accordance with the user/default settings by interacting with a GUI element 2606, such as by clicking a "Build button". As with the other method and GUI discussed for generating topology optimized geometries, the named selections may be maintained using this method.

The constructed non-discretized geometry based on the optimized topology may then have boundary conditions, materials etc. assigned to it. Since named selections were maintained boundary conditions and materials may be assigned directly to the maintained named selections.

The user may then proceed with modeling and simulation using standard modeling practices.

Figure 27:
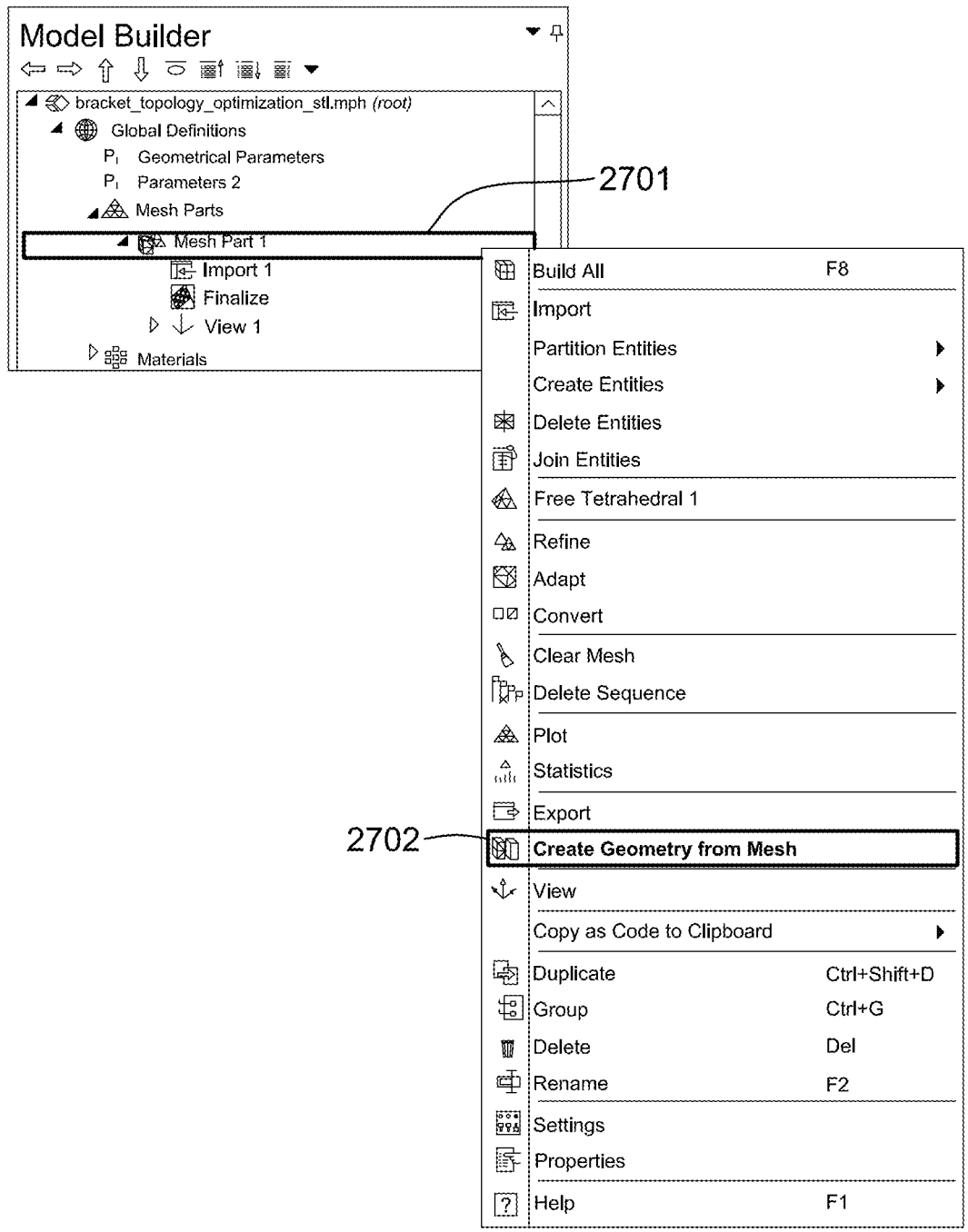
FIG. 27 depicts exemplary GUI elements for creating a geometry based on a mesh from a filtered dataset with one click in a context menu, according to some implementations of the present technology.

Referring now to FIG. 27, exemplary GUIs are depicted that allow for fast generation of a geometry based on a topology optimized mesh but with decreased control by user inputs. A user may generate a new non-discretized geometry based on a generated mesh part by interacting with GUI elements associated with generating a non-discretized geometry 2701. This may be done using only one click in a context menu. The user may for instance right-click the generated mesh part thereby displaying a selection menu and click on "generate geometry from mesh" 2702. In response, a new model component will be created including a non-discretized geometry, containing the named selections from the filtered dataset, where the named selections may be associated with boundaries on the non-discretized geometrical representation corresponding to the same boundaries as in the discretized geometrical representation. The named selections may then be referenced easily by the user when adding boundary conditions to the appropriate boundaries represented by the selections. The described process may create a new model component including the non-discretized geometry and is especially desirable for creating a new model. The described method may use default settings, for instance for mesh simplification and forming solids from surface objects.

It is contemplated that similar selection-filter features may be available in a computer aided engineering product, also for default $\theta_c$, $\theta_f$, and $\theta_p$ values, such as when generating a plot only with $\theta_c$, $\theta_f$ and $\theta_p$ values meeting specific criteria.

For a modeled geometry that includes both optimized domains and non-optimized domains, a user may wish to define the non-optimized domains as having set properties, for example, being a solid with a specific Young's modulus. The Young's modulus can just be set to the specific Young's modulus. Because the domain is non-optimized, no design variables $\theta_c$ are active on the domain. Because $\theta_c$ act as an input for $\theta_f$, this means that the smoothing filtering effect on the optimized topology is not present where a non-optimized domain meets an optimized domain. This results in an optimized topology with right angles where an optimized domain meets a non-optimized domain, which may be inconsistent with the desired filtering effect. To resolve this issue, a feature may be added that prescribes/defines a $\theta_f$ value on non-optimized domains where a specific material property is desired (for example, a solid domain) that is not optimized. Assuming $\theta_f$ is prescribed to non-zero, $\theta_f$ from the non-optimized domains with a prescribed $\theta_f$ will contribute to the $\theta_f$ value on mesh elements within the optimized domains within the filter radius of the non-optimized domain with a prescribed non-zero $\theta_f$. In the typical case $\theta_f$ on a non-optimized domain will be set to equal 1, consistent with a material volume factor of 1. This will result in a smooth transition of $\theta_f$ values and avoid undesirable right angles, which are typically stress points, that would otherwise have to be removed through manual user interaction.

The method steps for a user prescribing $\theta_f$ to a non-optimized domain are detailed below.

Figure 28A:
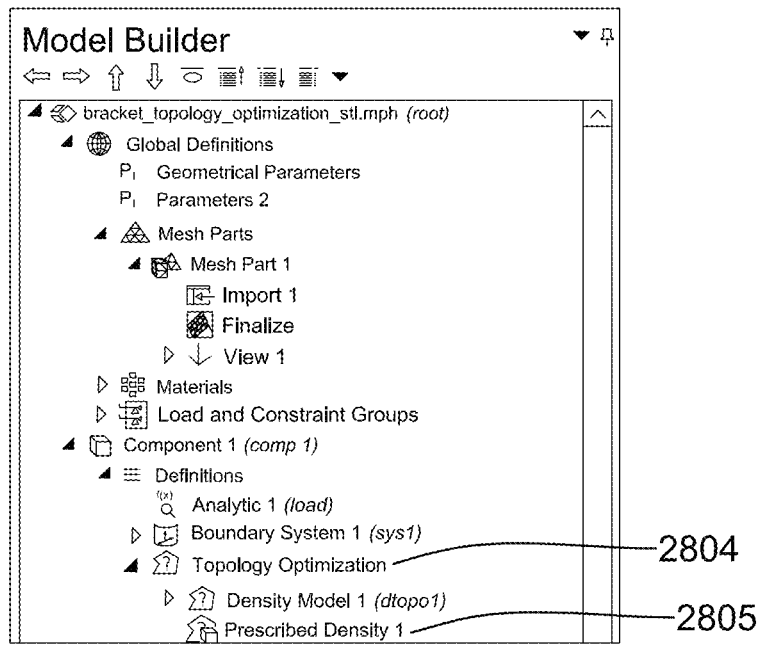
FIGS. 28A-28C depict exemplary GUI elements and a settings window for defining a prescribed density, according to some implementations of the present technology.
Figure 28B:
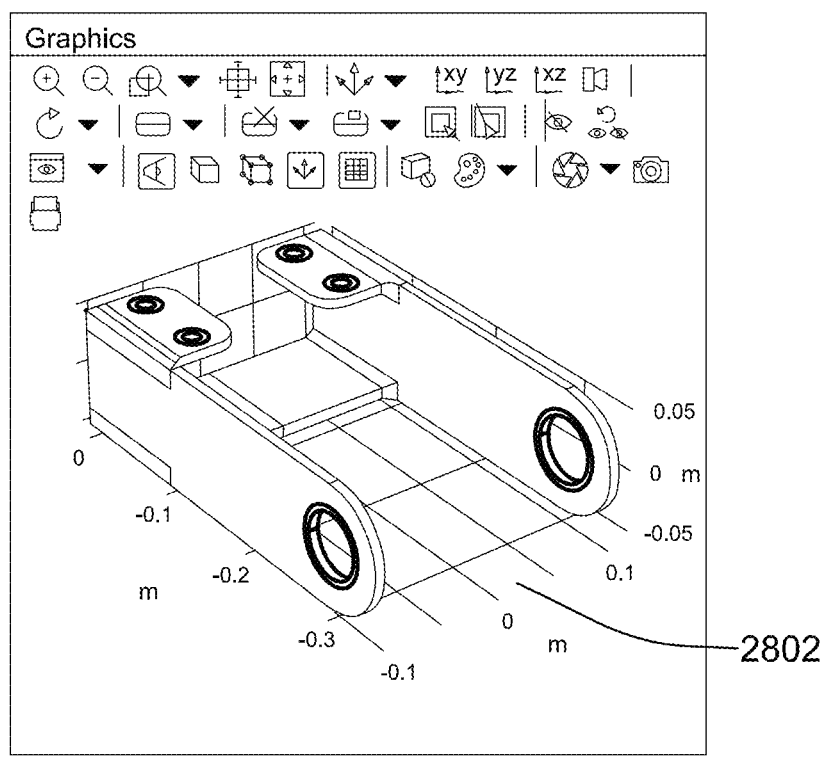
Figure 28C:
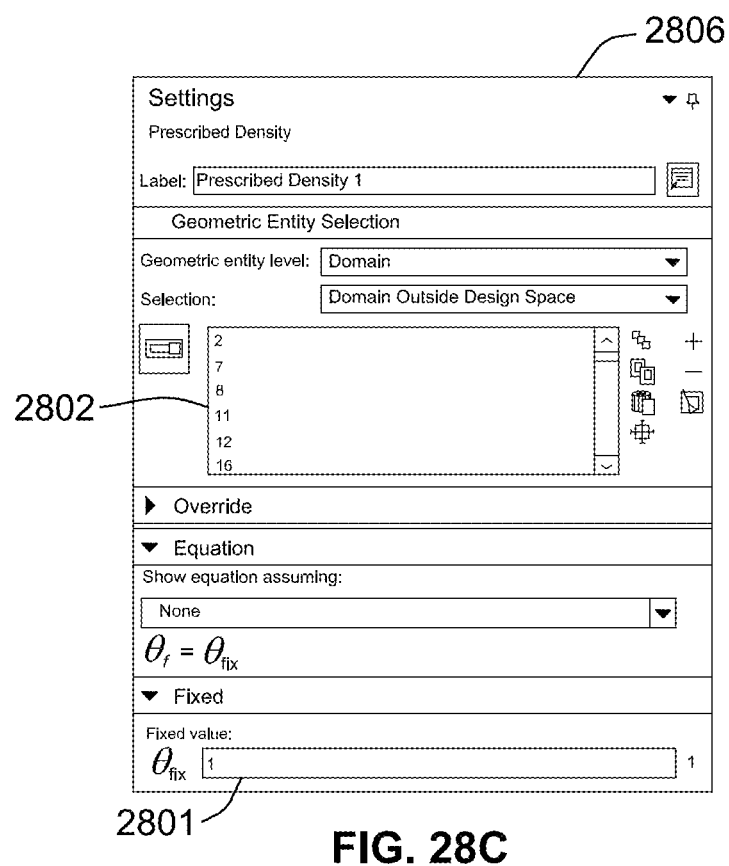
Figure 30A:
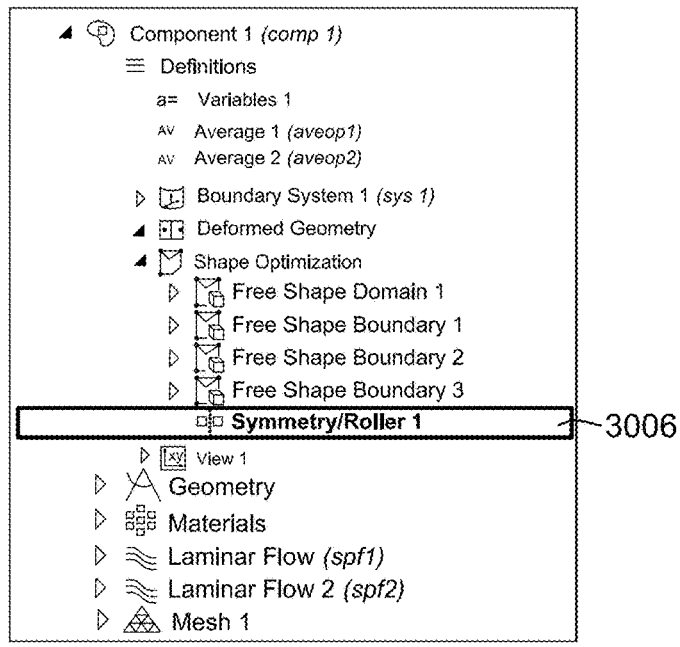
FIGS. 30A-30D depict exemplary graphical representations of a symmetry roller boundary condition used in a model with the shape optimized boundaries moving on a non-optimized boundary and a settings window for selecting the boundaries to apply the condition to, according to some implementations of the present technology.
Figure 30C:
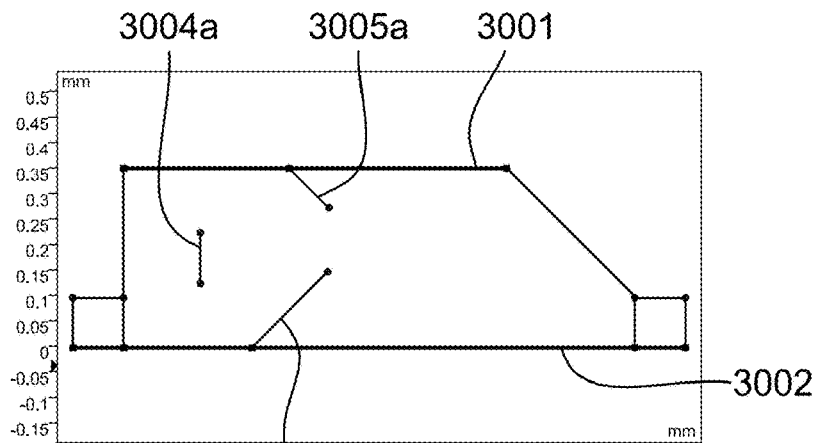
Figure 30D:
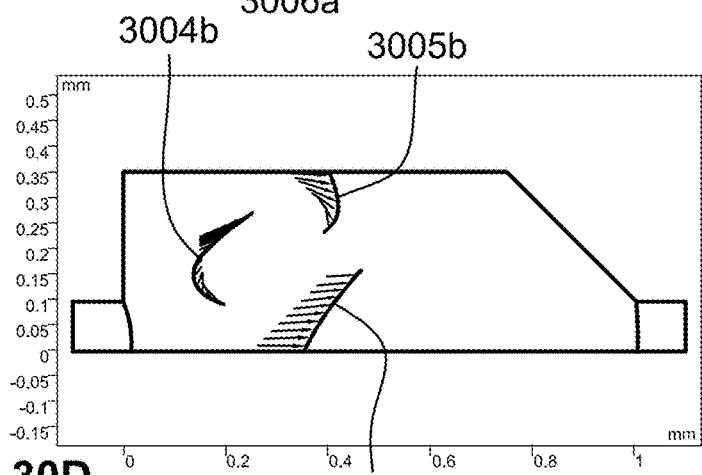
Figure 30B:
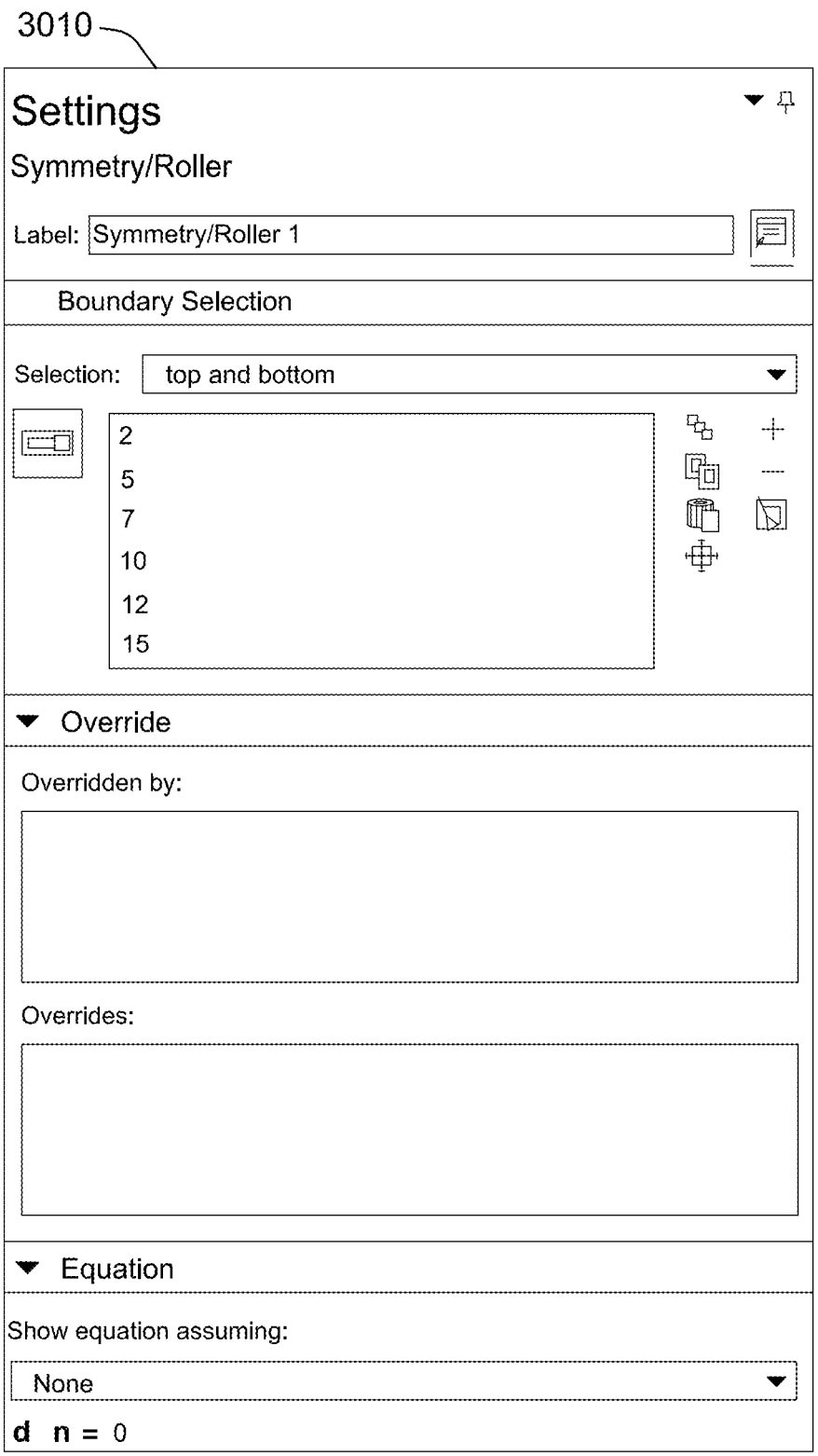

In a first method step, the user may add a prescribed density sub-feature to a topology optimization. In some implementations, the sub-feature may similarly be named "prescribed density". In a non-limiting example, FIGS. 28A to 28C depict exemplary GUIs where a user may right-click a GUI element 2804 representative of a topology optimization in a model tree. In response a selection menu of sub-features is opened. The user may then click on the prescribed density sub-feature 2805.

Next, in response to the user selecting the prescribed density sub-feature 2805, GUI elements for prescribing a value of $\theta_f$ applied to user selected domains are displayed to the user. For example, a settings window 2806 including an input field 2801 for the user to define the prescribed value of $\theta_f$, and a list 2802 with associated drop-down menus (or similar GUI-elements for selection) of selectable domains.

Next, the user may either select the desired domains using the list 2802 and associated drop down menus, or the user may click on a graphical representation of the domains 2802 in a graphical representation of the modeled object. The user may also enter a value of $\theta_f$ (for the Helmholtz filter the allowed range of this value is between 0 and 1, the default value is 1) using a displayed input field, thus defining the entered value as the value of $\theta_f$ on the selected domains.

The present technology includes GUI tools for allowing a user to easily declare and set up a connection between a boundary or edge being shape optimized and another boundary that is not being shape optimized, allowing the shape optimized boundary or edge to "roll" or "slide" along the other boundary. When a geometry including such a geometry is meshed, the connection results in mesh nodes located in both a boundary/edge that allows free movement (within some bounds set by maximum displacement) of mesh nodes forming the boundary/edge being shape optimized, and in a boundary that should not be shape optimized (this will be referred to as a stationary boundary). The desired outcome is that the mesh representation of the stationary boundary should maintain the location of the stationary boundary, while allowing movement of mesh nodes of the stationary boundary such that the scalar product of the displacement of a mesh node, and the normal of the stationary boundary is equal to zero, which more or less corresponds to the mesh nodes being able to move in the plane of the stationary boundary.

Any initial displacement of a node shared between a stationary boundary and a shape optimized boundary edge that is not parallel to the stationary boundary is subtracted from the initial displacement resulting in a final displacement vector.

As a result, the mesh nodes on the fixed boundary will not move out of the plane of the boundary. However, the mesh nodes are allowed to move within the plane, allowing the shape optimized boundary to slide on the fixed boundary, maintaining the connection between the boundaries.

Referring now to FIG. 30A to 30D, exemplary GUIs are depicted for a symmetry roller condition example. A shape optimization selection 3006 is received for the symmetry roller condition in FIG. 30A where in response, a symmetry roller settings window 3010 is display in FIG. 30B. Top and bottom boundaries 3001 and 3002 (see FIG. 30C) are selected from a drop-down menu and are non-optimized boundaries. Initial geometries 3004a, 3005a, 3006a are boundaries that are defined for microvalves that are being modeled. As depicted by geometrical representation in FIG. 30D of the optimized solution, the optimized microvalves 3005b, 3006b were allowed to move along the symmetry roller boundaries from their initial position in FIG. 30C. The optimized microvalves were optimized using shape optimization features, such as polynomial boundary or free shape optimization as described elsewhere herein. The movement along the non-optimized boundaries was made possible by the addition of a symmetry roller condition to the non-optimized boundaries.

Figure 31:
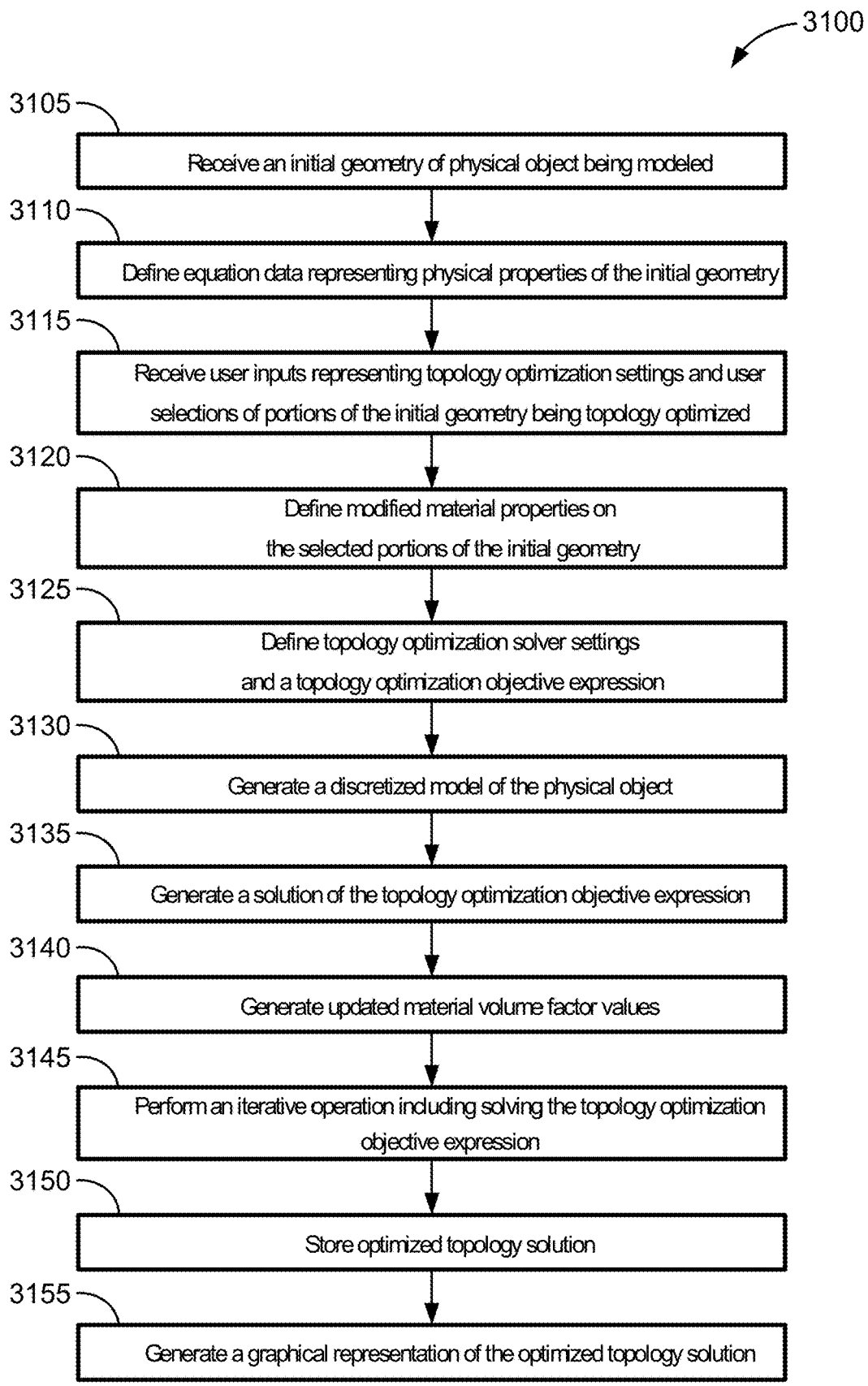
FIG. 31 is an exemplary flowchart of a simulation method for topology optimization of a geometrical representation of a physical object being modeled, according to some implementations of the present technology.

Turning now to FIG. 31, an exemplary flowchart 3100 is depicted of a simulation method for topology optimization of a geometrical representation of a physical object being modeled. The simulation method is computer implemented such that it is executable on one or more processors configured to generate a model of a physical system. The simulation method provides topology optimization of a geometrical representation of a physical object being modeled.

At step 3105, initial geometry data are received representing an initial geometry of the physical object being modeled. Next, at step 3110, equation data representing physical properties for one or more portions of the initial geometry can be defined. Then, at step. 3115, user inputs may be received via one or more graphical user interfaces configured for display on one or more display devices. The user inputs represent one or more topology optimization settings and user selections of one or more portions of the initial geometry being topology optimized. Next, at step 3120, modified material property data can be defined for modified material properties on one or more portions of the initial geometry. The modified material properties are based on material volume factors associated with received topology optimization settings for modifying one or more material properties identified for the physical object being modeled. In some implementations, at least one material volume factor may be associated with a filter length which may be user editable. Then, at step 3125, topology optimization solver settings and a topology optimization objective expression may be defined for a topology optimization solver. The topology optimization objective expression is at least partially determined by one or more of the modified material properties.

Next, at step 3130, discretized model data are generated via the one or more processors. The discretized model data represents a discretized model of the physical object being modeled based on the initial geometry. The discretized model includes a mesh based on the initial geometry. At least some mesh elements are associated with one or more material volume factor values. Then, at step 3135, a solution of the topology optimization objective expression may be generated via the one or more processors. The solution is at least partially determined by the material volume factor values. Next, at step 3140, updated material volume factor values are generated via the one or more processors. The updated material volume factor values are based on the defined topology optimization solver settings. Next, at step 3145, an iterative operation is performed, via the one or more processors, that includes solving the topology optimization objective expression based at least partially on the updated material volume factor values. The iterative operation can continue until a defined maximum number of iterations have been performed or at least one topology optimization solver determines that an optimized topology solution has been achieved. Then, at step 3150, optimized topology solution data representing the optimized topology solution can be stored on a computer memory device. The optimized topology solution includes material volume factor values defined on mesh elements. Next, at step 3155, a graphical representation of at least a portion of the optimized topology solution data are generated via the one or more processors. The graphical representation is configured for display on the one or more graphical user interfaces.

Figure 32:
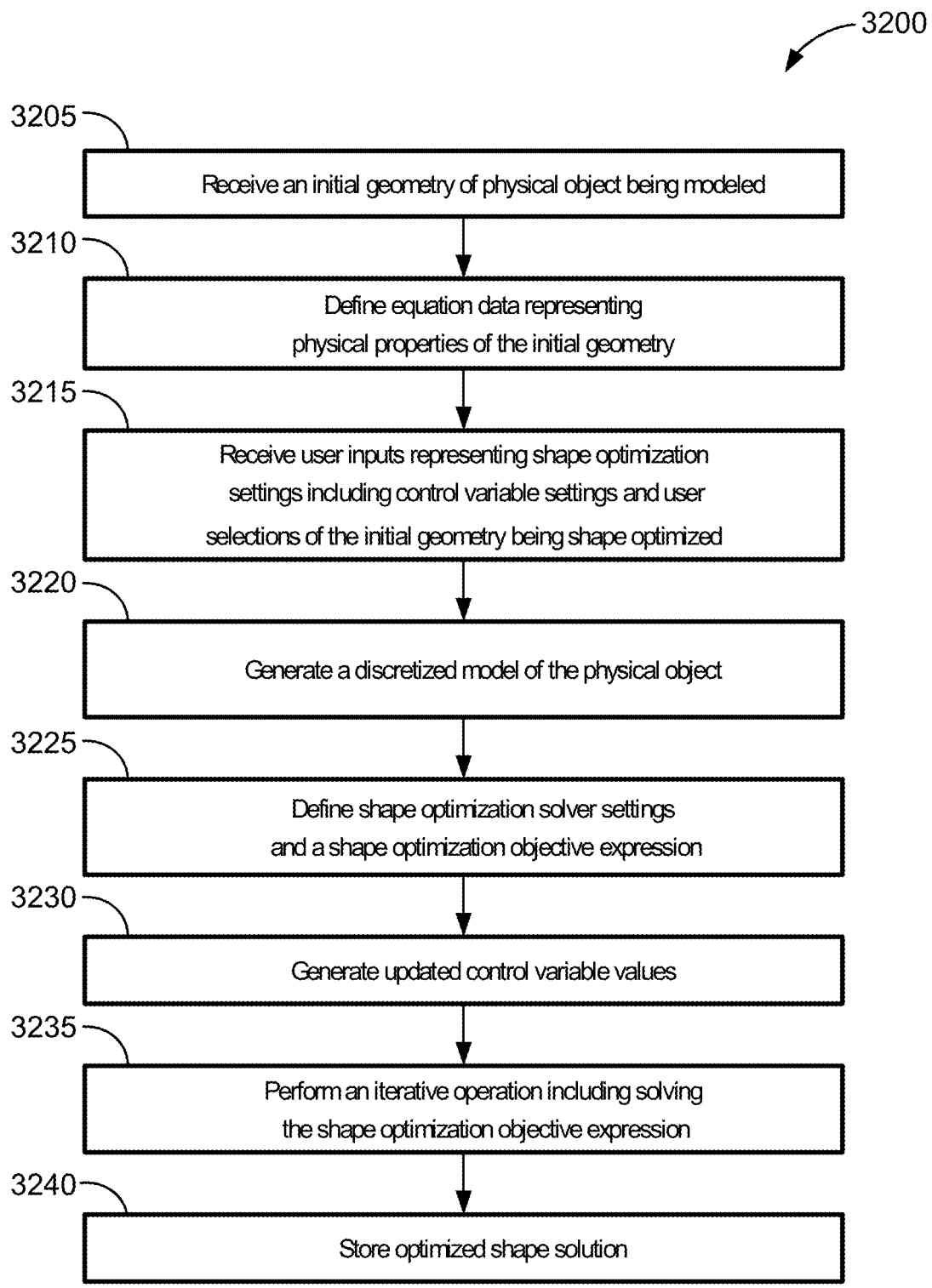
FIG. 32 is an exemplary flowchart of a simulation method for optimizing a shape of a geometrical representation of a physical object being modeled, according to some implementations of the present technology.

Turning now to FIG. 32, an exemplary flowchart 3200 depicts a simulation method for optimizing a shape of a geometrical representation of a physical object being modeled. The simulation method is computer implemented such that it is executable on one or more processors configured to generate a model of a physical object.

At step 3205, initial geometry data are received representing an initial geometry of the physical object being modeled. Next, at step 3210, equation data can be defined representing physical properties for one or more portions of the initial geometry. Next, at step 3215, user inputs can be received via one or more graphical user interfaces configured for display on one or more display devices. The user inputs can represent one or more shape optimization settings including control variable settings and user selections of one or more portions of the initial geometry being shape optimized.

Next, at step 3220, discretized model data may be generated via the one or more processors. The discretized model data can represent a discretized model of the physical object being modeled based on the initial geometry. The discretized model can include a mesh based on (i) the initial geometry and mesh element node coordinates for portions of the initial geometry to be shape optimized based on control variables, and (ii) a shape optimization objective expression. Next at step 3225, shape optimization solver settings and a shape optimization objective expression may be defined for a shape optimization solver. The shape optimization objective expression is at least partially determined by one or more control variables. Then, at step 3230, updated control variable values may be generated via the one or more processors. The updated control variable values can be based on the defined shape optimization solver settings. Next, at step 3235, an iterative operation is performed via the one or more processors. The iterative operation can include solving the shape optimization objective expression based at least partially on the updated control variable values. The iterative operation can continue until a defined maximum number of iterations have been performed or until at least one shape optimization solver determines that an optimized shape solution has been achieved. Next, at step 3240, optimized shape solution data representing the optimized shape solution may be stored on a computer memory device. The optimized shape solution can include a shape optimized mesh corresponding to the optimized shape solution or a shape solution based on more than one iteration of solving the shape optimization objective expression.

Figure 33:
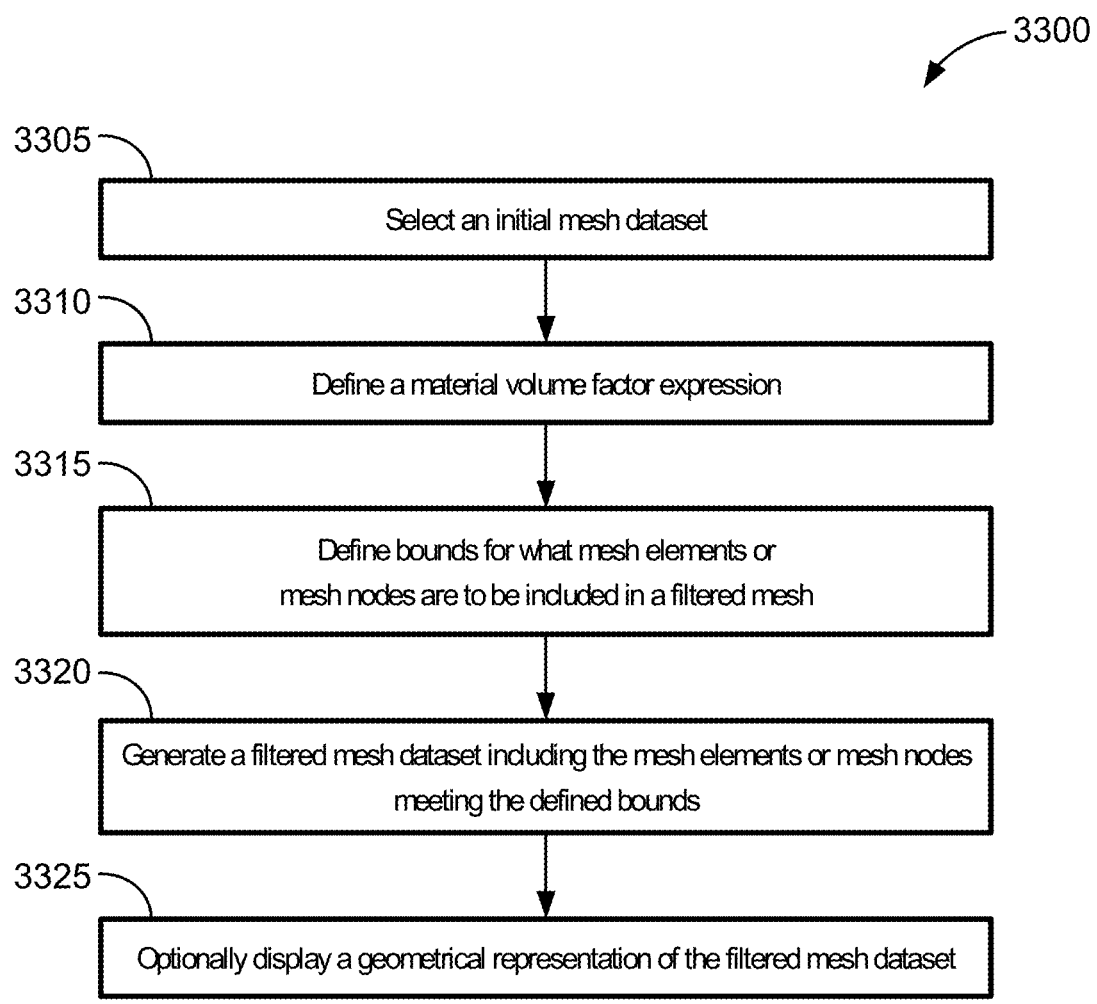
FIG. 33 is an exemplary flowchart of a simulation method for generating a filtered mesh dataset based on material volume factors associated with a topology optimization, according to some implementations of the present technology.

Turning now to FIG. 33, an exemplary flowchart 3300 is depicted of a simulation and/or post-processing method for generating a filtered mesh dataset. The simulation method is computer-implemented and is applied to a mesh dataset, including material volume factor value data from a topology optimization and mesh data, used to generate the filtered mesh dataset. The filtered mesh dataset is based on the values of the material volume factors such that only mesh elements meeting one or more criteria with respect to material volume factor values are retained in the filtered mesh dataset.

At step 3305, an initial mesh dataset is selected. Next, at step 3310, a material volume factor expression can be defined. Then, at step 3315, bounds for mesh elements or mesh nodes to be included in the filtered mesh are defined. The bounds are based on material volume factor values associated with the mesh elements or mesh nodes that are applied in the defined material volume factor expression. Next, at step 3320, the filtered mesh dataset can be generated that includes the mesh elements or mesh nodes meeting the defined bounds for the material volume factor expression. Then, at step 3325, a geometrical representation of the filtered mesh dataset can optionally be displayed in a graphical user interface associated with one or more display devices, such as display device that might be associated with a simulation computing system.

It is contemplated that any of the above defining and receiving steps described for FIG. 31-33 can be implemented by either retrieving the described parameters from a computer readable media of, for example, a simulation computing system, or through user inputs received using one or more graphical interfaces associated with the simulations methods. It is further contemplated that the generating or performing steps are implemented on one or more processors associated with, for example, a simulation computing system. In addition, it is contemplated that the steps described above for the simulation methods of FIGS. 31-33 may be performed with a different ordering where the steps do not need to be performed sequentially.

In some implementations, methods, systems, or apparatus are contemplated based on any and all combinations of any two or more of the steps, acts, or features, individually or collectively, disclosed or referred to or otherwise indicated for the present technology.

The exemplary implementations of simulation methods, apparatus, and/or systems for topology and/or shape optimization presented in FIGS. 1-33 are merely examples and are understood to apply to broader applications and physic phenomena, not just the simulation implementations described or illustrated in the figures. For example, it would be understood that many different custom geometries or models, depending on a particular application, can be topology or shape optimized using the present technology. The illustrated aspects are merely examples of the broader operations that may be performed by a simulation computing system. Furthermore, other types of graphical, user, or alternative input-type interfaces are contemplated.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Each of these aspects and obvious variations thereof is contemplated as falling within the spirit and scope of the claimed invention, which is set forth in the following claims. Moreover, the present concepts expressly include any and all combinations and subcombinations of the preceding elements and aspects.

What is claimed is:

1. A computer-implemented simulation method executable on one or more processors configured to generate a model of a physical system, the simulation method providing topology optimization of a geometrical representation of a physical object being modeled, the simulation method comprising the acts of:
    receiving initial geometry data representing an initial geometry of the physical object being modeled;
    defining equation data representing physical properties for one or more portions of the initial geometry;
    receiving, via one or more graphical user interfaces configured for display on one or more display devices, user inputs representing one or more topology optimization settings including one or more of a filtering setting, a projection setting, and an interpolation setting, the user inputs further representing user selections of one or more portions of the initial geometry being topology optimized, at least some of the user selections forming named selections of a named listing of user-selected geometric entities;
    defining modified material property data for modified material properties on one or more portions of the initial geometry, the modified material properties based on material volume factors associated with received topology optimization settings for modifying one or more material properties identified for the physical object being modeled;
    defining topology optimization solver settings and a topology optimization objective expression for a topology optimization solver, the topology optimization objective expression being at least partially determined by one or more of the modified material properties;
    generating, via the one or more processors, discretized model data representing a discretized model of the physical object being modeled based on the initial geometry, the discretized model including a mesh with mesh elements based on the initial geometry, at least some mesh elements being associated with one or more material volume factor values, the discretized model data including data identifying named selections associated with respective mesh elements;
    generating, via the one or more processors, a solution of the topology optimization objective expression, the solution being at least partially determined by the material volume factor values;
    generating, via the one or more processors, updated material volume factor values based on the defined topology optimization solver settings;
    performing, via the one or more processors, an iterative operation including solving the topology optimization objective expression based at least partially on the updated material volume factor values, the iterative operation continuing until a defined maximum number of iterations have been performed or at least one topology optimization solver determines that an optimized topology solution has been achieved;
    storing optimized topology solution data representing the optimized topology solution on a computer memory device, the optimized topology solution including material volume factor values defined on mesh elements;
    removing at least a portion of mesh elements having updated material volume factor values below a control material volume factor value;
    in response to removing portions of the mesh elements from the initial geometry, forming new replacement mesh elements;
    mapping data for the named selections to the mesh elements based on the initial geometry and the mesh elements of the optimized topology solution including the newly formed replacement mesh elements, the mapping implemented based at least in part on coordinate data of the mesh elements; and
    generating, via the one or more processors, a graphical representation of at least a portion of the optimized topology solution data including a user-selectable graphical user interface option to select and/or present the mapped named selections, the graphical representation configured for display on the one or more graphical user interfaces.

2. The simulation method of claim 1, further comprising the act of displaying, via the one of more graphical user interfaces, a topology-optimized geometrical representation including portions of the geometry that correspond to a specific range of material volume factor values.

3. The simulation method of claim 2, wherein the specific range of material volume factor values include one of: (i) filtered material volume factor values, (ii) projected material volume factor values, or (iii) penalized material volume factor values, the specific range being between a minimum value and a maximum value.

4. The simulation method of claim 3, wherein a new geometrical representation for the physical object being modeled is generated based on one of a default model setting or in response to the user inputs received through the one or more graphical user interfaces, the new geometrical representation corresponding to the topology optimized solution.

5. The simulation method of claim 4, wherein named selections originating from the initial geometry are maintained for the new geometrical representation.

6. The simulation method of claim 1, wherein at least one of the topology optimization settings corresponds to defining a filter radius used to generate a filtered material volume factor, and wherein a prescribed density is defined on a subset of the initial geometry, the filtered material volume factor being extended from the prescribed density domain to one or more surrounding topology optimized domains such that smooth transitions are generated between the geometry portions with a prescribed density and topology optimized domains.

7. The simulation method of claim 4, wherein a new geometrical representation of the physical object being modeled is based on a surface mesh including 2D elements, and wherein domain information associated with the surface mesh indicates where there is a domain in an associated 3D space.

8. The simulation method of claim 4, wherein a new geometrical representation is based on domain elements.

9. A computer-implemented simulation method executable on one or more processors configured to generate a model of a physical system, the simulation method optimizing a shape of a geometrical representation of a physical object being modeled, the simulation method comprising the acts of:
receiving initial geometry data representing an initial geometry of the physical object being modeled;
defining equation data representing physical properties for one or more portions of the initial geometry;
receiving, via one or more graphical user interfaces configured for display on one or more display devices, user inputs representing one or more shape optimization settings including control variable settings defining a maximum displacement and polynomial order and user selections of one or more portions of the initial geometry being shape optimized;
generating, via the one or more processors, discretized model data representing a discretized model of the physical object being modeled based on the initial geometry, the discretized model including a mesh based on (i) the initial geometry and mesh element node coordinates for portions of the initial geometry to be shape optimized based on control variables, and (ii) a shape optimization objective expression;
defining shape optimization solver settings and a shape optimization objective expression for a shape optimization solver, the shape optimization objective expression being at least partially determined by one or more control variables;
generating, via the one or more processors, updated control variable values based on the defined shape optimization solver settings;
performing, via the one or more processors, an iterative operation including solving the shape optimization objective expression based at least partially on the updated control variable values, the iterative operation continuing until a defined maximum number of iterations have been performed or until at least one shape optimization solver determines that an optimized shape solution has been achieved; and
storing optimized shape solution data representing the optimized shape solution on a computer memory device, the optimized shape solution including a shape optimized mesh corresponding to the optimized shape solution or a shape solution based on more than one iteration of solving the shape optimization objective expression,
wherein the control variables are Bernstein polynomial coefficients generated by the one or more processors in response to receiving the user selections of the one or more portions of the initial geometry being shape optimized and in response to receiving the user inputs representing the control variable settings.

10. The simulation method of claim 9, wherein at least one of the control variable settings for the Bernstein polynomials is a default value generated during implementation of the simulation method, the default control variable setting including a polynomial order and/or a maximum displacement.

11. The simulation method of claim 9, wherein a displacement of a shape optimized boundary is controlled by both a control variable and a filter setting.

12. The simulation method of claim 11, wherein the filter setting is received through a graphical user interface configured for display on one or more display devices.

13. A computer-implemented simulation post-processing method applied to a mesh dataset from a topology optimization including material volume factor value data and mesh data, the method generating a filtered mesh dataset based on the values of the material volume factors such that only mesh elements meeting one or more criteria with respect to material volume factor values are retained in a filtered mesh dataset, the method comprising the acts of:
selecting an initial mesh dataset;
defining a material volume factor expression;
defining one or more criteria including one or more bounds for mesh elements or mesh nodes to be included in the filtered mesh, the one or more bounds based on material volume factor values associated with the mesh elements or mesh nodes that are applied in the defined material volume factor expression;
generating, via one or more processors, the filtered mesh dataset including the mesh elements or mesh nodes meeting the defined one or more criteria for the values associated with the mesh elements or mesh nodes that are applied in the defined material volume factor expression; and
generating, via one or more processors, a graphical representation of the filtered mesh dataset for display in a graphical user interface associated with one or more display devices,
wherein the mesh dataset includes named selections and the association of named selections with mesh elements is maintained in a modified filtered mesh dataset, and wherein the named selections are optionally presented in the graphical representation.

14. The simulation post-processing method of claim 13, wherein the filtered mesh dataset is further modified such that a new surface mesh dataset is generated retaining surface mesh element data and domain information as to where in relation to the surface mesh elements the specific domains are located.

15. The simulation post-processing method of claim 14, wherein the mesh elements are reshaped in response to further operations on the surface elements.

16. The simulation post-processing method of claim 14, wherein a non-discretized geometry is generated based on the surface mesh elements and associated domain information, the generated non-discretized geometry being re-meshed into a new meshed geometry and the named selections are maintained in the new meshed geometry.

17. The simulation post-processing method of claim 14, wherein the filtered mesh dataset is re-meshed into a new meshed geometry and the named selections are maintained in the new meshed geometry.

18. The simulation post-processing method of claim 13, wherein the defining of a material volume factor expression and/or the defining one or more criteria including one or more bounds for what mesh elements or mesh nodes are to be included in the filtered mesh is performed in response to a user entering expressions and/or values in a graphical user interface settings window associated with the initial mesh dataset.

19. A computer-implemented simulation method executable on one or more processors configured to generate a model of a physical system, the simulation method optimizing a shape of a geometrical representation of a physical object being modeled, the simulation method comprising the acts of:

receiving initial geometry data representing an initial geometry of the physical object being modeled;

defining equation data representing physical properties for one or more portions of the initial geometry;

receiving, via one or more graphical user interfaces configured for display on one or more display devices, first user inputs representing one or more shape optimization settings including control variable settings and user selections of one or more portions of the initial geometry being shape optimized;

receiving, via one or more graphical user interfaces configured for display on one or more display devices, second user inputs representing boundary settings for designating non-optimized boundaries allowing mesh nodes of a non-optimized boundary to move tangentially on the non-optimized boundary such that displacement of a shape optimized boundary connected to the non-optimized boundary is tangential to the non-optimized boundary;

generating, via the one or more processors, discretized model data representing a discretized model of the physical object being modeled based on the initial geometry, the discretized model including a mesh based on (i) the initial geometry and mesh element node coordinates for portions of the initial geometry to be shape optimized based on control variables, and (ii) a shape optimization objective expression;

defining shape optimization solver settings and a shape optimization objective expression for a shape optimization solver, the shape optimization objective expression being at least partially determined by one or more control variables;

generating, via the one or more processors, updated control variable values based on the defined shape optimization solver settings;

performing, via the one or more processors, an iterative operation including solving the shape optimization objective expression based at least partially on the updated control variable values, the iterative operation continuing until a defined maximum number of iterations have been performed or until at least one shape optimization solver determines that an optimized shape solution has been achieved; and storing optimized shape solution data representing the optimized shape solution on a computer memory device, the optimized shape solution including a shape optimized mesh corresponding to the optimized shape solution or a shape solution based on more than one iteration of solving the shape optimization objective expression.

20. The simulation method of claim 19, wherein shape optimization of some portions of the shape optimized mesh are controlled by control variables that are Bernstein polynomial coefficients, and shape optimization of other different portions of the shape optimized mesh are controlled by a non-Bernstein polynomial coefficient control variable and a filter setting.

* * * * *